(12) United States Patent
Baek

(10) Patent No.: US 9,748,288 B2
(45) Date of Patent: Aug. 29, 2017

(54) IMAGE SENSOR INCLUDING PIXELS HAVING PLURAL PHOTOELECTRIC CONVERTERS CONFIGURED TO CONVERT LIGHT OF DIFFERENT WAVELENGTHS AND IMAGING APPARATUS INCLUDING THE SAME

(71) Applicant: Byung-joon Baek, Goyang-si (KR)

(72) Inventor: Byung-joon Baek, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/013,011

(22) Filed: Feb. 2, 2016

(65) Prior Publication Data

US 2016/0240571 A1  Aug. 18, 2016

(30) Foreign Application Priority Data

Feb. 16, 2015 (KR) ........................ 10-2015-0023151

(51) Int. Cl.
*H01L 27/146* (2006.01)
*H01L 31/047* (2014.01)
(Continued)

(52) U.S. Cl.
CPC .... *H01L 27/14605* (2013.01); *H01L 27/1464* (2013.01); *H01L 27/14621* (2013.01); *H01L 27/14625* (2013.01); *H01L 27/14627* (2013.01); *H01L 27/14636* (2013.01); *H01L 27/14638* (2013.01); *H01L 27/14645* (2013.01); *H01L 27/14667* (2013.01); *H01L 31/047* (2014.12); *H01L 31/0543* (2014.12); *H01L 27/307* (2013.01)

(58) Field of Classification Search
CPC ......... H01L 27/14605; H01L 27/14621; H01L 27/14625; H01L 27/14627; H01L 27/14638; H01L 27/1464; H01L 27/14645; H01L 27/14665; H01L 27/14667; H01L 27/307; H01L 31/047; H01L 31/0543
See application file for complete search history.

(56) References Cited

U.S. PATENT DOCUMENTS 8,035,708 B2   10/2011   Takizawa et al.
8,258,560 B1    9/2012   Hynecek
(Continued)

FOREIGN PATENT DOCUMENTS

JP   2009-152315 A    7/2009
JP     2010169709 A    8/2010
JP   WO 2014/103240 A1 * 7/2014   ....... H01L 27/14636

*Primary Examiner* — Stephen W Smoot
(74) *Attorney, Agent, or Firm* — Harness, Dickey & Pierce, P.L.C.

(57) ABSTRACT

Provided are an image sensor and an imaging apparatus. The image sensor of a multi-layered sensor structure, the image sensor includes a plurality of sensing pixels, each of the plurality of sensing pixels including a micro lens configured to collect light, a first photoelectric converter configured to convert light of a first wavelength band into an electric signal, and a second photoelectric converter formed on a substrate configured to convert incident light into the electric signal, wherein a central axis of the second photoelectric converter is spaced apart from an optical axis of the micro lens.

20 Claims, 45 Drawing Sheets

(51) Int. Cl.
*H01L 31/054* (2014.01)
*H01L 27/30* (2006.01)

(56) References Cited

U.S. PATENT DOCUMENTS

| | | |
|---|---|---|
| 8,350,937 B2 | 1/2013 | Rennie |
| 8,634,007 B2 | 1/2014 | Endo et al. |
| 8,728,847 B2 | 5/2014 | Maruyama et al. |
| 8,817,147 B2 | 8/2014 | Enoki et al. |
| 2011/0140225 A1 | 6/2011 | Tsutsui |
| 2013/0032915 A1 | 2/2013 | Tonotani et al. |
| 2014/0176683 A1 | 6/2014 | Miwa |
| 2014/0218574 A1 | 8/2014 | Yoshitsugu |

* cited by examiner

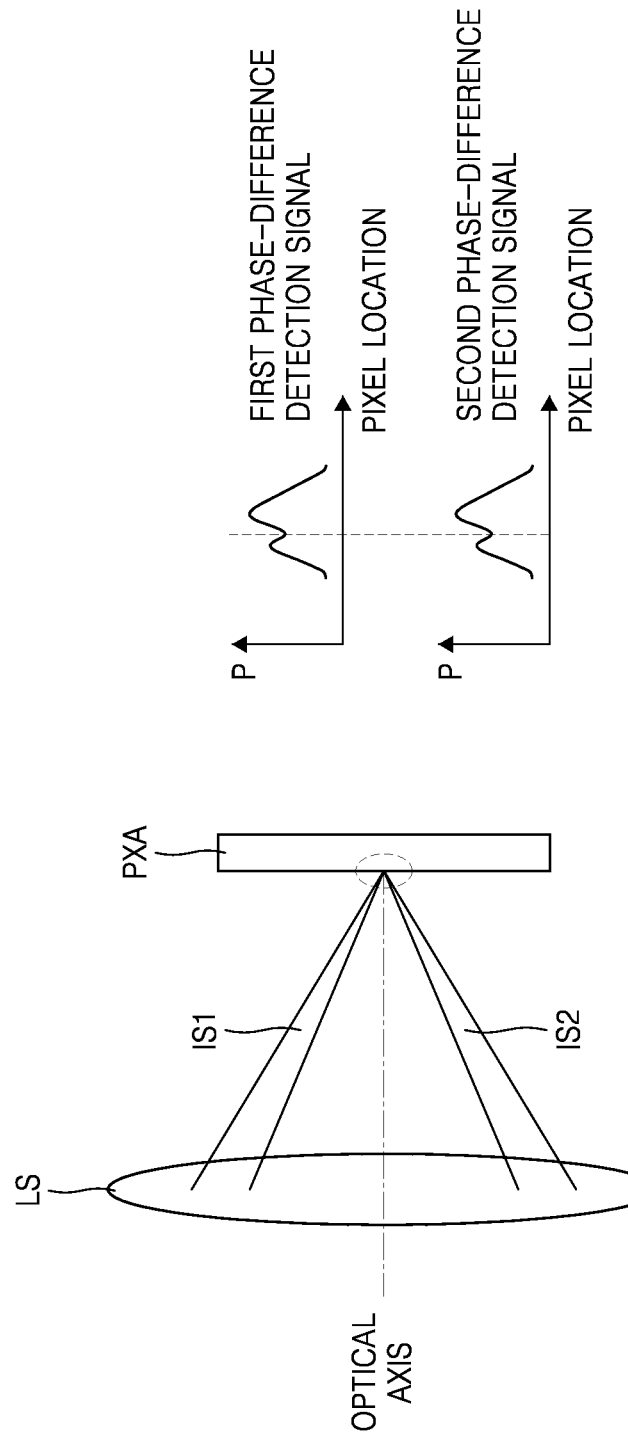

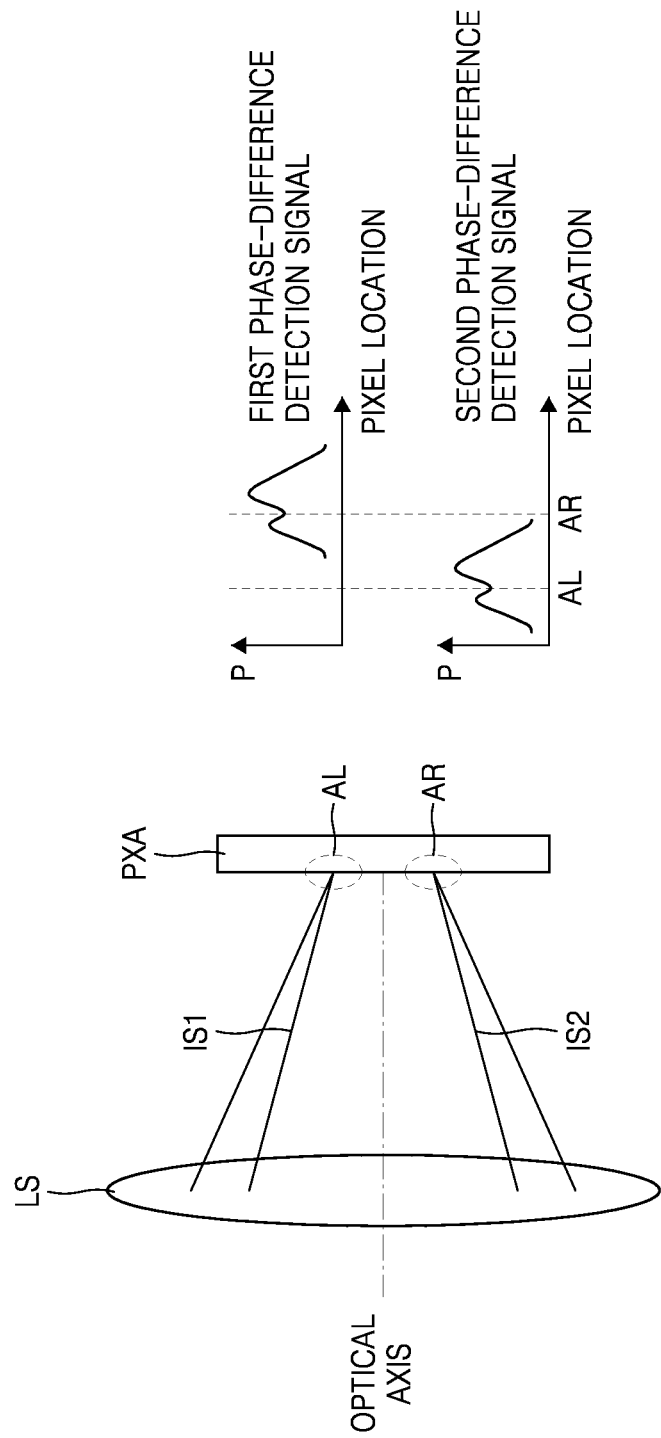

| Bl | Rr | Bl | Rr |
| Rl | Br | Rl | Br |
| Bl | Rr | Bl | Rr |
| Rl | Br | Rl | Br |

IMAGE SENSOR INCLUDING PIXELS HAVING PLURAL PHOTOELECTRIC CONVERTERS CONFIGURED TO CONVERT LIGHT OF DIFFERENT WAVELENGTHS AND IMAGING APPARATUS INCLUDING THE SAME

CROSS-REFERENCE TO RELATED APPLICATIONS

This application claims the benefit of Korean Patent Application No. 10-2015-0023151, filed on Feb. 16, 2015, in the Korean Intellectual Property Office, the disclosure of which is incorporated herein in its entirety by reference.

BACKGROUND

Example embodiments of the inventive concepts relate to an image sensor and an imaging apparatus including the image sensor. For example, at least some example embodiments relate to an image sensor having a multiple photoelectric conversion structure and an imaging apparatus including the image sensor.

Imaging apparatuses such as smartphones or digital cameras have been widely used in daily life. Accordingly, demand for high performance imaging apparatuses or image sensors included in the imaging apparatuses has increased. For example, it may be desired for the image sensor to perform an auto focusing function so that the imaging apparatus may capture images rapidly and accurately. Also, as a resolution of the imaging apparatus increases, an image sensor having a simple structure may be desired while improving a sensitivity of the image sensor with respect to optical signals.

SUMMARY

Example embodiments of the inventive concepts provide an image sensor having a high sensitivity and capable of performing operations accurately and rapidly, and an imaging apparatus including the image sensor.

According to example embodiments of the inventive concepts, there is provided an image sensor of a multi-layered sensor structure, the image sensor including a plurality of sensing pixels, wherein each of the plurality of sensing pixels includes: a micro lens collecting light; a first photoelectric converter converting light of a first wavelength band into an electrical signal; and a second photoelectric converter formed on a substrate and converting incident light into an electrical signal, wherein a central axis of the second photoelectric converter is spaced apart from an optical axis of the micro lens.

According to another example embodiments of the inventive concepts, there is provided an image sensor of a multi-layered sensor structure, the image sensor including a plurality of sensing pixels, wherein each of the plurality of sensing pixels includes: a micro lens collecting light; a first photoelectric converter converting light of a first wavelength band into an electrical signal; and a second photoelectric converter converting light of a second wavelength band into an electrical signal, wherein the second photoelectric converter includes a first photoelectric conversion device and a second photoelectric conversion device that are spaced apart from each other with respect to an optical axis of the micro lens.

According to another example embodiments of the inventive concepts, there is provided an imaging apparatus including: a lens collecting light reflected from a subject; and an image sensor of a multi-layered sensor structure, the image sensor including a pixel array including a plurality of pixels and outputting light incident onto the lens as an electrical signal, wherein at least one focusing pixel from among the plurality of pixels includes: a micro lens; a first photoelectric converter converting light of a first wavelength band into an electrical signal; and a second photoelectric converter including a first photoelectric conversion device spaced apart from an optical axis of the micro lens and converting light of a second wavelength band into an electrical signal.

According to another example embodiment, the image sensor may include a plurality of sensing pixels.

In some example embodiments, the plurality of sensing pixels may include a micro lens configured to collect incident light, and a plurality of photoelectric converters sequentially stacked under the micro lens, the plurality of photoelectric converters configured to selectively convert different wavelength bands of the incident light into different electrical signals, and at least one of the plurality of photoelectric converters having one or more photoelectric conversion devices formed in a substrate, the one or more photoelectric conversion devices being spaced apart based on an optical axis of the micro lens.

BRIEF DESCRIPTION OF THE DRAWINGS

Example embodiments of the inventive concepts will be more clearly understood from the following detailed description taken in conjunction with the accompanying drawings in which:

FIGS. 2A to 2C are diagrams illustrating a method of performing a phase-difference auto focusing operation;

DETAILED DESCRIPTION

Figure 1A:
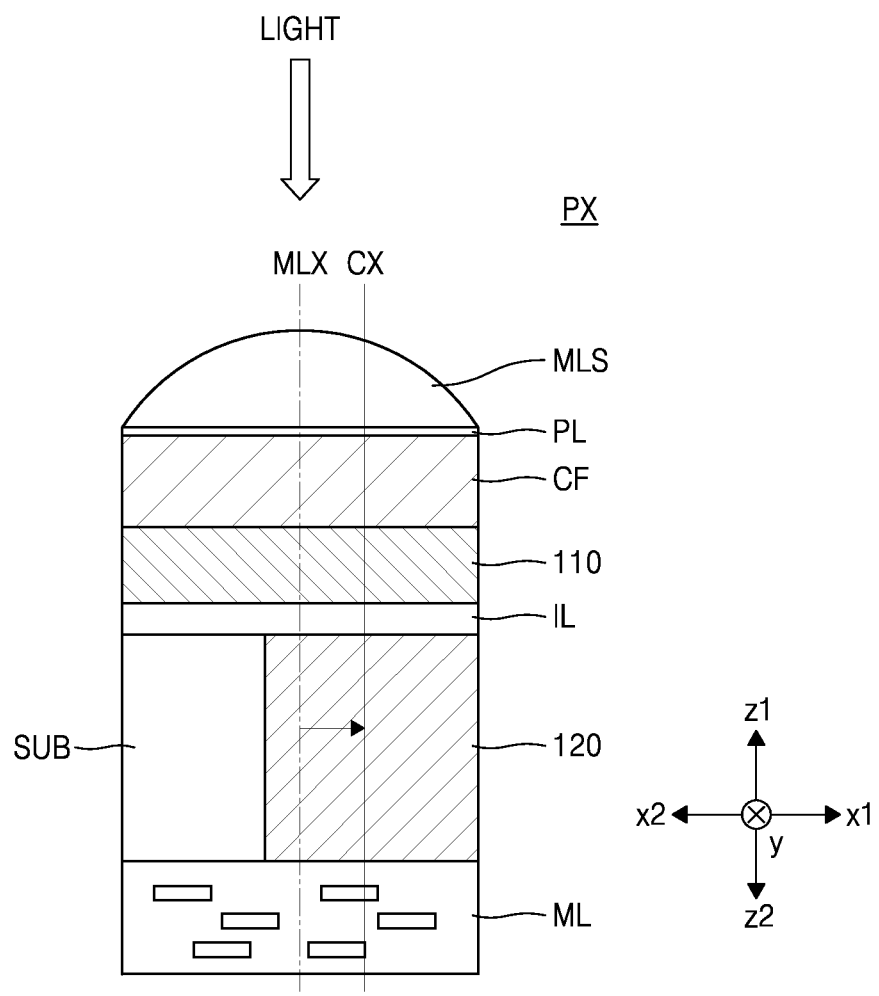
FIGS. 1A and 1B are vertical cross-sectional views of a pixel included in an image sensor according to example embodiments.

Example embodiments of the inventive concepts will now be described more fully with reference to the accompanying drawings, in which some example embodiments of the inventive concepts are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein. Thus, example embodiments of the inventive concepts may include all revisions, equivalents, or substitutions which are included in the concept and the technical scope related to the example embodiments of the inventive concepts. Like reference numerals in the drawings denote like elements.

Additionally, example embodiments in the detailed description will be described with sectional views as example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

The terms "comprises" or "may comprise" used herein in various example embodiments of the inventive concepts may indicate the presence of a corresponding function, operation, or component and do not limit one or more additional functions, operations, or components. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "or" includes any and all combinations of one or more of the associated listed items. For example, "A or B" may include A, B, or both A and B.

While terms "first", "second", "third", etc., are used to describe various components, elements, regions, layers and/or sections, it is obvious that these components, elements, regions, layers and/or sections are not limited by the terms "first", "second", "third", etc. The terms "first", "second", "third", etc. are used only to distinguish between each component. For example, these terms do not limit the order and/or importance of corresponding components. These terms may be used to distinguish one component from another. For example, a first user device and a second user device may be both user devices and denote different user devices. For example, a first component may indicate a second component or a second component may indicate a first component without conflicting with the example embodiments of the inventive concepts.

Herein, when a constituent element is "connected" or "coupled" to another constituent element, it may be construed that the constituent element is connected or coupled to the other constituent element not only directly but also through at least one of other constituent elements interposed therebetween. On the other hand, when constituent element is "directly connected" or "directly coupled" to another constituent element, it is construed that there is no other constituent element interposed therebetween.

The terms used herein in the example embodiments of the inventive concepts are to describe some example embodiments only, and should not be construed to limit the example embodiments of the inventive concepts. Singular expressions, unless defined otherwise in contexts, may also include plural expressions.

Unless otherwise defined, all terms (including technical and scientific terms) used herein have the same meaning as commonly understood by one of ordinary skill in the art to which the example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device.

It will be apparent to those skilled in the art that various modifications and variations can be made to the example embodiments without departing from the spirit or scope of the example embodiments described herein. Thus, it is intended that the example embodiments cover the modifications and variations of the example embodiments provided they come within the scope of the appended claims and their equivalents.

Figure 1B:
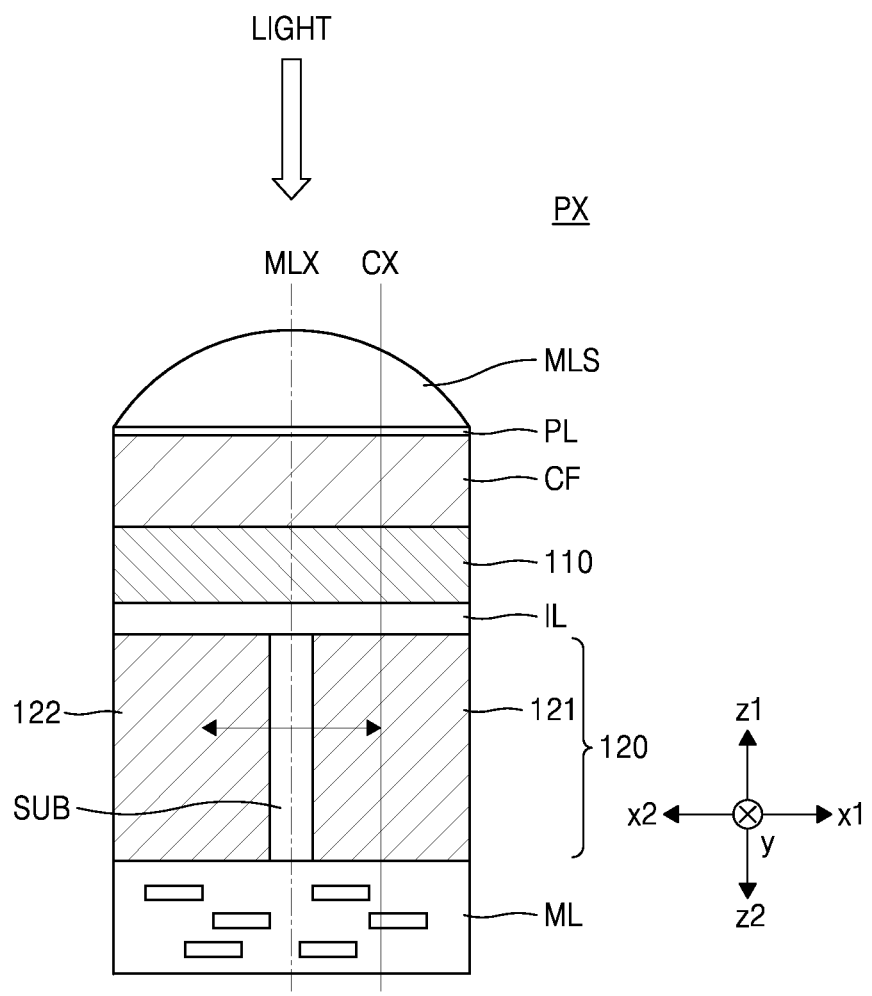

FIGS. 1A and 1B are vertical cross-sectional views of a pixel included in an image sensor according to example embodiments of the inventive concepts.

Referring to FIGS. 1A and 1B, a pixel PX may include a micro lens MLS, a first photoelectric converter 110, a second photoelectric converter 120, and a wiring layer ML. The pixel PX may further include a planarization layer PL, an insulating layer IL, and a color filter CF.

As shown in FIGS. 1A and 1B, the first photoelectric converter 110, the second photoelectric converter 120, and the wiring layer ML may be sequentially stacked under the micro lens MLS. As described above, an image sensor including a pixel structure in which a plurality of photoelectric converters is stacked may be referred to as a multi-layer sensor. In the multi-layer sensor, each of the pixels PX may detect an electric signal corresponding to at least two or more light beams having different wavelength bands from each other, and thus, sensitivity for sensing incident light may increase.

In addition, although in FIGS. 1A and 1B the first photoelectric converter 110 is stacked above the second photoelectric converter 120, but is not limited thereto. For example, in other example embodiments, the second photoelectric converter 120 may be stacked above the first photoelectric converter 110.

Also, the second photoelectric converter 120 is in a semiconductor substrate SUB and the first photoelectric converter 110 is on an upper portion of the semiconductor substrate SUB, but one or more example embodiments are not limited thereto. For example, the first photoelectric converter 110 may be in the semiconductor substrate SUB, and the second photoelectric converter 120 may be stacked above the semiconductor substrate SUB. Otherwise, both the first photoelectric converter 110 and the second photoelectric converter 120 may be stacked above the semiconductor substrate SUB. In addition, the image sensor including the pixel PX according to the example embodiments may be realized as a semiconductor chip.

If the light is incident through the micro lens MLS, the first photoelectric converter 110 and the second photoelectric converter 120 may convert the incident light into electric signals. The first photoelectric converter 110 may convert light of a first wavelength band into an electric signal and the second photoelectric converter 120 may convert light of a second wavelength band into an electric signal. The electric signals converted by the first photoelectric converter 110 and the second photoelectric converter 120 may be output as electric signals through a circuit region (not shown) formed in the wiring layer ML.

In addition, the color filter CF may selectively transmit the light according to a wavelength of the light. For example, in the example embodiments, the color filter CF may be a complementary color filter that reflects light having a wavelength band that is in a complementary relationship with the light of the second wavelength band so that the second photoelectric converter 120 may absorb the light of the second wavelength band.

In the pixel PX according to the example embodiments, a central axis CX of the second photoelectric converter 120 may be separated from an optical axis MLX of the micro lens MLS. Here, the central axis CX of the second photoelectric converter 120 may denote an axis that passes through a centroid of the second photoelectric converter 120 or an incenter of a horizontal cross-section, for example, a cross-section on an XY plane, of the second photoelectric converter 120, and is in parallel with the optical axis MLX. That is, the second photoelectric converter 120 may be deviated toward edges of the pixel PX from the center of the pixel PX, for example, x1 or x2 direction.

As shown in FIG. 1A, the second photoelectric converter 120 may include one photoelectric conversion device, but is not limited thereto. For example, as shown in FIG. 1B, the second photoelectric converter 120 may include a first photoelectric conversion device 121 and a second photoelectric conversion device 122, wherein a central axis CX of each of the first photoelectric conversion device 121 and the second photoelectric conversion device 122 is separate from the optical axis MLX. The first photoelectric conversion device 121 and the second photoelectric conversion device 122 may be separated from each other based on the optical axis MLX. As shown in FIG. 1B, the central axis CX of the second photoelectric converter 120 separate from the optical axis MLX may denote that the central axis CX of each of the first photoelectric conversion device 121 and second photoelectric conversion device 122 included in the second photoelectric converter 120 is separate from the optical axis MLX.

As described above, since the central axis CX of the second photoelectric converter 120 is separate from the optical axis MLX, the second photoelectric converter 120 may mainly sense components of light that is incident through a right or left portion (for example, x1 direction or x2 direction) based on the optical axis MLX from among the light incident through the micro lens MLS. Accordingly, the image sensor including the pixel PX according to the example embodiments may acquire binocular parallax image signals (or binocular parallax images) based on the electric signals output from the second photoelectric converter 120, and may detect a phase difference between the binocular parallax image signals to perform an automatic focusing function. Since the image sensor including the pixel PX according to the example embodiments is the multi-layer sensor, the image sensor may perform a phase-difference auto-focusing function (hereinafter, referred to as a phase-difference AF) accurately and rapidly while improving sensitivity for sensing light.

Hereinafter, the image sensor having the multi-layer sensor structure and an imaging device including the image sensor according to one or more example embodiments will be described below in more detail.

Figure 2B:
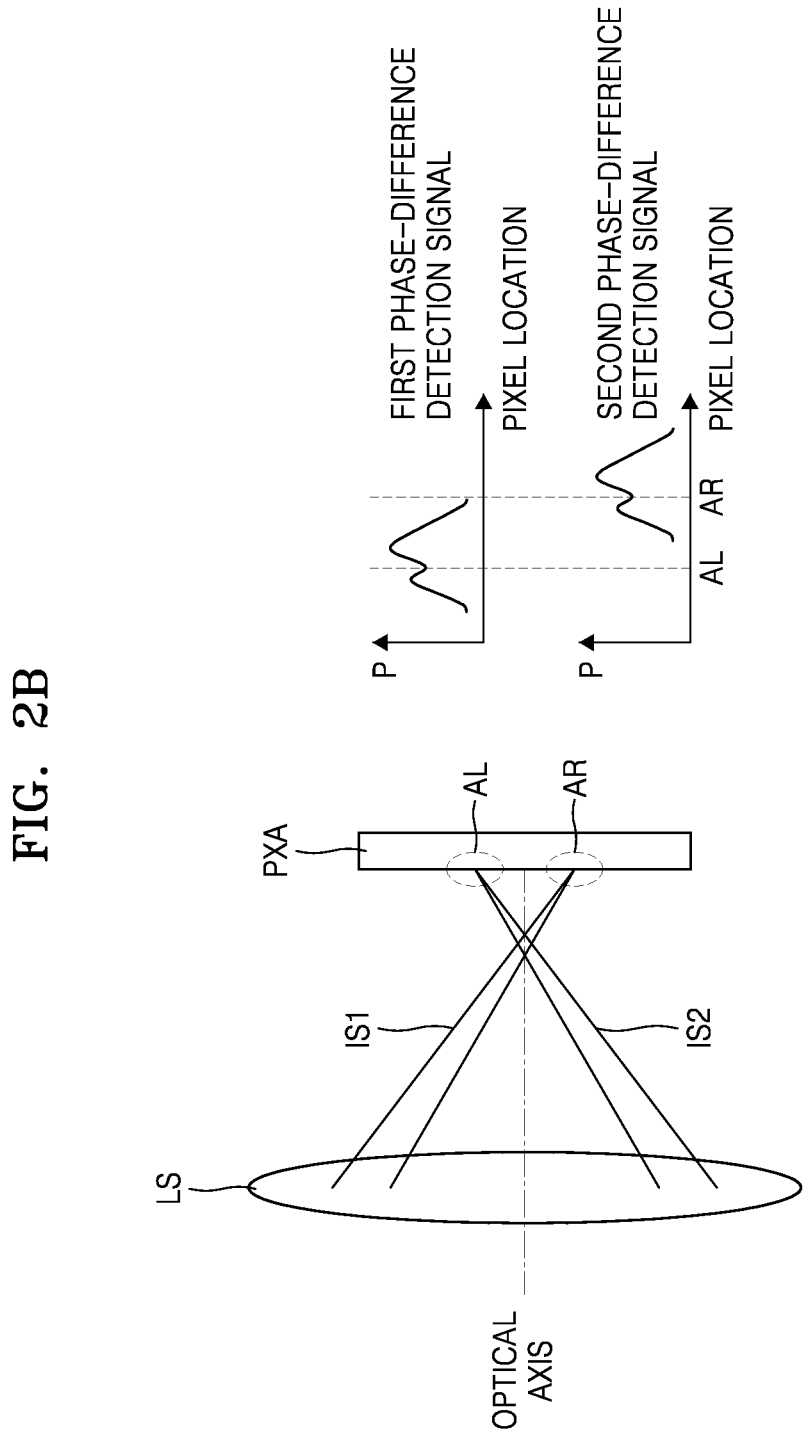

FIGS. 2A to 2C are diagrams illustrating processes of performing the phase-difference AF. FIG. 2A shows an in-focus state, FIG. 2B shows a front-focus state, and FIG. 2C shows a back-focus state. In FIGS. 2A to 2C, a location of a pixel denotes a location in a row direction or a column direction in a pixel array PXA including pixels arranged in the column and row directions.

Referring to FIG. 2A, in the in-focus state, an optical signal incident into the imaging device, for example, the image sensor including the pixel array PXA, through a lens LS may be focused at a center portion of a light receiving surface of the pixel array PXA. In such an in-focus state, a first optical signal IS1 and a second optical signal IS2 may be evenly detected from at least one pixel PX according to the example embodiments. Accordingly, a first phase-difference detection signal and a second phase-difference detection signal in the binocular parallax image signals generated by the at least one pixel PX may have same intensities P as each other, that is, the binocular parallax images may have the same phases as each other. Therefore, the image sensor or the imaging device including the image sensor may determine the in-focus state when the intensities P of the first phase-difference detection signal and the second phase-difference detection signal are detected to be equal to or greater than a set (or, alternatively predetermined) critical value.

As shown in FIG. 2B, in the front-focus state, the optical signal incident to the pixel array PXA through the lens LS is not focused on the center portion of the light receiving surface of the pixel array PXA, but may be focused in front of the light receiving surface.

In the front-focus state, the second optical signal IS2 may be mainly detected from a region AL located at a first direction from the optical axis, and thus, the intensity P of the second phase-difference detection signal is greater than that of the first phase-difference detection signal. In a region AR located at a second direction from the optical axis, the first optical signal IS1 may be mainly detected, and thus, the intensity P of the first phase-difference detection signal is greater than that of the second phase-difference detection signal. Therefore, the image sensor or the imaging device including the image sensor may determine the front-focus state when the intensity P of the second phase-difference detection signal is detected to be equal to or greater than a set (or, alternatively predetermined) critical value and the intensity P of the first phase-difference detection signal is detected to be less than the set (or, alternatively predetermined) critical value in the region AL of the pixel array PXA located in the first direction from the optical axis, and when the intensity P of the first phase-difference detection signal is detected to be equal to or greater than the set (or, alternatively predetermined) critical value and the intensity P of the second phase-difference detection signal is detected to be less than the set (or, alternatively predetermined) critical value in the region AR of the pixel array PXA located in the second direction from the optical axis.

As shown in FIG. 2C, in the back-focus state, the first optical signal IS1 may be mainly detected in the region AL so that the intensity P of the first phase-difference detection signal is greater than that of the second phase-difference detection signal in the region AL located in the first direction from the optical axis in the pixel array PXA. In addition, the second optical signal IS2 may be mainly detected in the region AR so that the intensity P of the second phase-difference detection signal is greater than that of the first phase-difference detection signal in the region AR located in the second direction from the optical axis. Therefore, the image sensor or the imaging device including the image sensor may determine the back-focus state when the intensity P of the first phase-difference detection signal is detected to be equal to or greater than a set (or, alternatively predetermined) critical value and the intensity P of the second phase-difference detection signal is detected to be less than the set (or, alternatively predetermined) critical value in the region AL of the pixel array PXA located in the first direction from the optical axis, and when the intensity P of the second phase-difference detection signal is detected to be equal to or greater than the set (or, alternatively predetermined) critical value and the intensity P of the first phase-difference detection signal is detected to be less than the set (or, alternatively predetermined) critical value in the region AR of the pixel array PXA located in the second direction from the optical axis.

Figure 3:
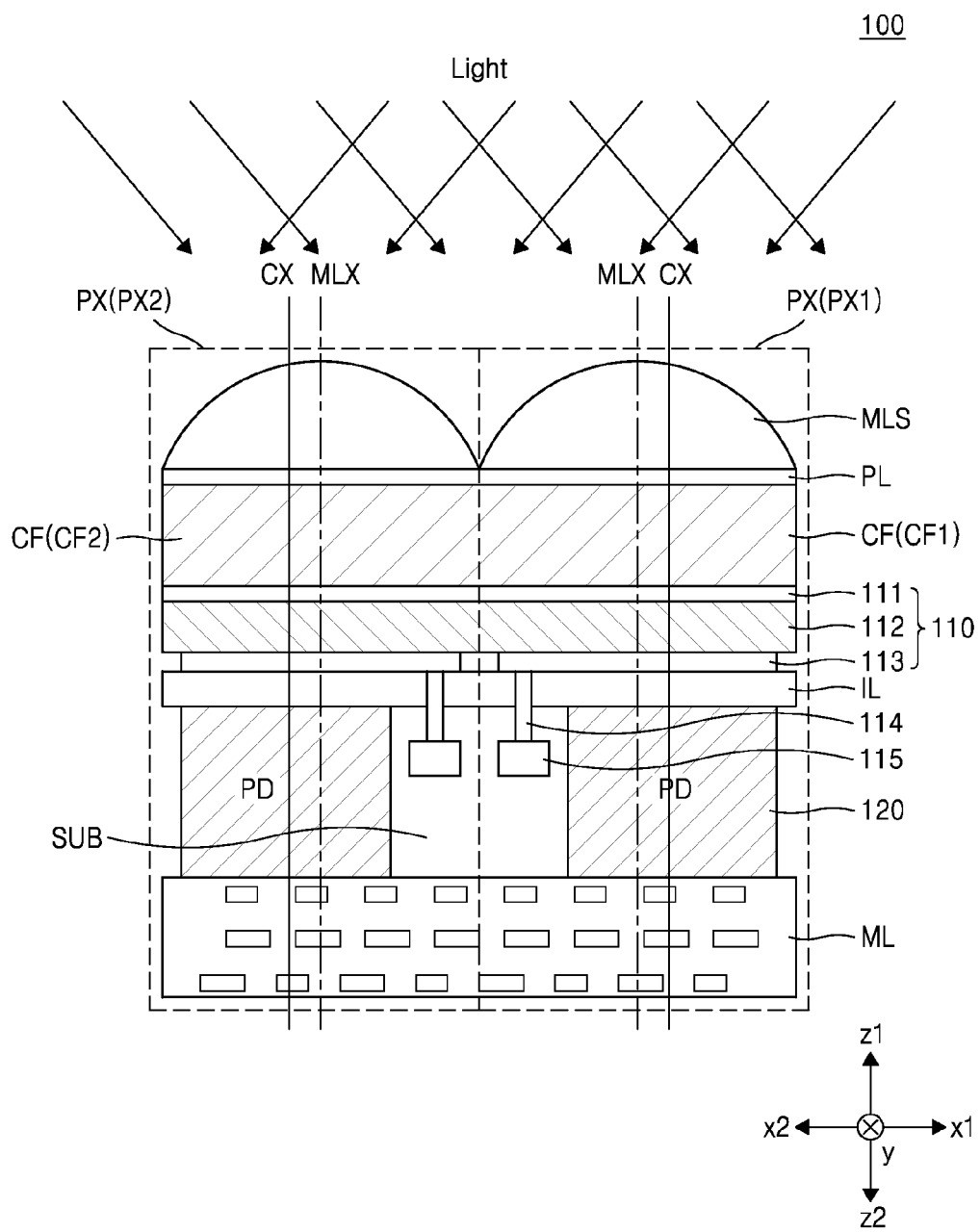
FIG. 3 is a vertical cross-sectional view of a pixel included in an image sensor according to example embodiments.

FIG. 3 is a vertical cross-sectional view of the pixel PX included in an image sensor 100 according to example embodiments.

Referring to FIG. 3, the image sensor 100 may include a plurality of pixels PX, and each of the plurality of pixels PX may include the micro lens MLS, the color filter CF, the first photoelectric converter 110, a through wire 114, a storage node 115, the second photoelectric converter 120, and the wiring layer ML. Each of the plurality of pixels PX may further include the planarization layer PL and the insulating layer IL.

The micro lens MLS, the planarization layer PL, the color filter CF, the first photoelectric converter 110, the second photoelectric converter 120, and the wiring layer ML may be sequentially stacked under the micro lens MLS. However, one or more example embodiments are not limited thereto, for example, locations of the first photoelectric converter 110 and the second photoelectric converter 120 may be changed. For example, the first photoelectric converter 110 may be under the second photoelectric converter 120.

The color filter CF may selectively transmit light incident through the micro lens MLS according to a wavelength of the incident light. The color filter CF may be, for example, the complementary color filter, and may reflect light having a wavelength that is complementary with the light having the wavelength absorbed by the second photoelectric converter 120.

The first photoelectric converter 110 may convert the light of the first wavelength band into the electric signal. In one or more example embodiments, the light of the first wavelength band may be green light, but are not limited thereto. For example, the light of the first wavelength band may be other light such as red or blue light. The first photoelectric converter 110 may absorb the light of the first wavelength band and convert the absorbed optical signal into the electric signal. In one or more example embodiments, the first photoelectric converter 110 may be an organic photodiode, but is not limited thereto. For example, the first photoelectric converter 110 may be an inorganic photodiode.

The first photoelectric converter 110 may include an upper electrode 111, a color selection layer 112, and a lower electrode 113. The color selection layer 112 may absorb the light of the first wavelength band. The absorbed light of the first wavelength band may be converted into the electric signal by a current flowing through the upper electrode 111 and the lower electrode 113 in the color selection layer 112, and the electric signal may be output through the lower electrode 113. The electric signal output through the lower electrode 113 may be provided to the storage node 115 via the through wire 114, and may be temporarily stored in the storage node 115.

The storage node 115 may be separated from the second photoelectric converter 120 in the semiconductor substrate SUB, and may temporarily store the electric signal output from the lower electrode 13 via the through wire 114. A central axis of the storage node 115 may be separated from the optical axis MLX as well.

The second photoelectric converter 120 may convert the light into the electric signal. As shown in FIG. 1, if the color filter CF and the first photoelectric converter 110 are stacked on the second photoelectric converter 120, the second photoelectric converter 120 may convert the remaining light components after excluding the light component of the first wavelength band, from the light component transmitted through the color filter CF, into the electric signal.

For example, the second photoelectric converter 120 may convert light of a second wavelength band or light of a third wavelength band into an electric signal. As described above, if the light of the first wavelength band is green light, the light of the second wavelength band may be red light or blue light. The light of the third wavelength band may be blue light or red light. Otherwise, the light of the second or third wavelength band may be cyan light or yellow light. Otherwise, the light of the first, second, or third wavelength band may be cyan light, magenta light, or yellow light. However, one or more example embodiments are not limited thereto.

As described above with reference to FIG. 1, the central axis CX of the second photoelectric converter 120 may be separated from the optical axis MLX. The second photoelectric converter 120 may be the inorganic photodiode, for example, a silicon photodiode or a semiconductor compound photodiode, but is not limited thereto. For example, the second photoelectric converter 120 may be the organic photodiode.

The electric signals that have been converted by the first photoelectric converter 110 and the second photoelectric converter 120 may be amplified in a pixel circuit (not shown) formed in the wiring layer ML, and may be output as image signals.

In addition, the image sensor 100 may include a first pixel PX1 and a second pixel PX2 that are arranged adjacent to each other. Here, the central axis CX of the second photoelectric converter 120 included in the first pixel PX1 and the central axis CX of the second photoelectric converter 120 included in the second pixel PX2 may be separated from the optical axis MLX in different directions from each other. For example, the central axis CX of the second photoelectric converter 120 included in the first pixel PX1 may be separated from the optical axis MLX in the x1 direction, and the central axis CX of the second photoelectric converter 120 included in the second pixel PX2 may be separated from the optical axis MLX in the x2 direction that is opposite to the x1 direction. Accordingly, the second photoelectric converters 120 included in the first pixel PX1 and the second pixel PX2 may sense the light beams incident in different directions from each other. For example, the second photoelectric converter 120 of the first pixel PX1 may sense an optical signal of the second wavelength band from incident light which is incident from a left side of the optical axis MLX, and the second photoelectric converter 120 of the second pixel PX2 may sense an optical signal of the second wavelength band from incident light which is incident from a right side of the optical axis MLX. Accordingly, the electric signals output from the first pixel PX1 and the second pixel PX2 may be output as binocular parallax image signals or signals for acquiring binocular parallax images.

In addition, a first color filter CF1 of the first pixel PX1 and a second color filter CF2 of the second pixel PX2 may selectively transmit or reflect different light from each other. For example, if the color filter CF is the complementary color filter, the first color filter CF1 may be a red filter for blocking a complementary color of red and the second color filter CF2 may be blue filter for blocking a complementary color of blue. However, one or more example embodiments are not limited thereto, for example, the arrangement of the color filters CF1 and CF2 in the plurality of pixels may be changed.

Figure 4A:
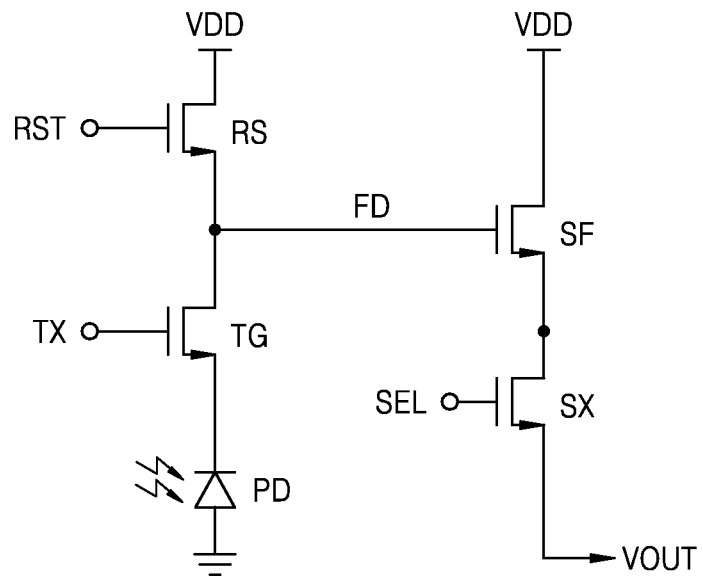
FIGS. 4A and 4B are diagrams showing examples of a pixel circuit according to example embodiments.
Figure 4B:
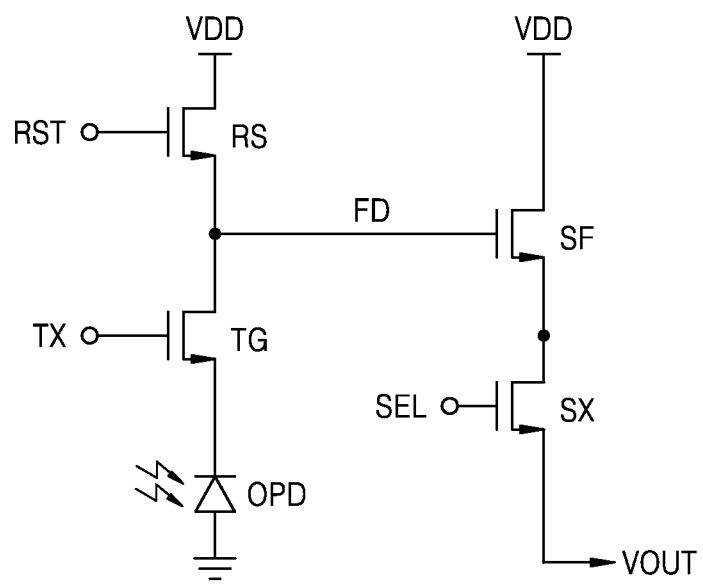

FIGS. 4A and 4B are diagrams of a pixel circuit according to example embodiments.

As described above with reference to FIG. 3, the pixel PX may include the first photoelectric converter 110 and the second photoelectric converter 120, and may convert at least two light beams of different wavelength bands from each other into the electric signals and may output the electric signals. At least one pixel circuit receiving the electric signals from the first photoelectric converter 110 and the second photoelectric converter 120 and generating output signals may be included in the wiring layer ML (as shown in FIG. 3).

As described above, the first photoelectric converter 110 and the second photoelectric converter 120 may be one of the inorganic photodiode PD such as the silicon photodiode or the compound semiconductor photodiode PD, or the organic photodiode OPD. The pixel circuits of the inorganic photodiode PD (hereinafter, referred to as a photodiode PD) and the organic photodiode (OPD) will be described with reference to FIGS. 4A and 4B.

Referring to FIG. 4A, each pixel circuit included in the pixel array of a complementary metal-oxide semiconductor (CMOS) image sensor may include an element for amplifying the electric signal converted by the photodiode PD, and such a pixel circuit may be referred to as an active pixel sensor (APS). For example, a pixel may include a photodiode PD, a transfer transistor TG, a reset transistor RS, a source-follower transistor SF, and a selection transistor SX. The photodiode PD is a kind of a photosensitive device having a characteristic that a photocurrent linearly increases according to an intensity of the incident light in a reverse bias state, and may accumulate electrons when the photodiode PD is exposed to light and electrically floated from outside. When the electrons are accumulated, a cathode voltage of the photodiode PD may be reduced, and the intensity of the light absorbed by the photodiode PD may be sensed by measuring the reduced voltage. The above accumulation of the electrons may be also described as a process of discharging a capacitor due to the generated photocurrent.

The transfer transistor TG may connect or disconnect the photodiode PD to or from a floating diffusion (FD) according to a gate voltage. While the photodiode PD accumulates the electrons based on to the incident light, a voltage that may turn off the transfer transistor TG is applied to a gate of the transfer transistor TG so as to electrically block the photodiode PD and the floating diffusion FD from each other. When the photodiode PD finishes the absorption of the light, the transfer transistor TG may be turned on in order to output a voltage variation due to the electrons accumulated in the photodiode PD, and accordingly, the voltage changed in the cathode of the photodiode PD may be transferred to the floating diffusion FD.

Before transferring the voltage of the photodiode PD to the floating diffusion FD, the floating diffusion FD may be reset due to the reset transistor RS that is turned on. A reset voltage of the floating diffusion FD may be amplified through the source-follower transistor SF, and may be output as an analog voltage when the selection transistor SEL is turned on. A lead circuit may receive the analog voltage corresponding to the reset voltage of the floating diffusion FD, which is output as VOUT.

When the output of the reset voltage of the floating diffusion FD is finished, the reset transistor RS is turned off, and the transfer transistor TG is turned on so that a voltage according to the electrons accumulated in the photodiode PD may be transferred to the floating diffusion FD. Similar to the reset voltage of the floating diffusion FD, the changed voltage of the floating diffusion FD may be output as the analog voltage (VOUT) via the source-follower transistor SF and the selection transistor SX. The analog voltage (VOUT) corresponding to the variation in the output voltage of the floating diffusion FD may be transferred to an external lead circuit (not shown).

The lead circuit receives the reset voltage of the floating diffusion FD and the variation in the voltage caused by the photodiode PD, and may calculate the intensity of the light sensed by the photodiode PD from a difference between the two voltages. The above described operation is referred to as a correlated double sampling (CDS), and an order of receiving the reset voltage and the variation in the voltage caused by the photodiode PD may be changed. In FIG. 4A, the pixel circuit includes an NMOS transistor, but one or more example embodiments are not limited thereto, for example, the pixel circuit may include a PMOS transistor.

Referring to FIG. 4B, a pixel circuit may include an organic photodiode OPD. The organic photodiode OPD, that may substitute for the photodiode PD of the pixel circuit in FIG. 4A, may convert an optical component of a certain wavelength into the electric signal. The electric signal output from the organic photodiode OPD may be temporarily stored in a storage node SN. The pixel circuit may then measure the voltage at the storage node SN to sense the intensity of the light absorbed by the organic photodiode OPD. Operations after that are equal to those of the pixel circuit including the photodiode PD, and descriptions thereof are omitted here.

Figure 5A:
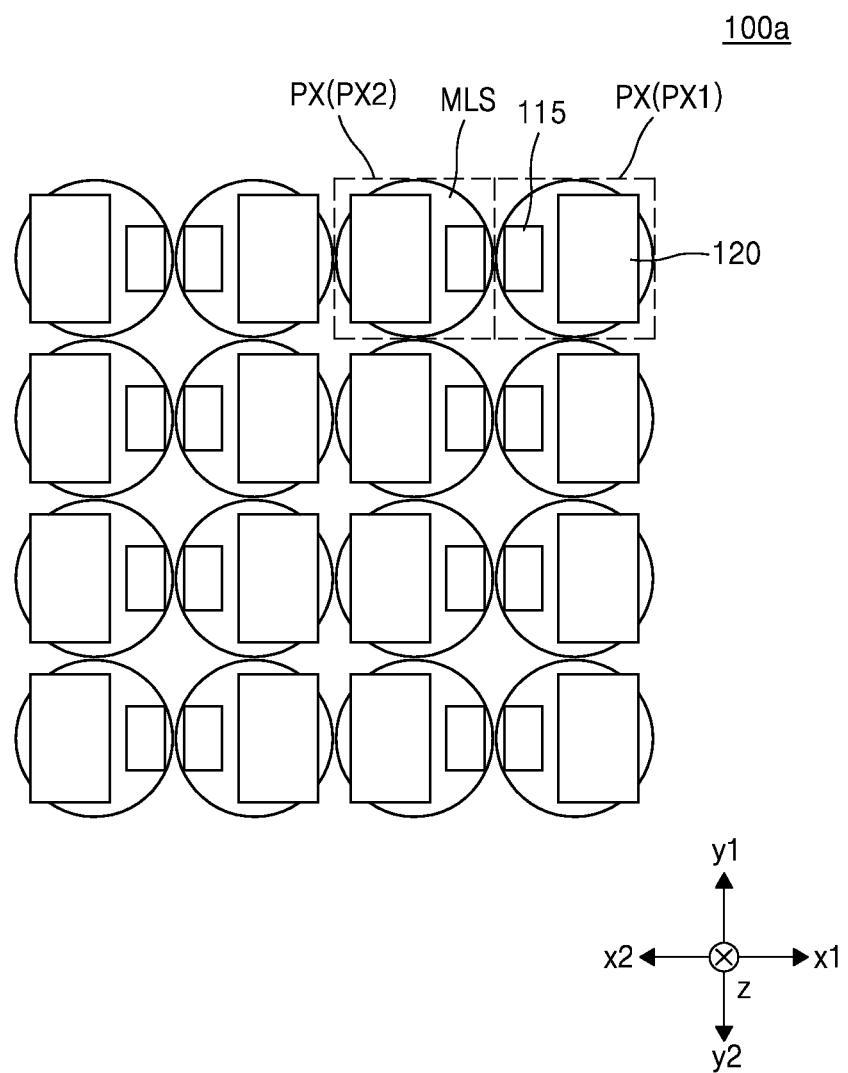
FIGS. 5A and 5B are horizontal cross-sectional views of a pixel included in an image sensor according to example embodiments.
Figure 5B:
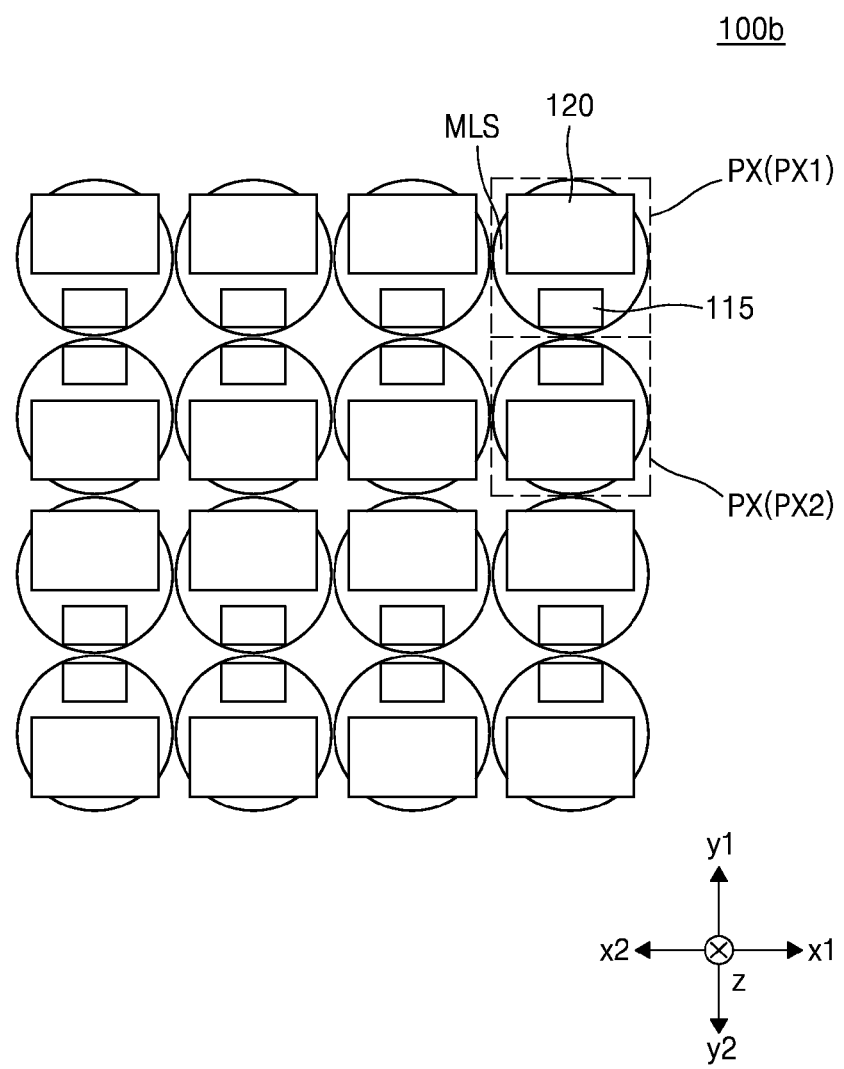

FIGS. 5A and 5B are horizontal cross-sectional view of a pixel PX included in an image sensor 100a according to example embodiments. FIGS. 5A and 5B show the horizontal cross-section of the pixel PX shown in FIG. 3, and for convenience of description, the elements other than the second photoelectric converter 120, the storage node 115, and the micro lens MLS are omitted.

As shown in FIGS. 5A and 5B, the second photoelectric converter 120 may be deviated to a direction in the pixel PX. The image sensor 100a may include the plurality of pixels PX, and the second photoelectric converters 120 in the first pixel PX1 and the second pixel PX2 that may be adjacent to each other in a row direction, for example, x1-x2 direction, but are not limited thereto. For example, the second photoelectric converters 120 in the first pixel PX1 and the second pixel PX2 may be deviated to opposite directions to each other.

Referring to FIG. 5A, the second photoelectric converter 120 of the first pixel PX1 may be deviated to a right side (x1 direction), and the second photoelectric converter 120 of the second pixel PX2 may be deviated to a left direction (x2 direction).

As described above with reference to FIG. 3, the storage node 115 may be separated from the second photoelectric converter 120 on an equal plane (for example, the semiconductor substrate SUB), for example the storage node 115 may be in a remaining space after disposing the second photoelectric converter 120 in consideration of a fill factor of the pixel PX. Therefore, the storage node 115 of the first pixel PX1 may be deviated toward the left side and the storage node 115 of the second pixel PX2 may be deviated toward the right side.

As described above, since the second photoelectric converters 120 of the first pixel PX1 and the second pixel PX2 are deviated toward the opposite directions, for example the left and right sides, an image signal having parallax between left and right sides may be acquired.

Referring to FIG. 5B, the second photoelectric converter 120 of the first pixel PX1 may be deviated upward (y1 direction), and the second photoelectric converter 120 of the second pixel PX2 may be deviated downward (y2 direction).

The storage node 115 of the first pixel PX1 may be deviated downward (y2 direction) and the storage node 115 of the second pixel PX2 may be deviated upward (y1 direction).

As described above, since the second photoelectric converters 120 of the first pixel PX1 and the second pixel PX2 are deviated in the opposite directions, for example, the upper and lower directions, an image signal having parallax between up and down sides may be acquired.

As described above with reference to FIGS. 5A and 5B, the image signal having the parallax between the left and right sides, and/or between the up and down sides may be acquired based on the signals output from the at least a pair of pixels PX1 and PX2.

Figure 6:
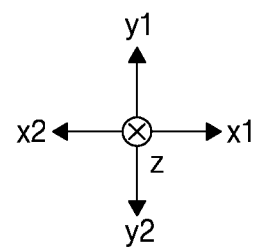
FIG. 6 is a diagram of an image signal output from a second photoelectric converter in the image sensor of FIGS. 3 and 5A.

FIG. 6 is a diagram showing an image signal output from the second photoelectric converter 120 in the image sensors 100 and 100b of FIG. 3 and FIG. 5A, respectively. In the example embodiments, an image signal may be shown according to a configuration of the color filter formed as a chess mosaic. Here, the pixels PX may output red signals or blue signals. Based on a pair of the pixels PX, the pixels PX at right side may output right red signal Rr or right blue signals Br, and the pixels PX at left side may output left red signals Rl or left blue signals Bl.

Accordingly, an image signal having parallax between the left and right sides with respect to the red and blue may be acquired, but is not limited thereto. For example, the right red signal Rr and the right blue signal Br may be combined and the left red signal Rl and the left blue signal Bl may be combined to acquire the image having parallax between the left and right sides.

In addition, FIG. 6 shows that the pixels PX output the red signals or the blue signals, but is not limited thereto. For example, the configuration of the color filter may be variously modified. Also, a modification for acquiring the image having parallax between the upper and lower portions may be performed based on FIG. 6 and the above description.

Figure 7A:
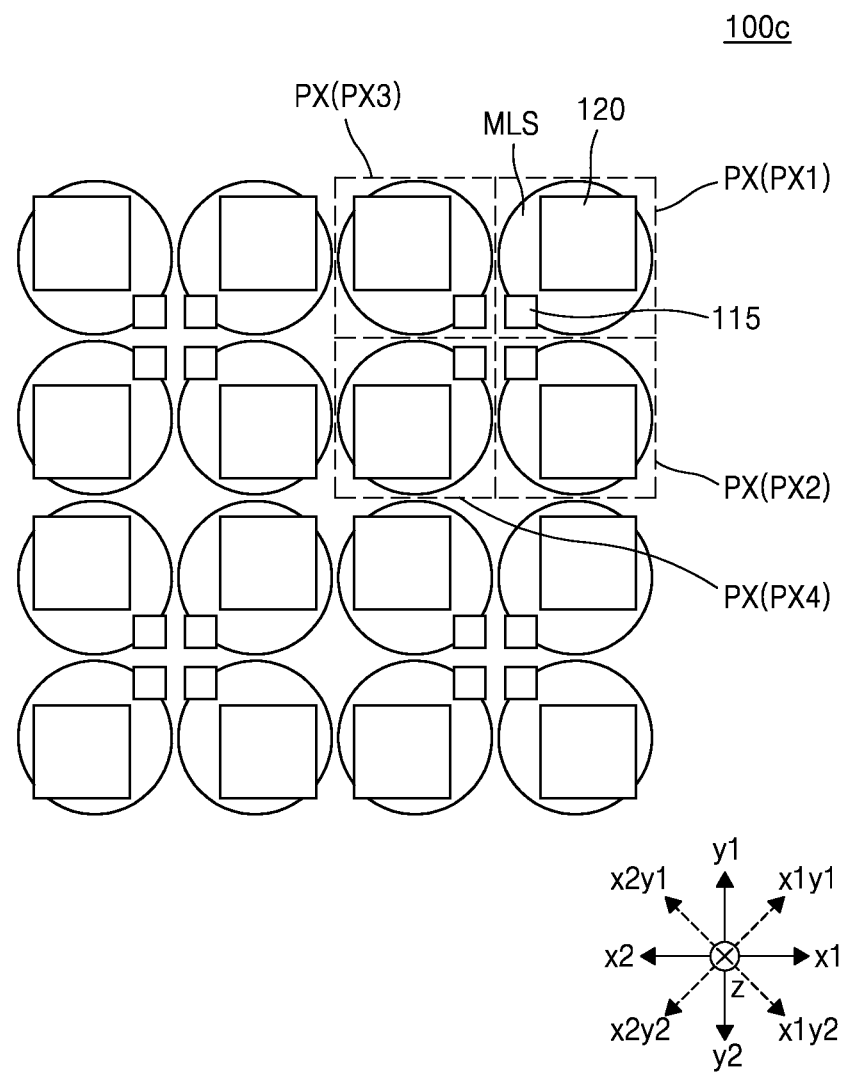
FIGS. 7A to 7C are horizontal cross-sectional views of a pixel included in an image sensor according to example embodiments.
Figure 7B:
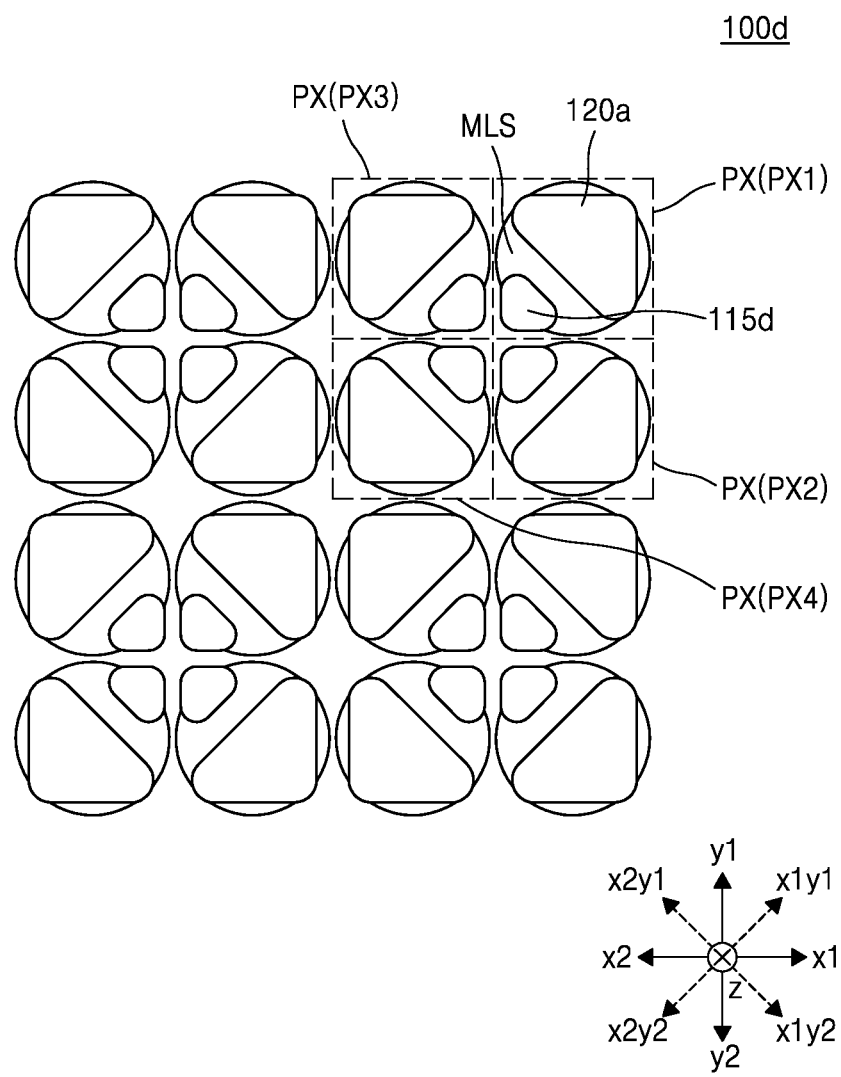
Figure 7C:
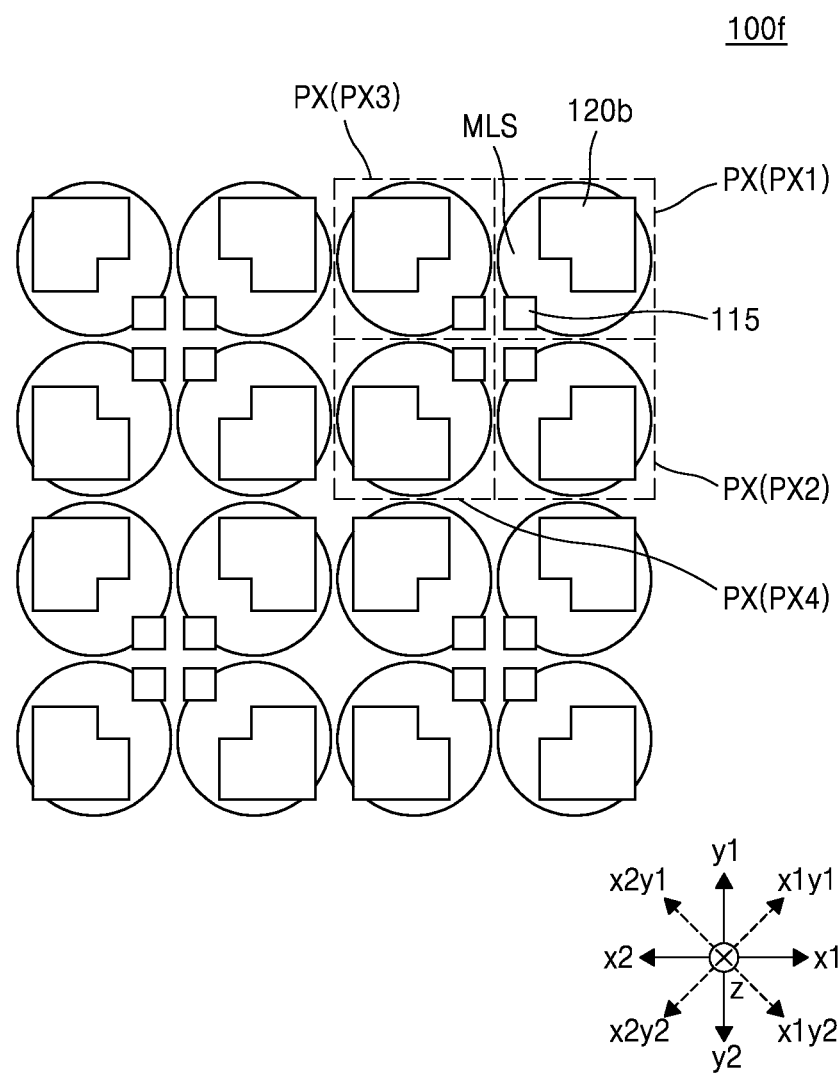

FIGS. 7A to 7C are horizontal cross-sectional views of a pixel included in image sensors 100c, 100d and 100f according to example embodiments. FIGS. 7A to 7C shows the horizontal cross-section of the pixel PX shown in FIG. 3, and for convenience of description, elements other than the second photoelectric converter 120, the storage node 115, and the micro lens MLS are omitted.

Referring to FIG. 7A, the image sensor 100c may include a combination of first to fourth pixels PX1 to PX4, and the second photoelectric converters 120 that are disposed to be deviated. The second photoelectric converters 120 of the first to fourth pixels PX1 to PX4 may be arranged to be deviated in different directions from each other. For example, as shown in FIG. 7A, the second photoelectric converter 120 may be arranged in opposite directions diagonally. The second photoelectric converters 120 included in the first to fourth pixels PX1 to PX4 may be respectively deviated in x1y1 direction, x1y2 direction, x2y1 direction, and x2y2 direction. In one or more embodiments, the x1y1 direction, the x1y2 direction, the x2y1 direction, and the x2y2 direction may be perpendicular to each other. According to the arrangement of the second photoelectric converters 120, an image signal according to the parallax between the upper and lower directions and the left and right directions may be acquired.

As shown in FIG. 7A, the storage node 115 may be deviated toward an opposite direction to the second photoelectric converter 120, but is not limited thereto. The storage node 115 may be deviated in various directions, unless the storage node 115 overlaps the second photoelectric converter 120. For example, the storage node 115 of the first pixel PX1 may be deviated the x1y2 direction, the y2 direction, the x2y2 direction, the x2 direction, and the x2y1 direction, except for the x1y1 direction.

Referring to FIGS. 7 B and 7C, configurations of the pixels PX in the image sensors 100d and 100f are similar to that of the pixels PX in the image sensor 100c of FIG. 7A. However, the second photoelectric converters 120a and 120b and the storage nodes 115d and 115 in FIGS. 7B and 7C, respectively, may vary. As shown in FIG. 7B, the second photoelectric converter 120a and the storage node 115d may have triangle shapes. Also, as shown in FIG. 7C, the second photoelectric converter 120b may have a polygonal shape. As described above, the second photoelectric converters 120a and 120b, and the storage nodes 115d and 115 are modified in shapes in order to increase the fill factor of the pixel PX.

Figure 8:
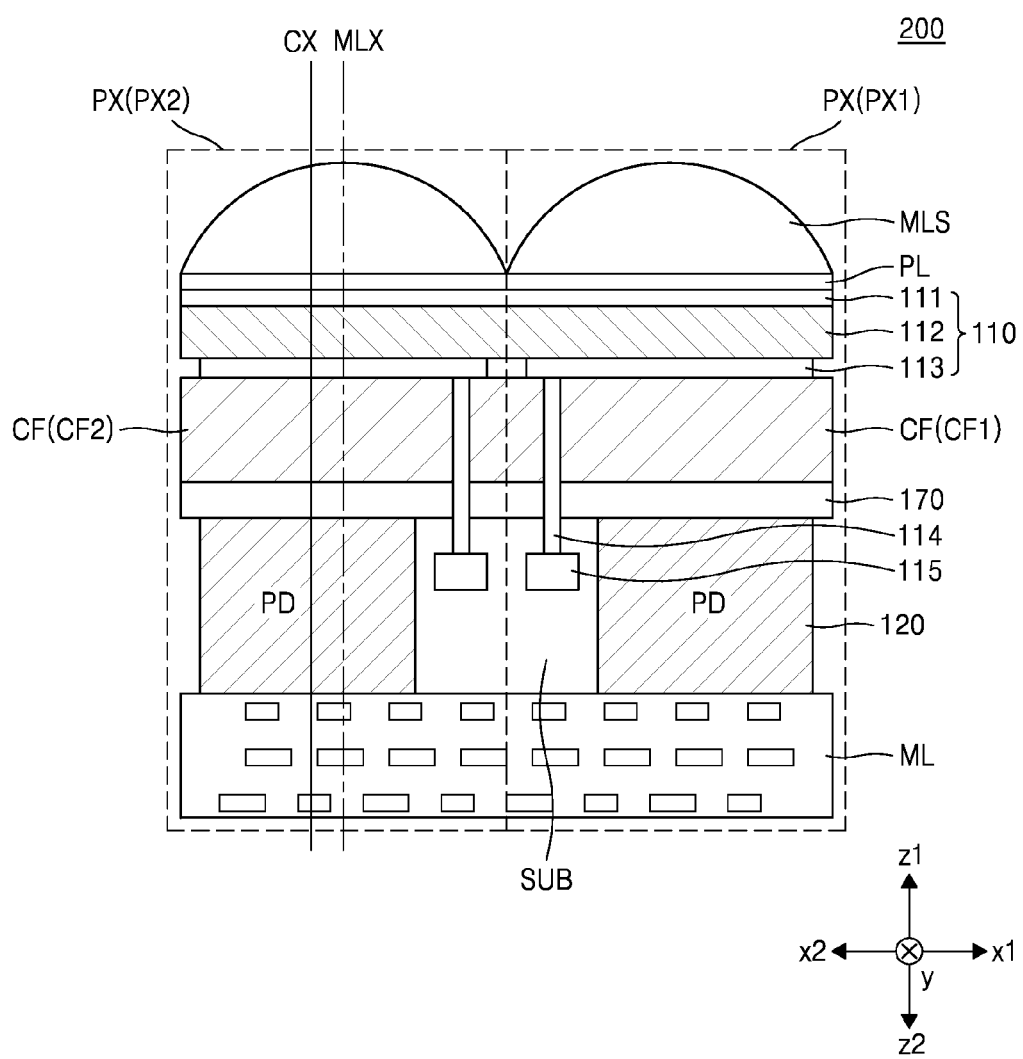
FIG. 8 is a vertical cross-sectional view of a pixel included in an image sensor according to example embodiments.

FIG. 8 is a vertical cross-sectional view of a pixel PX included in an image sensor 200 according to example embodiments.

Referring to FIG. 8, the image sensor 200 may include a plurality of pixels PX, and each of the plurality of pixels PX may include the micro lens MLS, the color filter CF, the first photoelectric converter 110, the through wire 114, the storage node 115, the second photoelectric converter 120, and the wiring layer ML. Each of the plurality of pixels PX may include the planarization layer PL and the insulating layer IL.

The central axis CX of the second photoelectric converter 120 may be separated from the optical axis MLX in one direction.

In FIG. 8, the pixel PX of the image sensor 200 is similar to the pixel PX in the image sensor 100 of FIG. 3. However, in the pixel PX of FIG. 8, the planarization layer PL, the first photoelectric converter 110, the color filter CF, the second photoelectric converter 120, and the wiring layer ML may be sequentially stacked under the micro lens MLS.

Accordingly, in the light incident through the micro lens MLS, light having a first wavelength band may be photoelectric converted in the first photoelectric converter 110, and the light of a partial wavelength band from the wavelength band other than the first wavelength band may transmit through the color filter CF. The light component that has transmitted through the color filter CF may be photoelectric converted in the second photoelectric converter 120.

The color filter CF is, for example, a complementary color filter, that may reflect light having a wavelength band that is complementary with the light absorbed by the second photoelectric converter 120. For example, the color filter CF may block the light having the wavelength band that is complementary with the second wavelength band or the third wavelength band to be incident to the second photoelectric converter 120. Accordingly, the second photoelectric converter 120 may photoelectrically convert the light of the third wavelength band or the second wavelength band. For example, the light of the first to third wavelength bands may be green, red, and blue light. Also, the light of first to third wavelength bands may be green, cyan, and magenta light. However, one or more example embodiments are not limited thereto.

Figure 9:
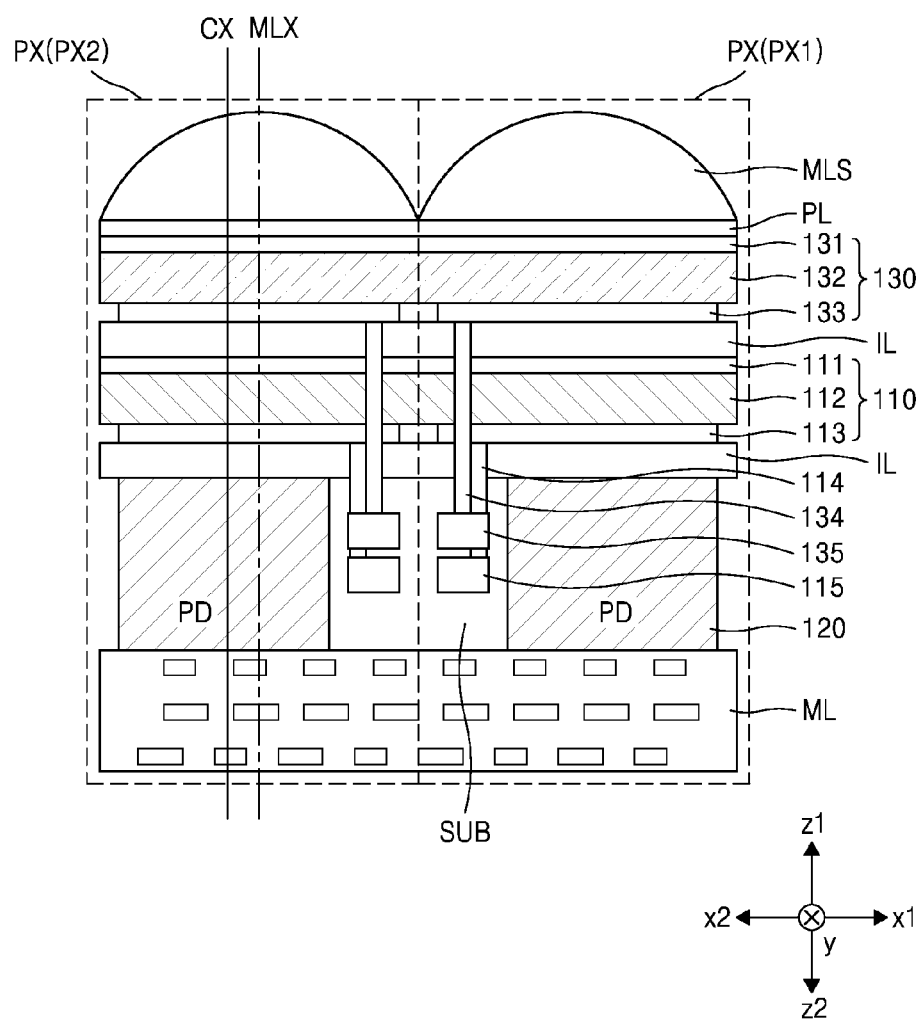
FIG. 9 is a vertical cross-sectional view of a pixel included in an image sensor according to example embodiments.

FIG. 9 is a vertical cross-sectional view of a pixel included in an image sensor 300 according to example embodiments.

Referring to FIG. 9, the image sensor 300 may include a plurality of pixels PX, and each of the plurality of pixels PX may include the micro lens MLS, the first photoelectric converter 110, a first through wire 114, a first storage node 115, the second photoelectric converter 120, a third photoelectric converter 130, a third through wire 134, a third storage node 135, and the wiring layer ML. Each of the plurality of pixels PX may further include the planarization layer PL and the insulating layer IL. Also, each of the plurality of pixels PX may further include a color filter (not shown).

The first photoelectric converter 110 may absorb light of the first wavelength band and may convert the light into the electric signal, and the third photoelectric converter 130 may absorb light of the third wavelength band and may convert the light into an electric signal. The second photoelectric converter 120 may absorb remaining component of the incident light and may convert the remaining component of the incident light into the electric signal.

As shown in FIG. 9, when the third photoelectric converter 130, the first photoelectric converter 110, and the second photoelectric converter 120 are sequentially stacked under the micro lens MLS, the second photoelectric converter 120 may absorb light except for the light of the first and third wavelength bands from among the light incident through the micro lens MLS. For example, the second photoelectric converter 120 may convert the light of the second wavelength band into the electric signal. In one or more example embodiments, in order to selectively absorb the light of the second wavelength band, the color filter (not shown) may be between the micro lens MLS and the second photoelectric converter 120.

In one or more example embodiments, the first photoelectric converter 110 and the third photoelectric converter 130 may include organic photodiodes. The first photoelectric converter 110 and the third photoelectric converter 130 may respectively include upper electrodes 111 and 131, color selection layers 112 and 132, and lower electrodes 113 and 133. The electric signal converted in the third photoelectric converter 130 may be stored in the third storage node 135 via the third through wire 134. The electric signal converted in the first photoelectric converter 110 may be stored in the first storage node 115 via the first through wire 114.

In FIG. 9, the first storage node 115 and the third storage nodes 135 are stacked in the up and down direction in the semiconductor substrate SUB, for example, z1-z2 direction, but are not limited thereto. For example, the first storage node 115 and the third storage node 135 may be separated from each other on an equal horizontal plane. Also, the first storage node 115 and the third storage node 135 may be separated from each other in the y direction or the x1-x2 direction.

The second photoelectric converter 120 is an inorganic photodiode and may be in the semiconductor substrate SUB. The central axis CX of the second photoelectric converter 120 may be separated from the optical axis MLX. The central axes CX of the second photoelectric converters 120 in the first pixel PX1 and the second pixel PX2 that are adjacent to each other may be separated from the optical axis MLX in different directions from each other. Accordingly, the first pixel PX1 may output an electric signal corresponding to the optical signal of the second wavelength band with respect to a left incident light which is incident from a left side of the optical axis MLX, and the second pixel PX2 may output an electric signal corresponding to the optical signal of the second wavelength band with respect to the right incident light which is incident from a right side of the optical axis MLX. Each of the electric signals may be amplified in a pixel circuit (not shown) included in the wiring layer ML and may be used to perform the phase-difference AF.

The pixels PX included in FIG. 9 include the first to third photoelectric converters 110, 120, and 130 that may photo-electrically convert the light of different wavelength bands from each other, and accordingly, one pixel PX may output the electric signals corresponding to the optical signals of at least three wavelength bands. Also, since the second photoelectric converters 120 of the first pixel PX1 and the second pixels PX2 are deviated toward the opposite directions, the electric signals output from the at least a pair of pixels PX1 and PX2 may be output as the parallax image signal or the parallax image.

Figure 10:
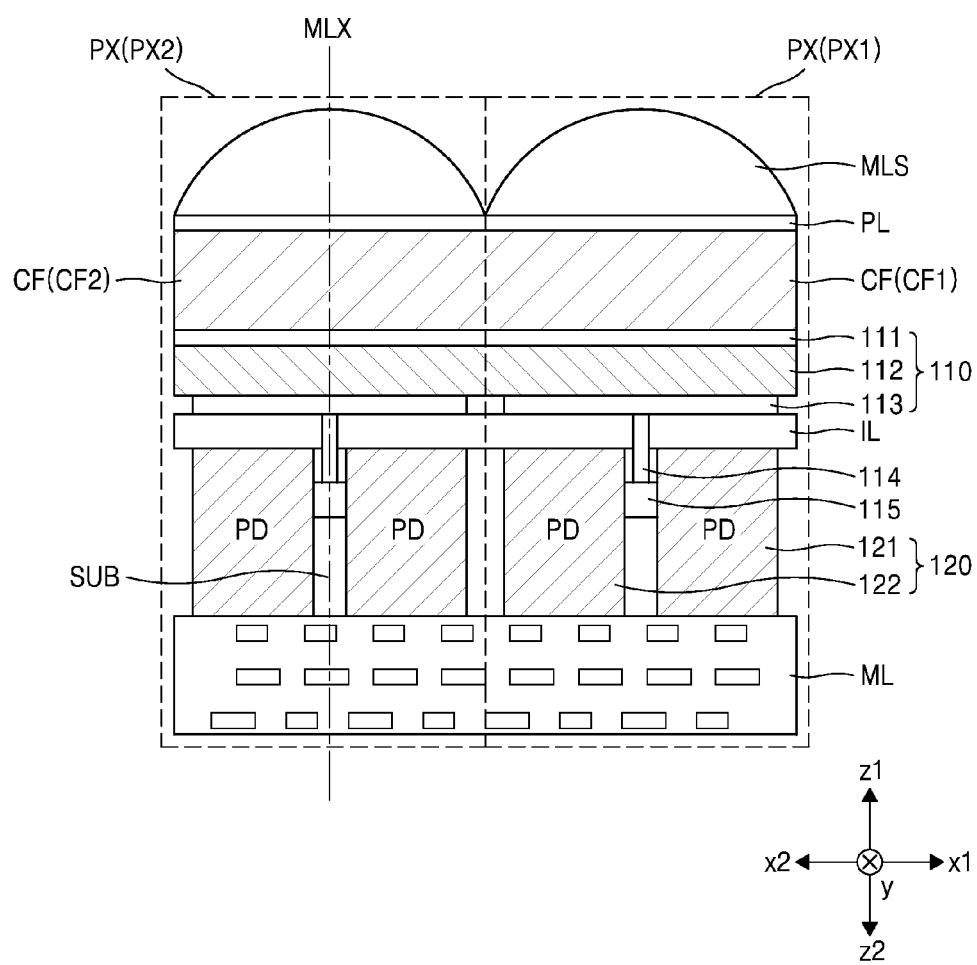
FIG. 10 is a vertical cross-sectional view of a pixel included in an image sensor according to example embodiments.

FIG. 10 is a vertical cross-sectional view of a pixel PX included in an image sensor 400 according to example embodiments.

Referring to FIG. 10, the image sensor 400 may include a plurality of pixels PX, and each of the plurality of pixels PX may include the micro lens MLS, the color filter CF, the first photoelectric converter 110, the through wire 114, the storage node 115, the second photoelectric converter 120, and the wiring layer ML. Each of the plurality of pixels PX may further include the planarization layer PL and the insulating layer IL.

The micro lens MLS, the planarization layer PL, the color filter CF, the first photoelectric converter 110, the second photoelectric converter 120, and the wiring layer ML may be sequentially stacked under the micro lens MLS, but are not limited thereto. For example, locations of the first photoelectric converter 110 and the second photoelectric converter 120 may be changed. The first photoelectric converter 110 may be under the second photoelectric converter 120.

Configurations and operations of the pixel PX in FIG. 10 are similar to those of the pixel PX in FIG. 3. However, the second photoelectric converter 120 included in the pixel PX may be different from that of the pixel PX of FIG. 3. Therefore, descriptions for the similar elements are omitted, and description of the second photoelectric converter 120 will be described below.

As shown in FIG. 10, the second photoelectric converter 120 may include a first photoelectric conversion device 121 and a second photoelectric conversion device 122. The first photoelectric conversion device 121 and the second photoelectric conversion device 122 may be inorganic photodiodes such as silicon photodiodes or compound semiconductor photodiodes. The first photoelectric conversion device 121 and the second photoelectric conversion device 122 may be formed in the semiconductor substrate SUB.

The first photoelectric conversion device 121 and the second photoelectric conversion device 122 may be separated from each other based on the optical axis MLX. Accordingly, the first photoelectric conversion device 121 and the second photoelectric conversion device 122 may sense light incident from different directions from each other. For example, the first photoelectric conversion device 121 may mainly sense the light incident from the x2 direction, for example, the left side of the optical axis MLX, and the second photoelectric conversion device 122 may mainly sense the light incident from the x1 direction, for example, the right side of the optical axis MLX.

Accordingly, the second photoelectric converter 120 may output at least two electric signals with respect to the light of the second wavelength band, and a parallax image signal may be acquired based on the electric signals.

In addition, the image sensor 400 may include the plurality of pixels PX1 and PX2. The first pixel PX1 and the second pixel PX2 that are adjacent to each other may include the color filters CF with respect to light of the different kinds or the same kind, but are not limited thereto. For example, in one or more example embodiments, the plurality of pixels PX may not include the color filter CF.

The electric signals corresponding to the light of the second wavelength band output from the first photoelectric conversion devices 121 respectively included in the first pixel PX1 and the second pixel PX2 configure a first image signal (for example, left eye image signal), and the electric signals output from the second photoelectric conversion devices 122 respectively included in the first pixel PX1 and the second pixel PX2 may configure a second image signal (for example, right eye image signal).

FIGS. 11A to 11G are horizontal cross-sectional views of a pixel PX included in image sensors 400a to 400g according to example embodiments. FIGS. 11A to 11G show the horizontal cross section of the pixel PX shown in FIG. 10. For convenience of description, elements other than the first photoelectric conversion device 121 and the second photoelectric conversion device 122, the storage node 115, and the micro lens MLS are omitted.

Figure 11A:
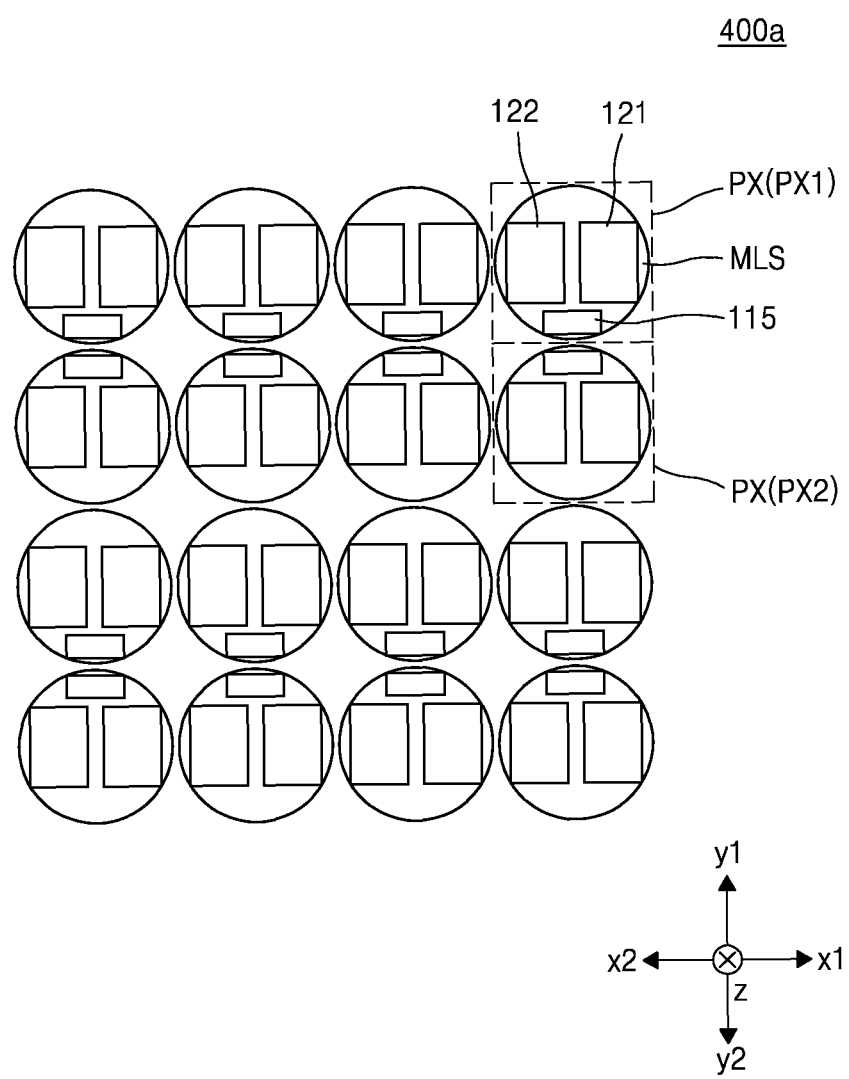
FIGS. 11A to 11G are horizontal cross-sectional views of a pixel included in an image sensor according to example embodiments.

Referring to FIG. 11A, the first photoelectric conversion device 121 and the second photoelectric conversion device 122 may be arranged in the pixel PX of the image sensor 400a. The first photoelectric conversion device and the second photoelectric conversion device 122 may be separated from each other such that the first photoelectric conversion device 121 and the second photoelectric conversion device 122 are deviated to left and right sides, for example, in the x1-x2 direction. Accordingly, the first photoelectric conversion device 121 and the second photoelectric conversion device 122 may output left and right binocular parallax image signals.

The storage node 115 may be in a remaining space, and may be deviated to the y1 direction or the y2 direction. In FIG. 11A, the storage node 115 of the first pixel PX1 is deviated toward the y1 direction, and the storage node 115 of the second pixel PX2 is deviated toward the y2 direction. However, one or more example embodiments are not limited thereto, for example, the storage nodes 115 of the first pixel PX1 and the second pixel PX2 may be deviated to the same direction such as the y1 direction or the y2 direction.

Figure 11B:
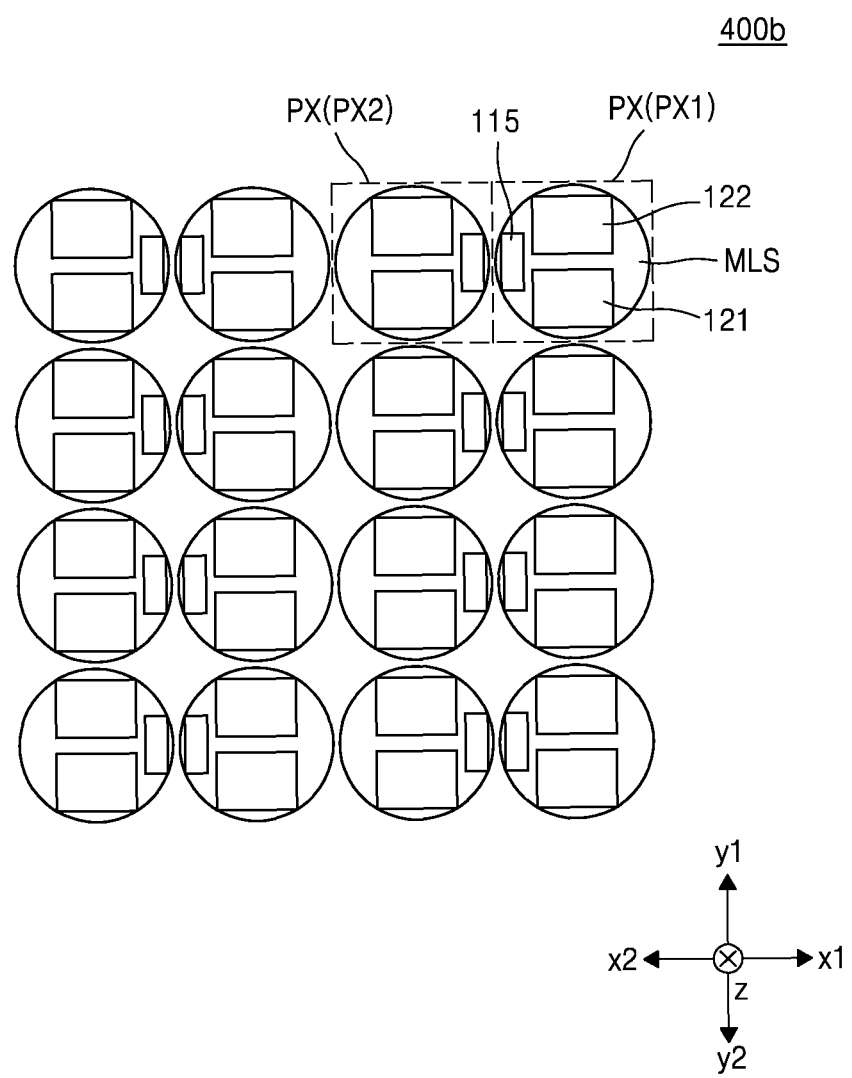

Referring to FIG. 11B, the first photoelectric conversion device 121 and the second photoelectric conversion device 122 included in the pixel PX of the image sensor 400b may be separated from each other such that the first photoelectric conversion device 121 and the second photoelectric conversion device are deviated to upper and lower directions, for example, the y1-y2 direction. Accordingly, the first photoelectric conversion device 121 and the second photoelectric conversion device 122 may output upper and lower binocular parallax image signals.

The storage node 115 may be on a remaining space, and may be deviated to the x1 direction or the x2 direction. In FIG. 11B, the storage node 115 of the first pixel PX1 is deviated to the x1 direction and the storage node 115 of the second pixel PX2 is deviated to the x2 direction. However, one or more example embodiments are not limited thereto, for example, the storage nodes 115 of the first pixel PX1 and the second pixels PX2 may be deviated to the same direction such as the x1 direction or the x2 direction.

Figure 11C:
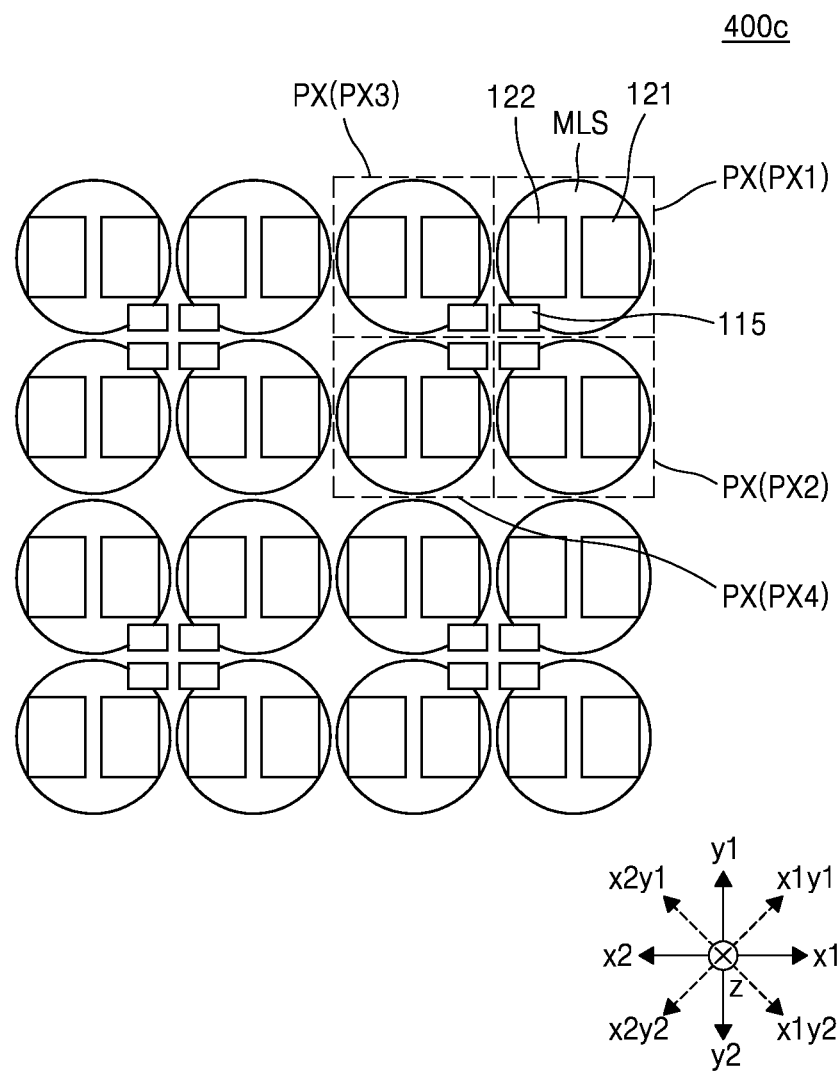

Referring to FIG. 11C, the structure of the pixel PX in the image sensor 400c is similar to that of the pixel PX in the image sensor 400a of FIG. 11A, except for the arrangement of the storage node 115.

The storage node 115 may be deviated in a diagonal direction of the pixel PX, for example, the x1y1 direction, the x1y2 direction, the x2y1 direction, and the x2y2 direction. As shown in FIG. 11C, the storage nodes 115 of four adjacent pixels PX1 to PX4 may be deviated toward center of the four pixels PX1 to PX4. However, one or more example embodiments are not limited thereto, for example, the storage nodes 115 of the pixels PX may be in at least one direction selected from the x1y1 direction, the x1y2 direction, the x2y1 direction, and the x2y2 direction. Also, the storage nodes 115 of the pixels PX may be deviated to the same direction.

Figure 11D:
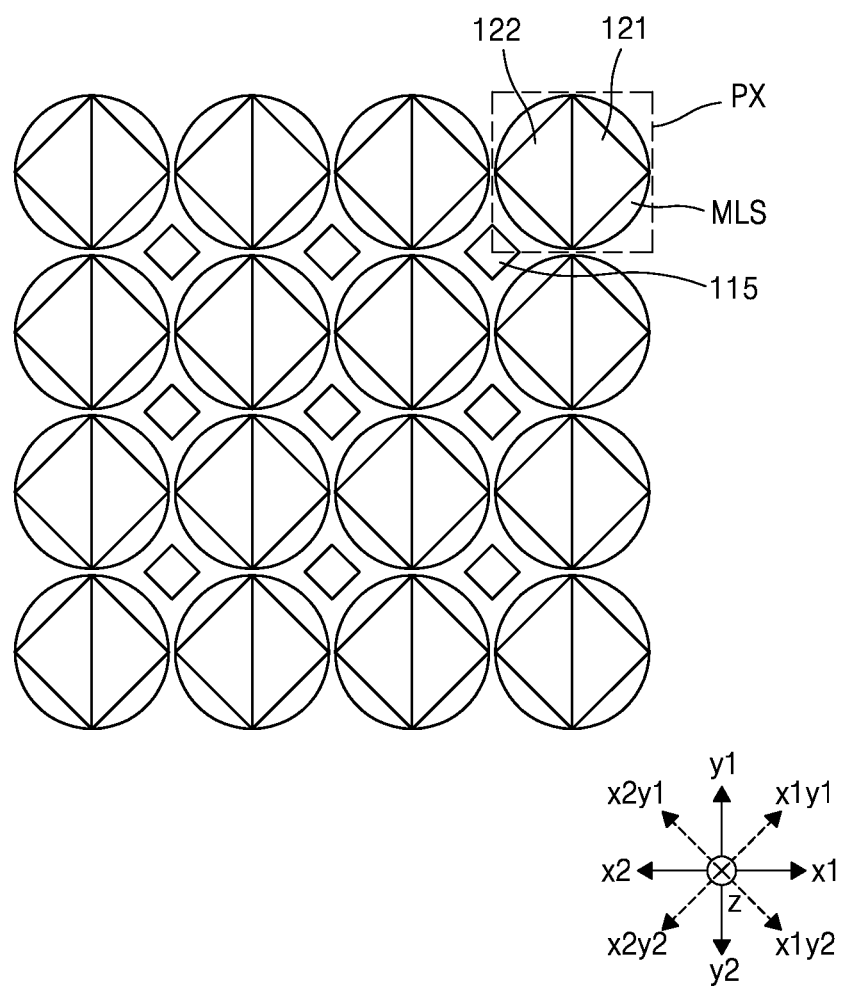
Figure 11E:
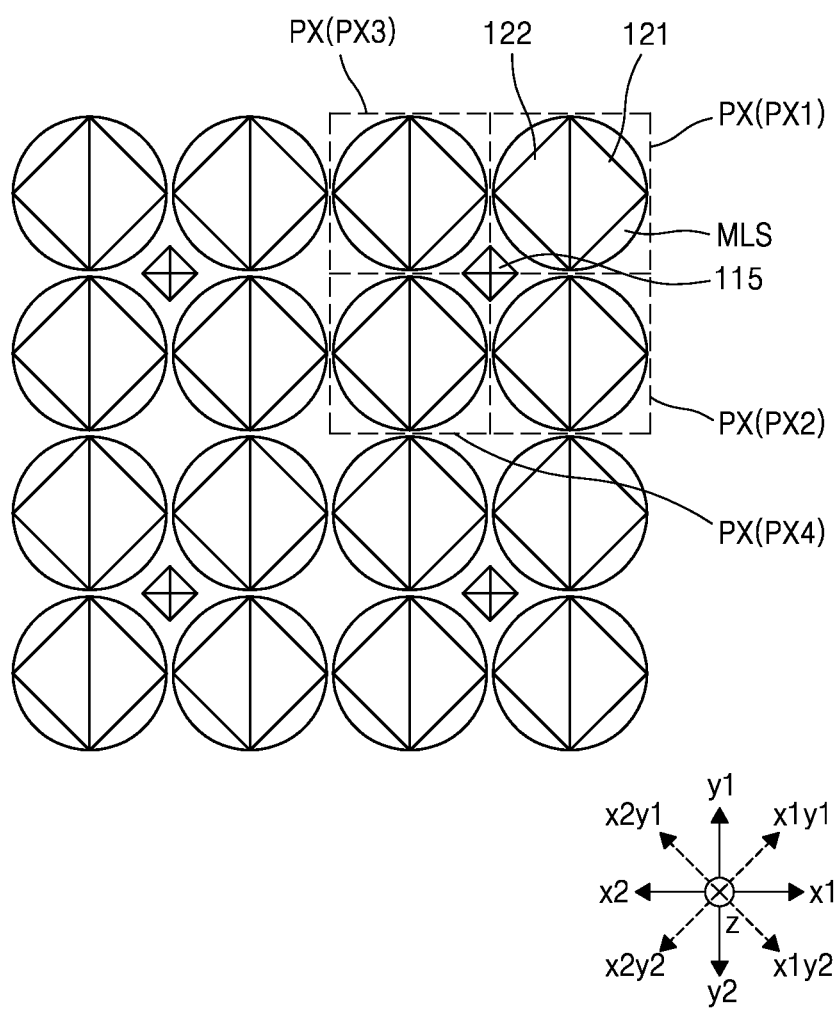
Figure 11F:
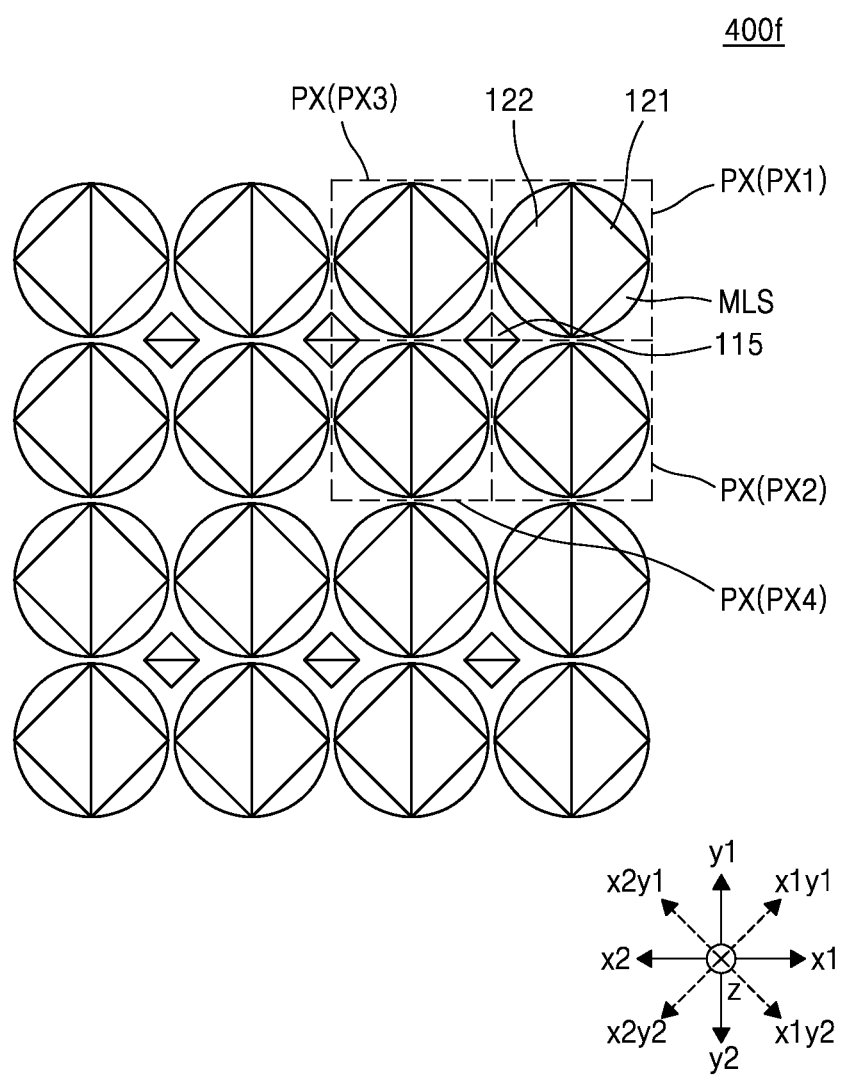
Figure 11G:
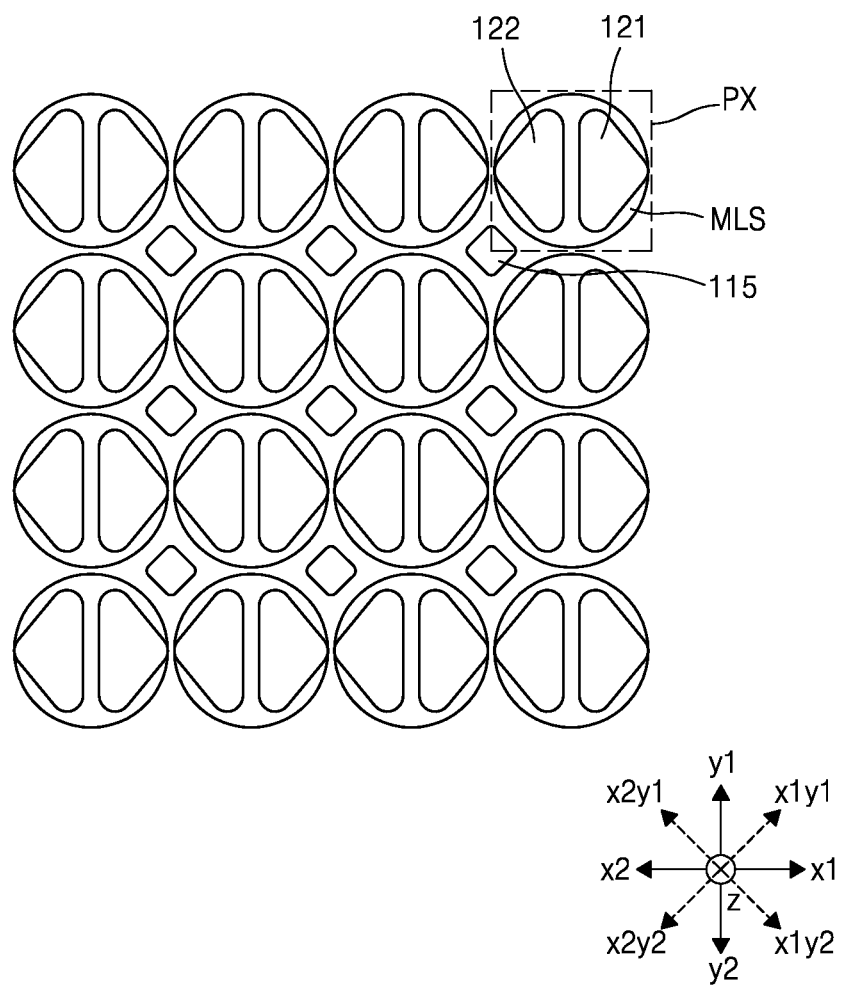

Referring to FIGS. 11D to 11G, the first photoelectric conversion device 121 and the second photoelectric conversion device 122 included in the pixel PX of the image sensor 400d to 400g may have triangular shapes. Also, as shown in FIG. 11G, edges of the triangles may be softly patterned. In FIGS. 11D to 11G, the first photoelectric conversion device 121 and the second photoelectric conversion device 122 are deviated to the left and right directions, for example, in the x1-x2 direction, but are not limited thereto. For example, the first photoelectric conversion device 121 and the photoelectric conversion device 122 may be deviated to upper and lower directions, for example, the y1-y2 direction. Otherwise, the first photoelectric conversion device 121 and the second photoelectric conversion device 122 of some pixels PX may be deviated to the upper and lower directions, and the first photoelectric conversion device 121 and the second photoelectric conversion device 122 of other pixels PX may be deviated to the left and right directions.

In addition, the storage node 115 may be deviated in at least one of the direction selected from the x1y1 direction, the x1y2 direction, the x2y1 direction, and the x2y2 direction, and as shown in FIGS. 11E and 11F, the storage nodes 115 may be also formed as triangles.

As shown in FIGS. 11D and 11G, the storage nodes 115 included in the plurality of pixels PX may be deviated in the same direction, for example, one of the x1y1 direction, the x1y2 direction, the x2y1 direction, and the x2y2 direction, but are not limited thereto.

For example, as shown in FIG. 11E, the storage nodes 115 included in the four pixels PX1 to PX4 may be deviated to different directions from each other. Also, as shown in FIG. 11F, the storage nodes 115 included in the first pixel PX1 and the third pixel PX3 may be deviated in the lower direction and the storage node 115 included in the second pixel PX2 and the fourth pixel PX4 may be deviated in the upper direction.

In addition, in FIGS. 11D to 11G, the first photoelectric conversion device 121 and the second photoelectric conversion device 122 have triangular shape, but are not limited thereto. The shapes of the first photoelectric conversion device 121 and the second photoelectric conversion devices 122 may be variously modified to improve the fill factor of the pixel PX. Also, shapes and arrangements of the storage nodes 115 may vary depending on the shapes and the arrangements of the first photoelectric conversion device 121 and the second photoelectric conversion device 122.

Figure 12:
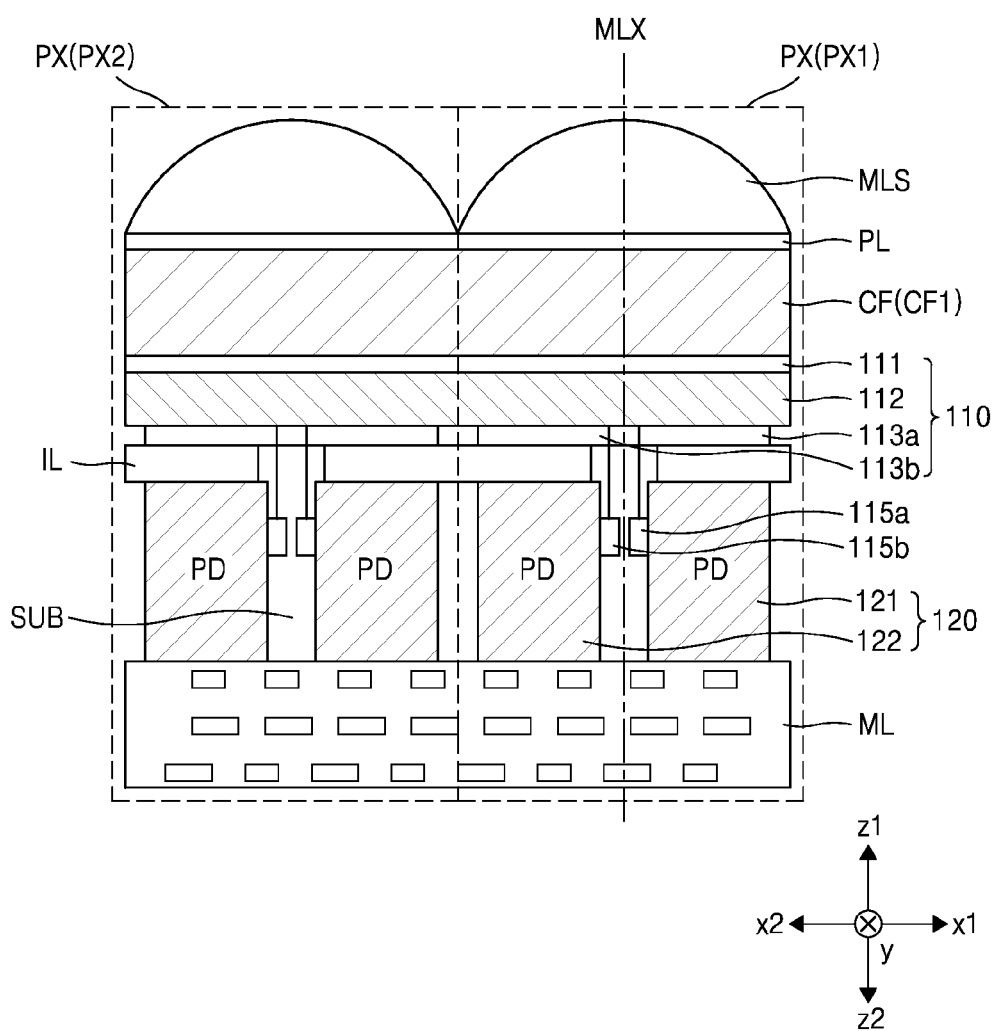
FIG. 12 is a vertical cross-sectional view of a pixel included in an image sensor according to example embodiments.

FIG. 12 is a vertical cross-sectional view of a pixel PX included in an image sensor 500 according to example embodiments.

Referring to FIG. 12, each of the plurality of pixels PX may include the micro lens MLS, the color filter CF, the first photoelectric converter 110, a first storage node 115a and a second storage node 115b, the second photoelectric converter 120, and the wiring layer ML. Each of the plurality of pixels PX may further include the planarization layer PL and the insulating layer IL.

The micro lens MLS, the planarization layer PL, the color filter CF, the first photoelectric converter 110, the second photoelectric converter 120, and the wiring layer ML may be sequentially stacked under the micro lens MLS. However, one or more example embodiments are not limited thereto. For example, locations of the first photoelectric converter 110 and the second photoelectric converter 120 may be changed. The first photoelectric converter 110 may be under the second photoelectric converter 120.

The pixel PX of FIG. 12 may have similar configuration and operation to those of the pixel PX of FIG. 10, except for the first photoelectric converter 110 included in the pixel PX. Therefore, descriptions about the elements that are same as those of the pixel PX in FIG. 10 are omitted, and the description of the first photoelectric converter 110 will be described below.

As shown in FIG. 12, the first photoelectric converter 110 may include the upper electrode 111, the color selection layer 112, a first lower electrode 113a, and a second lower electrode 113b. The first lower electrode 113a and the second lower electrode 113b may be separated from each other based on the optical axis MLX. As described above, since the first photoelectric converter 110 includes the first lower electrode 113a and the second lower electrode 113b that are separated from each other, it may be considered that the first photoelectric converter 110 may include two photoelectric conversion devices that may output different electric signals from each other.

Each of the pixels PX may include a first storage node 115a and a second storage node 115b corresponding to the first lower electrode 113a and the second lower electrode 113b. The electric signal output from the first lower electrode 113a may be stored in the first storage node 115a. The electric signal output from the second lower electrode 113b may be stored in the second storage node 115b.

The first lower electrode 113a and the second lower electrode 113b may output the electric signals corresponding to the light incident from different directions from each other. For example, the first lower electrode 113a may output the electric signal corresponding to light incident from the x2 direction, for example, the left side of the optical axis MLX, and the second lower electrode 113b may output the electric signal corresponding to light incident from the x1 direction, for example, the right side of the optical axis MLX. The parallax image signal may be acquired based on the two electric signals output from the first lower electrode 113a and the second lower electrode 113b.

Also, since the second photoelectric converter 120 includes the first photoelectric conversion device 121 and the second photoelectric conversion device 122 that are deviated, the electric signals output from the first lower electrode 113a and the first photoelectric conversion device 121 are combined to form a first image signal (for example, left eye image signal), and the electric signals output from the second lower electrode 113b and the second photoelectric conversion device 122 are combined to form a second image signal (for example, right eye image signal).

FIGS. 13A to 13E are horizontal cross-sectional views of a pixel PX included in image sensors 500a to 500e according to example embodiments. FIGS. 13A to 13E show the horizontal cross section of the pixel PX shown in FIG. 12, and for convenience of description, elements other than the first photoelectric conversion device 121 and the second photoelectric conversion device 122 of the second photoelectric converter 120, the first storage node 115a and the second storage node 115b, and the micro lens MLS are omitted. The first lower electrode 113a and the second lower electrode 113b of the first photoelectric converter 110 may be stacked on the first photoelectric conversion device 121 and the second photoelectric conversion device 122 in a z direction.

Figure 13A:
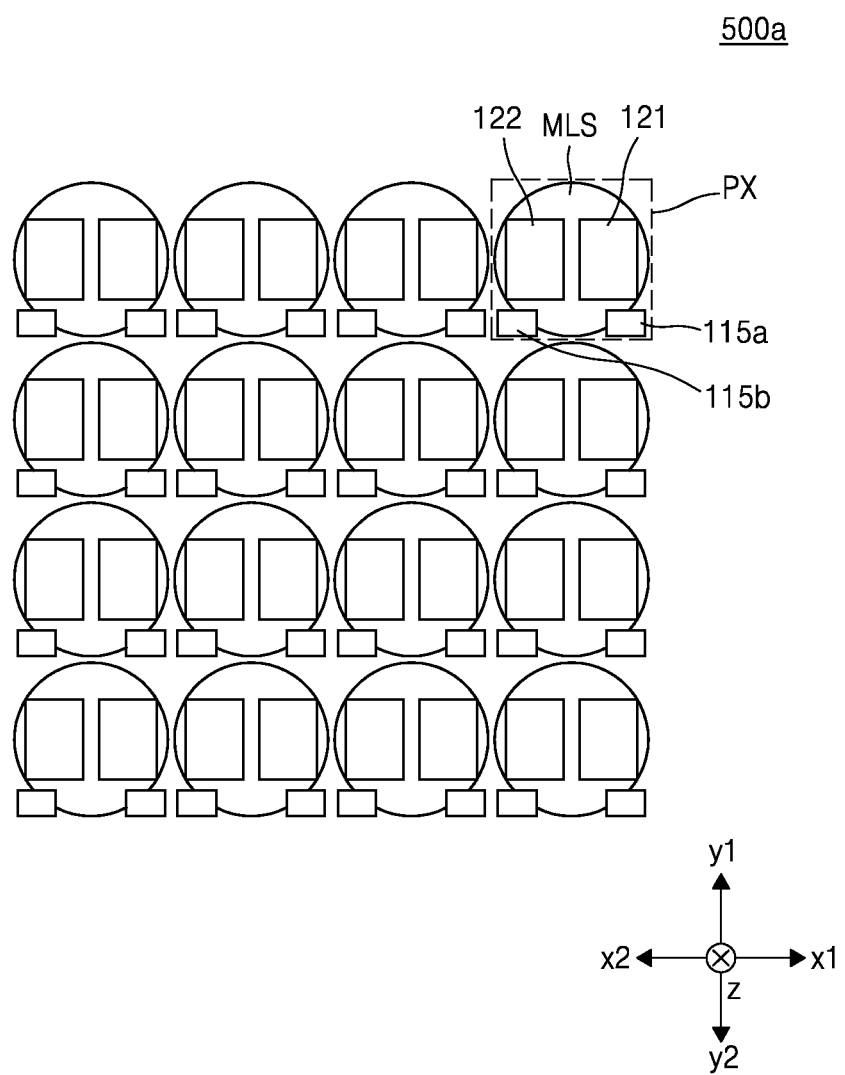
FIGS. 13A to 13E are horizontal cross-sectional views of a pixel included in an image sensor according to example embodiments.

Referring to FIG. 13A, the first photoelectric conversion device 121 and the second photoelectric conversion device 122 may be arranged in the pixel PX of the image sensor 500a. The first photoelectric conversion device 121 and the second photoelectric conversion device 122 may be separated from each other such that the first photoelectric conversion device 121 and the second photoelectric conversion device 122 are deviated to the left and right directions, for example, the x1-x2 direction.

The first storage node 115a and the second storage node 115b may be arranged in the remaining space in the pixel PX. The first storage node 115a and the second storage node 115b may be separated from each other such that the first storage node 115a and the second storage node 115b are deviated in the x1-x2 direction.

Figure 13B:
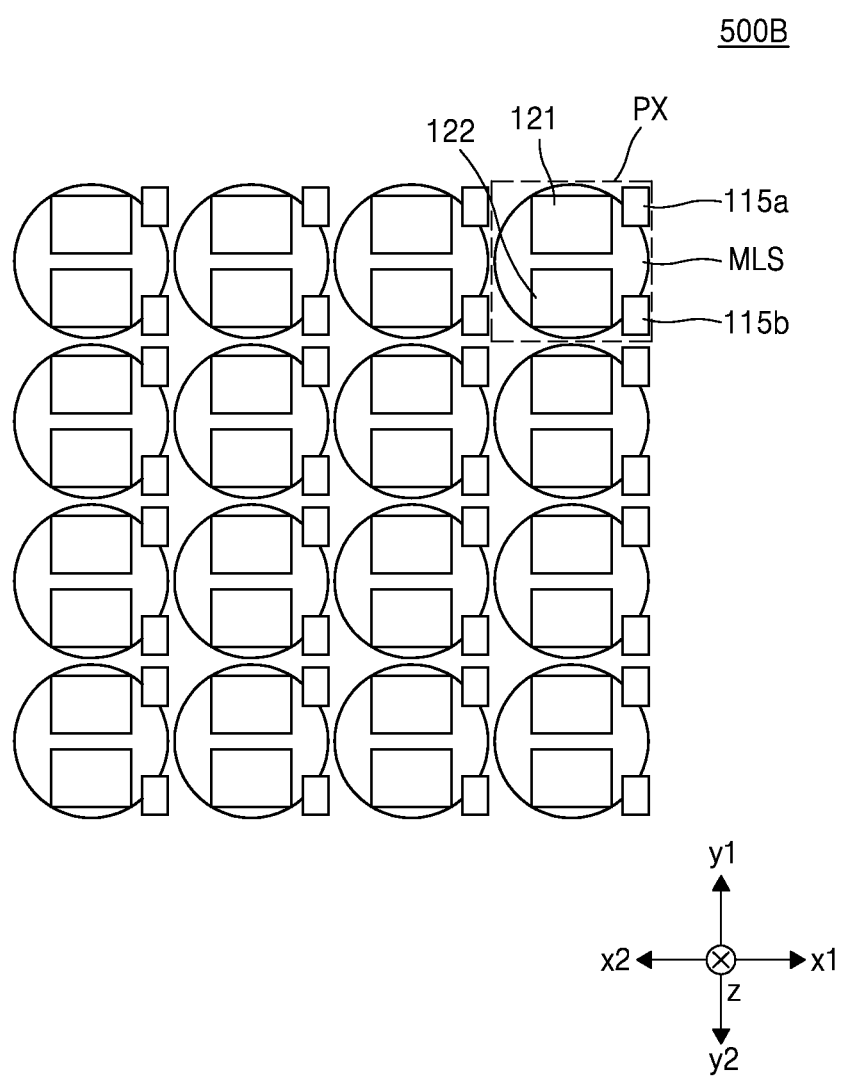

Referring to FIG. 13B, the first photoelectric conversion device 121 and the second photoelectric conversion device 122 may be separated from each other such that the first photoelectric conversion device 121 and the second photoelectric conversion device 122 are deviated to the upper and lower directions, for example, the y1-y2 direction.

The first storage node 115a and the second storage node 115b may be arranged in the remaining space in the pixel PX. The first storage node 115a and the second storage node 115b may be separated from each other such that the first storage node 115a and the second storage node 115b are deviated in the y1-y2 direction.

Figure 13C:
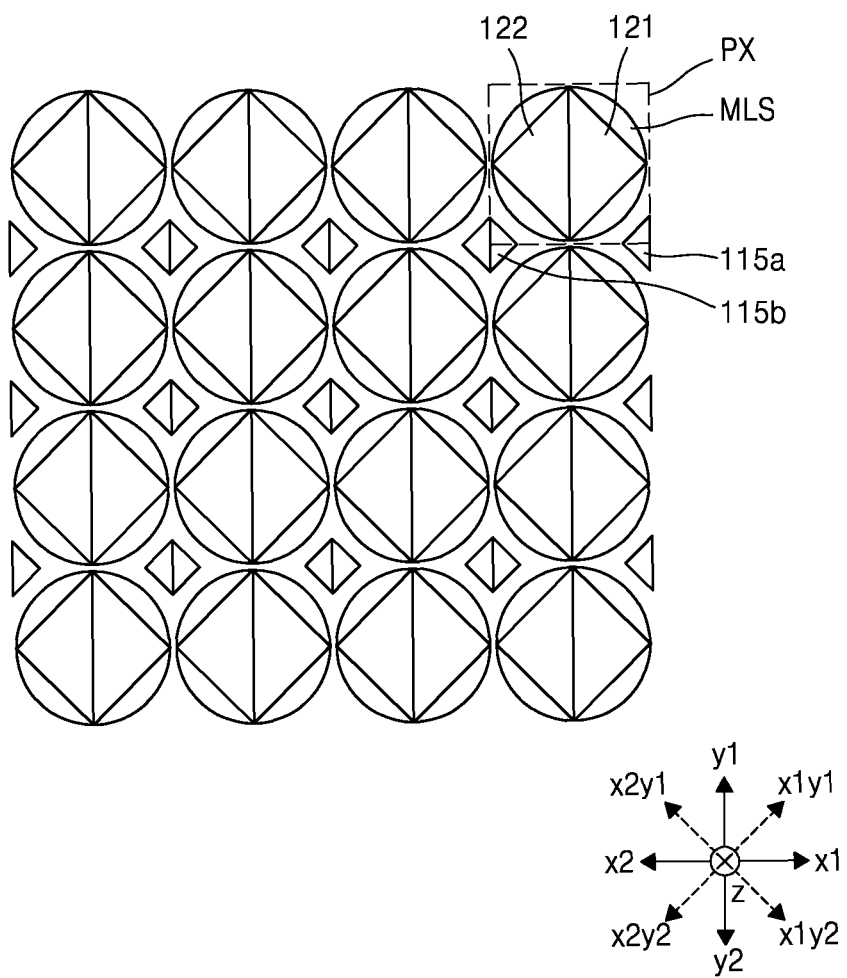

Referring to FIG. 13C, the first photoelectric conversion device 121 and the second photoelectric conversion device 122 may have triangular shapes. Also, the first storage node 115a and the second storage node 115b may have triangular shapes.

The first photoelectric conversion device 121 and the second photoelectric conversion device 122 may be separated from each other to the left and right sides, for example, the x1-x2 direction.

The first storage node 115a and the second storage node 115b may be arranged in the remaining space in the pixel PX, and may be separated from each other in the x1-x2 direction.

In one or more example embodiments, the first photoelectric conversion device 121 and the second photoelectric conversion device 122 may have triangular shapes and the first storage node 115a and the second storage node 115b may be separated from each other such that the first storage node 115a the second storage node 115b are deviated to the upper and lower directions, for example, the y1-y2 direction.

Figure 13D:
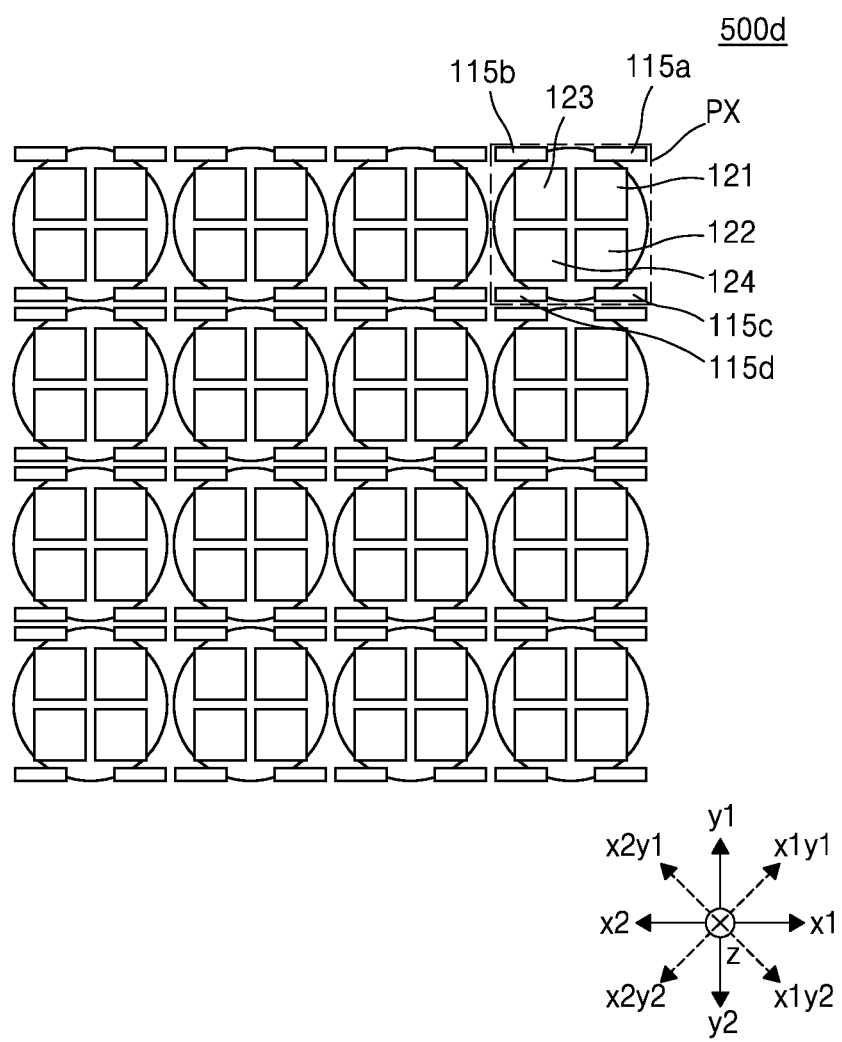

Referring to FIG. 13D, the pixel PX of the image sensor 500d may include first to fourth photoelectric conversion devices 121 to 124 and first to fourth storage nodes 115a to 115d. For example, in the image sensor 500 of FIG. 12, the pixel PX may include the first to fourth photoelectric conversion devices 121 to 124 and first to fourth lower electrodes 113a to 113d that are deviated to the x1-x2 direction and the y1-y2 direction. In addition, the pixel PX may include the first to fourth storage nodes 115a to 115d. Each of the plurality of pixels PX may output four electric signals with respect to the light of the first wavelength band and may output four electric signals with respect to the light of the second wavelength band. A parallax image signal between the left and right sides and the upper and lower sides may be generated based on the four electric signals of each wavelength band.

The first to fourth photoelectric conversion devices 121 to 124 may be deviated in the diagonal direction of the pixel PX, for example, the x1y1 direction, the x1y2 direction, the x2y1 direction, and the x2y2 direction. The x1y1 direction, the x1y2 direction, the x2y1 direction, and the x2y2 direction may be perpendicular to each other.

The first to fourth storage nodes 115a to 115d may be arranged in the remaining space of the pixel PX, and may be deviated in the diagonal direction of the pixel PX, for example, the x1y1 direction, the x1y2 direction, the x2y1 direction, and the x2y2 direction.

Figure 13E:
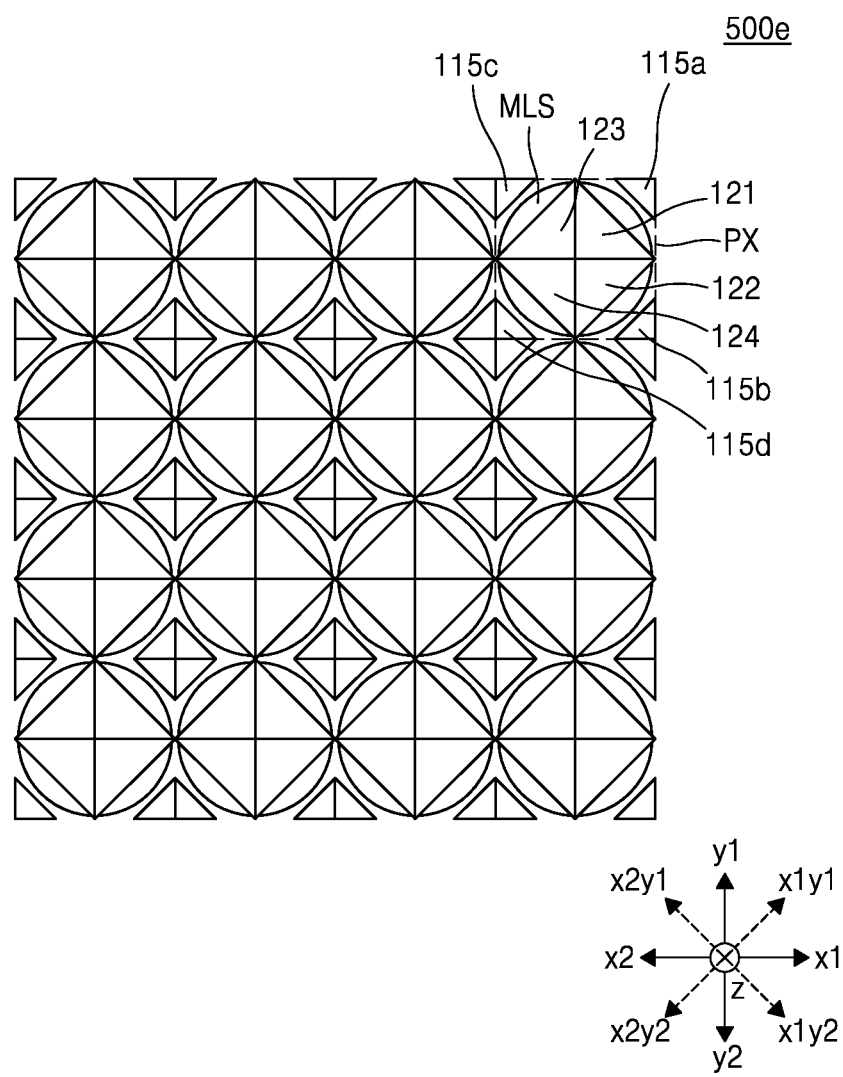

Referring to FIG. 13E, each of the pixels PX in the image sensor 500e may include first to fourth photoelectric conversion devices 121 to 124 and first to fourth storage nodes 115a to 115d. Similarly to FIG. 13D, the first to fourth photoelectric conversion devices 121 to 124 and the first to fourth storage nodes 115a to 115d may be deviated in the diagonal directions of the pixel PX, for example, the x1y1 direction, the x1y2 direction, the x2y1 direction, and the x2y2 direction. In addition, as shown in FIG. 13E, the first to fourth photoelectric conversion devices 121 to 124 and the first to fourth storage nodes 115a to 115d may have triangular shapes. However, one or more example embodiments are not limited thereto, for example, the first to fourth photoelectric conversion devices 121 to 124 and the first to fourth storage nodes 115a to 115d may be various modified.

Figure 14:
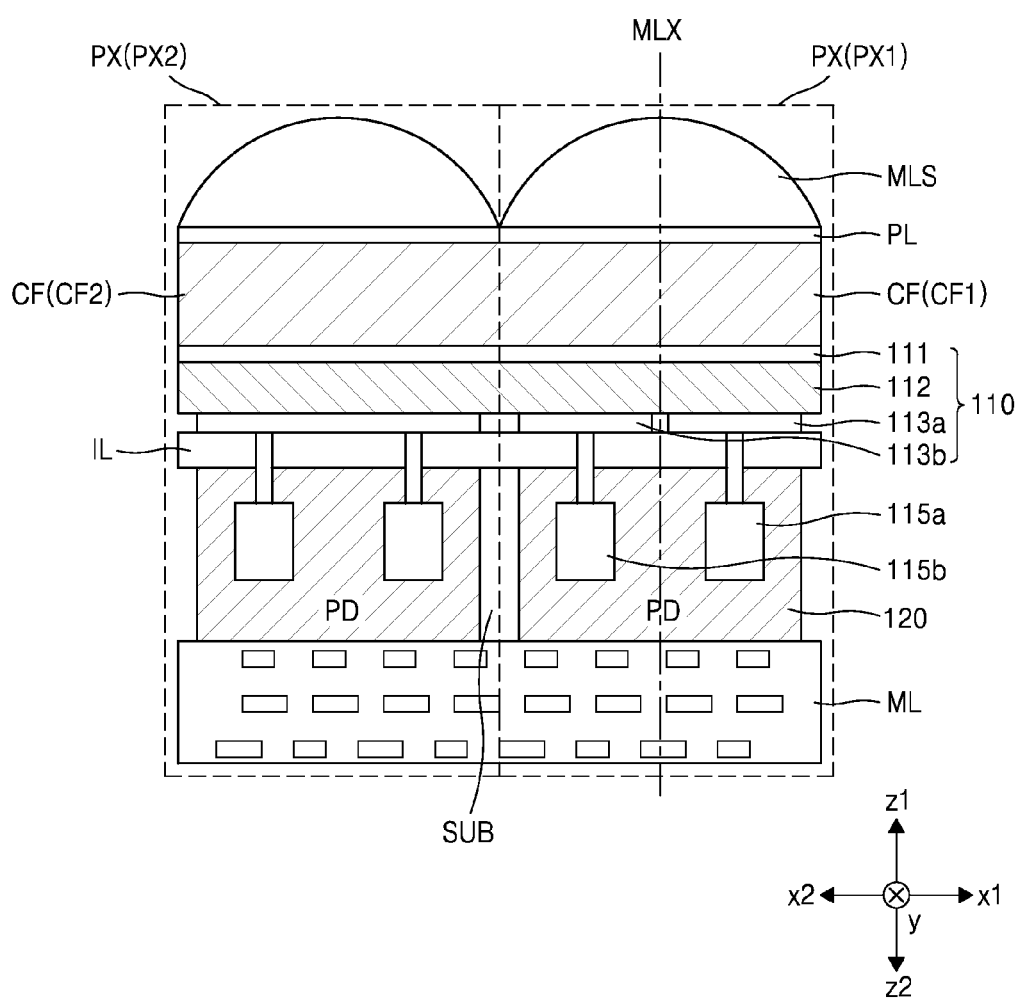
FIG. 14 is a vertical cross-sectional view of a pixel included in an image sensor according to example embodiments.

FIG. 14 is a vertical cross-sectional view of a pixel PX included in an image sensor 600 according to example embodiments.

Referring to FIG. 14, each of the plurality of pixels PX included in the image sensor 600 may include the micro lens MLS, the color filter CF, the first photoelectric converter 110, the first storage node 115a and the second storage node 115b, the second photoelectric converter 120, and the wiring layer ML. Each of the plurality of pixels PX may further include the planarization layer PL and the insulating layer IL.

The micro lens MLS, the planarization layer PL, the color filter CF, the first photoelectric converter 110, the second photoelectric converter 120, and the wiring layer ML may be sequentially stacked under the micro lens MLS. However, one or more example embodiments are not limited thereto, for example, locations of the first photoelectric converter 110 and the second photoelectric converter 120 may be changed. The first photoelectric converter 110 may be under the second photoelectric converter 120.

As shown in FIG. 14, the central axis CX of the second photoelectric converter 120 may coincide with the optical axis MLX. The second photoelectric converter 120 may convert the optical signal of the second wavelength band to the electric signal and may output the electric signal.

In addition, the first photoelectric converter 110 may include the upper electrode 111, the color selection layer 112, the first lower electrode 113a, and the second lower electrode 113b. The first lower electrode 113a and the second lower electrode 113b may be separated from each other based on the optical axis MLX. As described above, since the first photoelectric converter 110 includes the first lower electrode 113a and the second lower electrode 113b that are separated from each other, it may be considered that the first photoelectric converter 110 includes two photoelectric conversion devices outputting different electric signals from each other.

Each of the pixels PX may include through wires corresponding to the first lower electrode 113a and the second lower electrode 113b, and the first storage node 115a and the second storage node 115b. The electric signal output from the first lower electrode 113a may be stored in the first storage node 115a The electric signal output from the second lower electrode 113b may be stored in the second storage node 115b.

The first lower electrode 113a and the second lower electrode 113b may output electric signals corresponding to the light incident from different directions based on the optical axis MLX. For example, the first lower electrode 113a may output the electric signal corresponding to the light incident from the x2 direction, for example, the left side of the optical axis MLX, and the second lower electrode 113b may output the electric signal corresponding to the light incident from the x1 direction, for example, the right side of the optical axis MLX.

A parallax image signal may be acquired based on the two electric signals output from the first lower electrode 113a and the second lower electrode 113b.

Figure 15A:
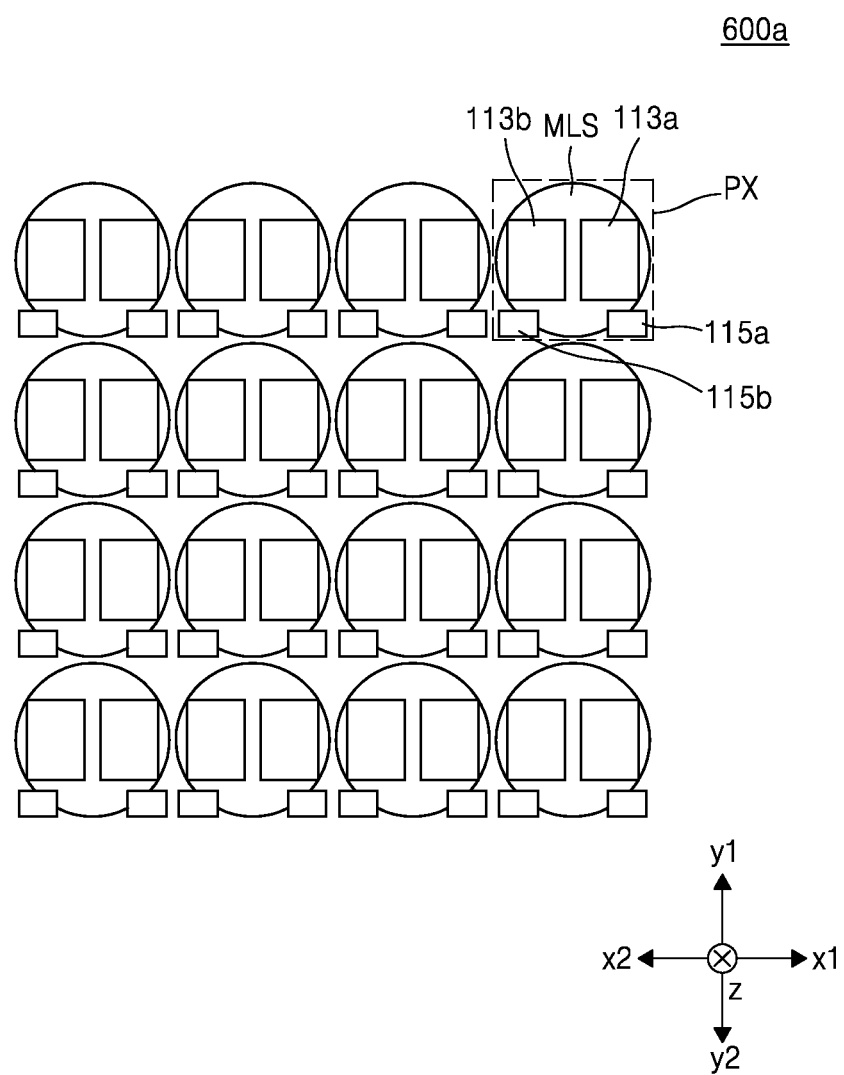
FIGS. 15A and 15B are horizontal cross-sectional views of a pixel included in an image sensor according to example embodiments.
Figure 15B:
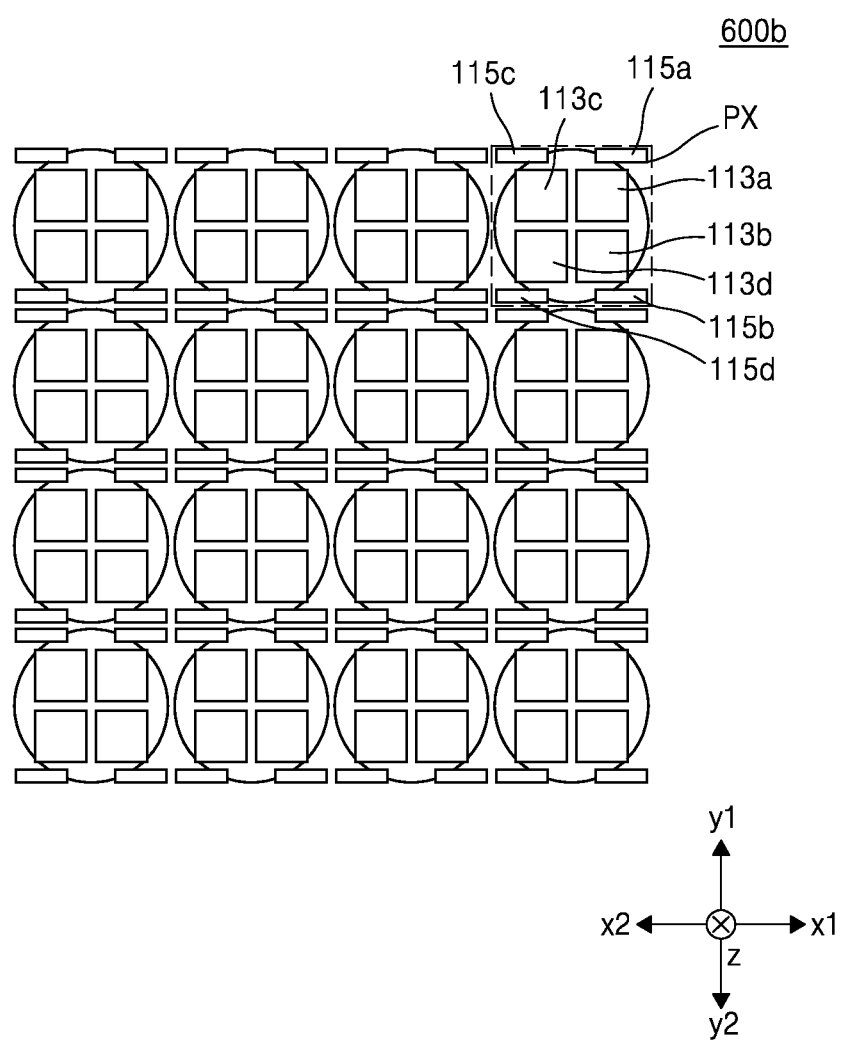

FIGS. 15A and 15B are horizontal cross-sectional views of a pixel PX included in image sensors 600a and 600b, respectively, according to example embodiments. FIGS. 15A and 15B show the horizontal cross-section of the pixel PX shown in FIG. 14, and for convenience of description, the first lower electrode 113a and the second lower electrode 113b of the first photoelectric converter 110, the first storage node 115a and the second storage node 115b corresponding to the first lower electrode 113a and the second lower electrode 113b, and the micro lens MLS are shown and the other elements are omitted.

Referring to FIG. 15A, the first lower electrode 113a and the second lower electrode 113b may be arranged in the pixel PX of the image sensor 600a. The first lower electrode 113a and the second lower electrode 113b may be separated from each other such that the first lower electrode 113a and the second lower electrode 113b are deviated to the left and right sides, for example, the x1-x2 direction, as shown in FIG. 15A, but are not limited thereto. For example, in other example embodiments, the first lower electrode 113a and the second lower electrode 113b may be separated from each other such that the first lower electrode 113a and the second lower electrode 113b are deviated to the upper and lower directions, for example, the y1-y2 direction. The second photoelectric converter 120 (as shown in FIG. 14) may be under the first lower electrode 113a and the second lower electrode 113b. An area of a horizontal cross-section of the second photoelectric converter 120 may be greater than a sum of horizontal cross-sectional areas of the first lower electrode 113a and the second lower electrode 113b.

The first storage node 115a and the second storage node 115b may be arranged in the remaining space of the pixel PX. The first storage node 115a and the second storage node 115b may be separated from each other such that the first storage node 115a and the second storage node 115b are deviated in the x1-x2 direction. Otherwise, the first storage node 115a and the second storage node 115b may be separated from each other such that the first storage node 115a and the second storage node 115b are deviated in the y1-y2 direction.

As shown in FIG. 15A, the first lower electrode 113a and the second lower electrode and 113b, and the first storage node 115a and the second storage node 115b have square shapes, but are not limited thereto. For example, shapes of the first lower electrode 113a and the second lower electrode 113b or the first storage node 115a and the second storage node 115b may be variously modified.

Referring to FIG. 15B, the pixel PX of the image sensor 600b may include first to fourth lower electrodes 113a to 113d and first to fourth storage nodes 115a to 115d. That is, in the image sensor 600 of FIG. 14, the pixel PX may include the first to fourth lower electrodes 113a to 113d that are deviated to the x1-x2 direction and the y1-y2 direction. In addition, the pixel PX may include the first to fourth storage nodes 115a to 115d corresponding to the first to fourth lower electrodes 113a to 113d. Each of the plurality of pixels PX may output four electric signals with respect to the light of the first wavelength band and may output four electric signals with respect to the light of the second wavelength band. A parallax image signal between the left and right sides and the upper and lower sides may be generated based on the four electric signals with respect to each wavelength band.

As shown in FIG. 15B, the first to fourth lower electrodes 113a to 113d may be deviated in the diagonal direction of the pixel PX, for example, the x1y1 direction, the x1y2 direction, the x2y1 direction, and the x2y2 direction. The x1y1 direction, the x1y2 direction, the x2y1 direction, and the x2y2 direction may be perpendicular to each other.

The first to fourth storage nodes 115a to 115d may be arranged in the remaining space of the pixel PX, and may be deviated in the diagonal direction of the pixel PX, for example, the x1y1 direction, the x1y2 direction, the x2y1 direction, and the x2y2 direction.

The first to fourth lower electrodes 113a to 113d and the first to fourth storage nodes 115a to 115d may have square shapes, but are not limited thereto. For example, the shapes of the first to fourth lower electrodes 113a to 113d and the first to fourth storage nodes 115a to 115d may be variously modified.

Figure 16:
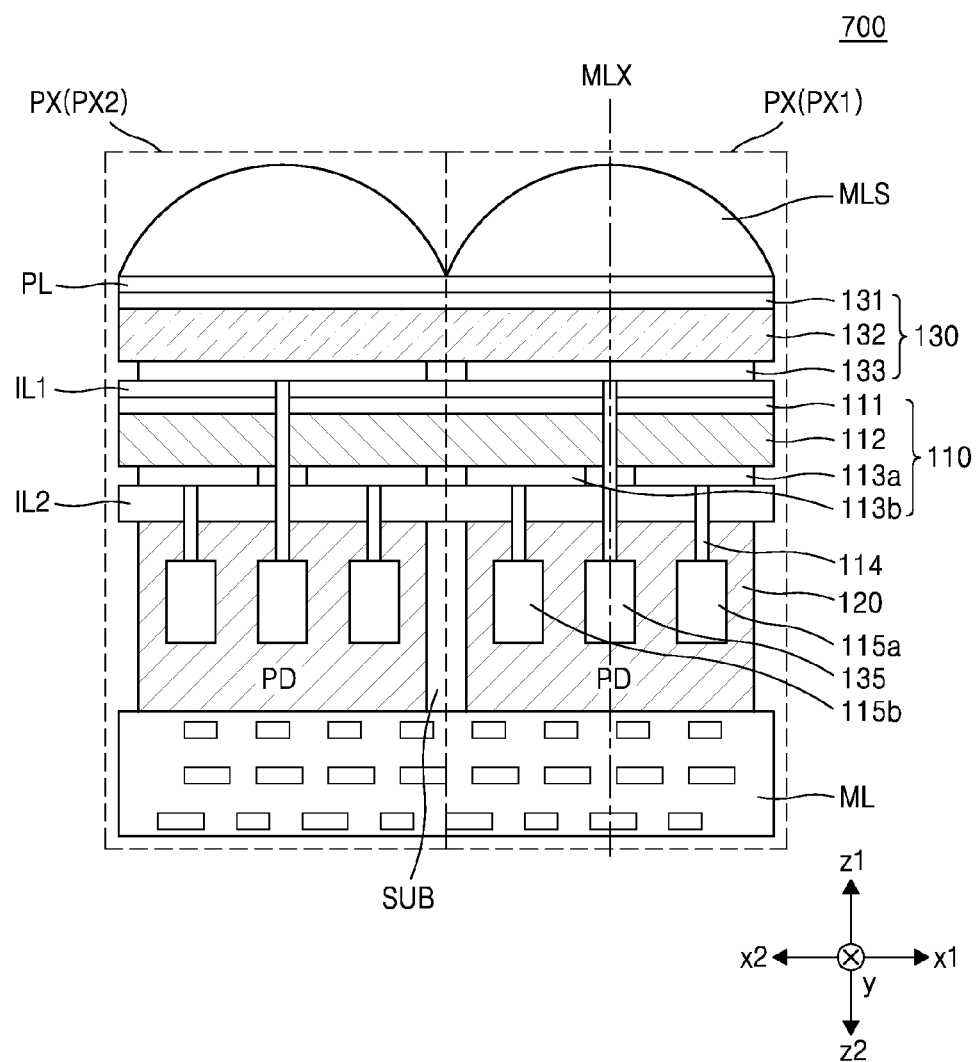
FIG. 16 is a vertical cross-sectional view of a pixel included in an image sensor according to example embodiments.

FIG. 16 is a vertical cross-sectional view of a pixel PX included in an image sensor 700 according to example embodiments.

Referring to FIG. 16, the image sensor 700 may include the plurality of pixels PX, and each of the plurality of pixels PX may include the micro lens MLS, the first photoelectric converter 110, the through wire 114, first to third storage nodes 115a, 115b, and 135, the second photoelectric converter 120, the third photoelectric converter 130, and the wiring layer ML. Each of the plurality of pixels PX may further include the planarization layer PL and insulating layers $IL_1$ and $IL_2$. Also, each of the plurality of pixels PX may further include the color filter (not shown).

The first photoelectric converter 110 may absorb light of the first wavelength band to convert the light into the electric signal, and the third photoelectric converter 130 may absorb light of the third wavelength band to convert the light into the electric signal. The second photoelectric converter 120 may absorb the remaining components of the incident light and convert the remaining components of the incident light to the electric signal.

As shown in FIG. 16, when the third photoelectric converter 130, the first photoelectric converter 110, and the second photoelectric converter 120 are sequentially stacked under the micro lens MLS, the second photoelectric converter 120 may absorb the incident light except for the light of the first and third wavelength bands through the micro lens MLS. For example, the second photoelectric converter 120 may convert the light of the second wavelength band into the electric signal. Here, in order to selectively absorb the light of the second wavelength band, the color filter (not shown) may be between the micro lens MLS and the second photoelectric converter 120.

According to example embodiments, the first photoelectric converter 110 and the third photoelectric converter 130 may include organic photodiodes. The first photoelectric converter 110 and the third photoelectric converter 130 may respectively include upper electrodes 111 and 131, color selection layers 112 and 132, and lower electrodes 113a and 113b, and 133. The electric signals output from the lower electrodes 113a, 113b of the first photoelectric converter 110 and the lower electrode 133 of the third photoelectric converter 130 may be stored in the storage nodes 115a, 115b, and 135 corresponding to the lower electrodes 113a, 113b, and 133 via the through wires 114.

In addition, the first photoelectric converter 110 may include the first lower electrode 113a and the second lower electrode 113b. The first lower electrode 113a and the second lower electrode 113b may be separated from each other based on the optical axis MLX. As described above, since the first photoelectric converter 110 includes the first lower electrode 113a and the second lower electrode 113b that are separated from each other, it may be considered that the first photoelectric converter 110 may include two photoelectric conversion devices outputting different electric signals from each other.

The electric signal output from the first lower electrode 113a may be stored in the first storage node 115a, and the electric signal output from the second lower electrode 113b may be stored in the second storage node 115b.

The first lower electrode 113a and the second lower electrode 113b may output the electric signals corresponding to the light incident from different directions based on the optical axis MLX. For example, the first lower electrode 113a may output the electric signal corresponding to the light incident from the x2 direction, for example, the left side of the first lower electrode 113a, and the second lower electrode 113b may output the electric signal corresponding to the light incident from the x1 direction, for example, the right side of the second lower electrode 113b.

A parallax image signal may be acquired based on the two electric signals output from the first lower electrode 113a and the second lower electrode 113b.

The pixel PX shown in FIG. 16 includes the first to third photoelectric converters 110, 120, and 130 that may photoelectrically convert the light of different wavelength bands, and thus, each pixel PX may output the electric signals corresponding to the light of at least three wavelength bands. Also, since the first photoelectric converter 110 includes the two lower electrodes 113a and 113b that are deviated, the first lower electrode 113a and the second lower electrode 113b may output two electric signals, and may generate the parallax image signal based on the two electric signals.

Figure 17:
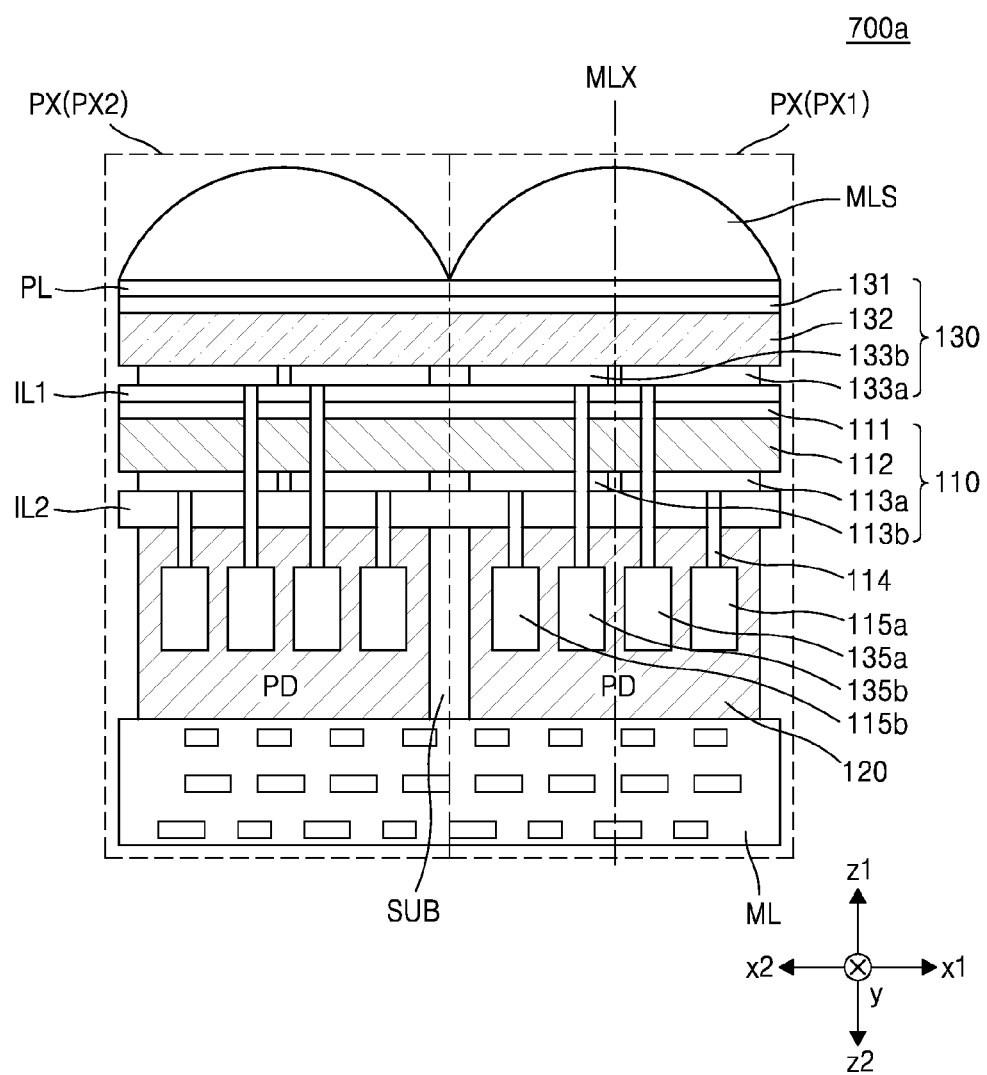
FIG. 17 is a vertical cross-sectional view of a pixel included in an image sensor according to example embodiments.

FIG. 17 is a vertical cross-sectional view of a pixel PX included in an image sensor 700a according to example embodiments.

Referring to FIG. 17, the image sensor 700a may include a plurality of pixels PX, and each of the plurality of pixels PX may include the micro lens MLS, the first photoelectric converter 110, the second photoelectric converter 120, the third photoelectric converter 130, the through wires 114, storage nodes 115a, 115b, 135a, and 135b, and the wiring layer ML. Each of the plurality of pixels PX may further include the planarization layer PL and insulating layers IL1 and IL2. Also, each of the plurality of pixels PX may further includes the color filter (not shown).

The pixel PX of FIG. 17 may have similar structures and operations to those of the pixel PX of FIG. 16. However, the third photoelectric converter 130 of the pixel PX in FIG. 17 may be different from the third photoelectric converter 130 of the pixel PX in FIG. 16.

As shown in FIG. 17, the third photoelectric converter 130 may include the upper electrode 131, the color selection layer 132, and the first lower electrode 133a and the second lower electrode 133b. The first lower electrode 113a and the second lower electrode 133b may be separated from each other based on the optical axis MLX. As described above, since the third photoelectric converter 130 include the first lower electrode 113a and the second lower electrode 133b that are separated from each other, it may be considered that the third photoelectric converter 130 includes two photoelectric conversion devices outputting two different electric signals.

Electric signals output from the first lower electrode 113a and the second lower electrode 133b of the third photoelectric converter 130 may be stored in storage nodes 135a and 135b that correspond respectively to the first electrodes 133a and the second lower electrode 133b.

The first lower electrode 113a and the second lower electrode 133b may output electric signals corresponding to the light incident from different directions based on the optical axis MLX. For example, the first lower electrode 133a may output the electric signal corresponding to the light incident from the x2 direction, for example, the left side of the first lower electrode 133a, and the second lower electrode 133b may output the electric signal corresponding to the light incident from the x1 direction, for example, the right side of the second lower electrode 133b. The parallax image signal may be acquired based on the two electric signals output from the first lower electrode 133a and the second lower electrode 133b.

Also, since the first photoelectric converter 110 includes the first and second lower electrodes 113a and 113b that are deviated from each other, the two electric signals output from the first lower electrodes 113a and 133a included in the first photoelectric converter 110 and the third photoelectric converter 130, respectively, may be combined to form a first image signal (for example, a left eye image signal), and the two electric signals output from the second lower electrodes 113b and 133b included in the first photoelectric converter 110 and the third photoelectric converter 130, respectively, may be combined to form a second image signal (for example, a right eye image signal).

Figure 18:
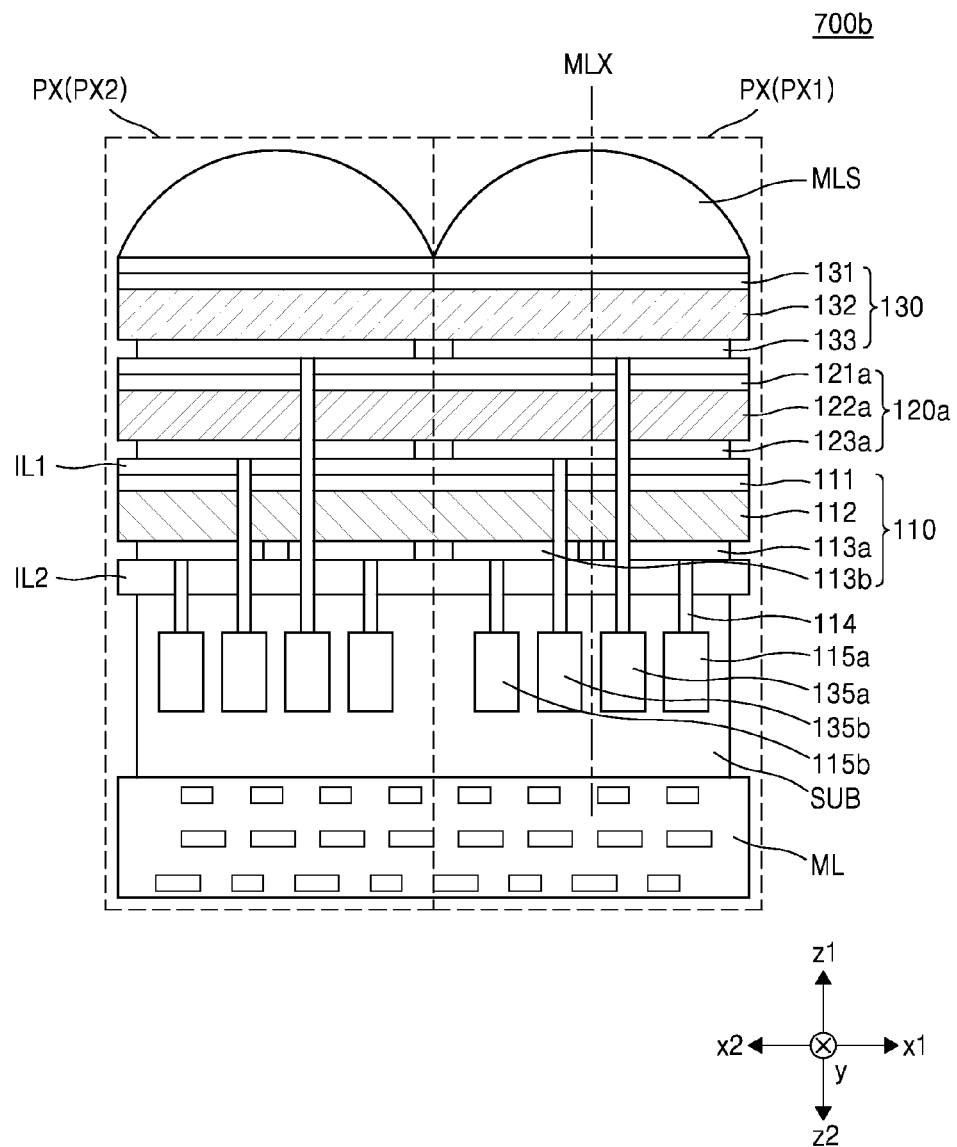
FIG. 18 is a vertical cross-sectional view of a pixel included in an image sensor according to example embodiments.

FIG. 18 is a vertical cross-sectional view of a pixel PX included in an image sensor 700b according to example embodiments.

Referring to FIG. 18, the image sensor 700b may include the plurality of pixels PX, and each of the plurality of pixels PX may include the micro lens MLS, the first photoelectric converter 110, a second photoelectric converter 120a, the third photoelectric converter 130, the through wires 114, storage nodes 115a, 115b, 135a, and 135b, and the wiring layer ML. Each of the plurality of pixels PX may further include the planarization layer PL and the insulating layers IL1 and IL2.

The first photoelectric converter 110 may absorb light of the first wavelength band and may convert the light into the electric signal, the second photoelectric converter 120a may absorb light of the second wavelength band and convert the light into the electric signal, and the third photoelectric converter 130 may absorb light of the third wavelength band and may convert the light into the electric signal.

The first to third photoelectric converters 110, 120a, and 130 may include organic photodiodes. The first to third photoelectric converters 110, 120a and 130 may respectively include upper electrodes 111, 121a, and 131, color selection layers 112, 122a, and 132, and lower electrodes 113a, 113b, 123a, and 133. Electric signals output from the lower electrodes 113a and 113b of the first photoelectric converter 110, the lower electrode 123a of the second photoelectric converter 120a and the lower electrode 133 of the third photoelectric converter 130 may be respectively stored in the storage nodes 115a, 115b, 135a, and 135b corresponding to the lower electrodes 113a, 113b, 123a and 133 via the through wires 114. The storage nodes 115a, 115b, 135a, and 135b may be in the semiconductor substrate SUB.

In addition, the first photoelectric converter 110 may include the first lower electrode 113a and the second lower electrode 113b. The first lower electrode 113a and the second lower electrode 113b may be separated from each other based on the optical axis MLX.

The first lower electrode 113a and the second lower electrode 113b may output electric signals corresponding to the light incident from different directions based on the optical axis MLX. A parallax image signal may be acquired based on the two electric signals output from the first lower electrode 113a and the second lower electrode 113b.

The pixel PX of FIG. 18 may include the first to third photoelectric converters 110, 120a, and 130 that photoelectrically convert the light of different wavelength bands, and thus, one pixel PX may output electric signals corresponding to the optical signals of at least three wavelength bands. Also, since the first photoelectric converter 110 includes the two lower electrodes 113a and 113b that are deviated and the first lower electrode 113a and the second lower electrode 113b output two electric signals, the parallax image signal may be generated based on the two electric signals.

The image sensor and the pixel included in the image sensor according to one or more example embodiments are described above with reference to FIGS. 3 to 18. However, the technical scope of the present specification is not limited to the above-described example embodiments, but one or more example embodiments may be variously modified.

Figure 19A:
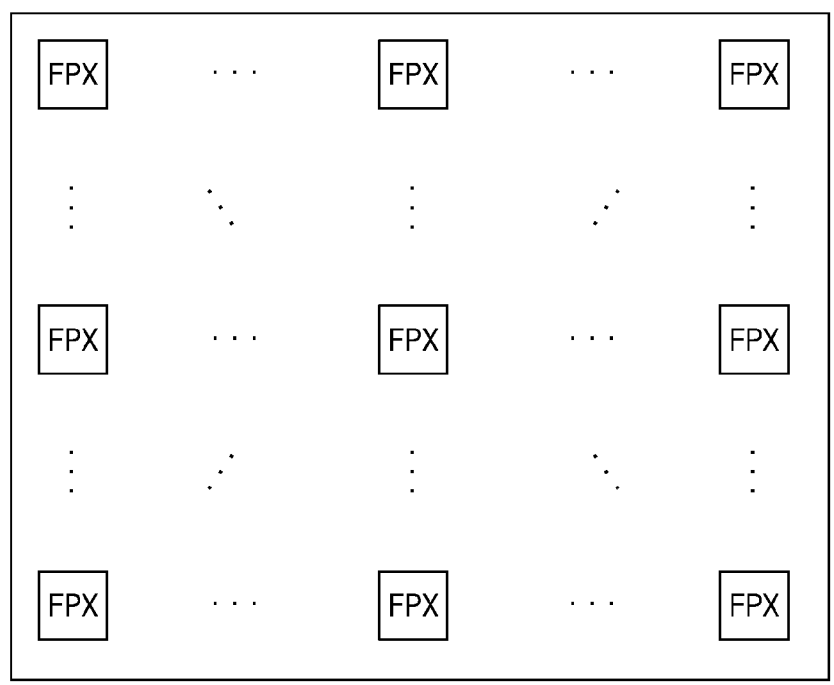
FIGS. 19A and 19B are diagrams showing examples of a focusing pixel in a pixel array according to example embodiments.
Figure 19A:
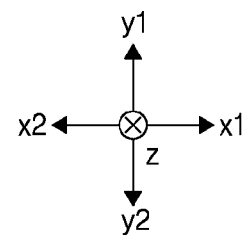
Figure 19B:
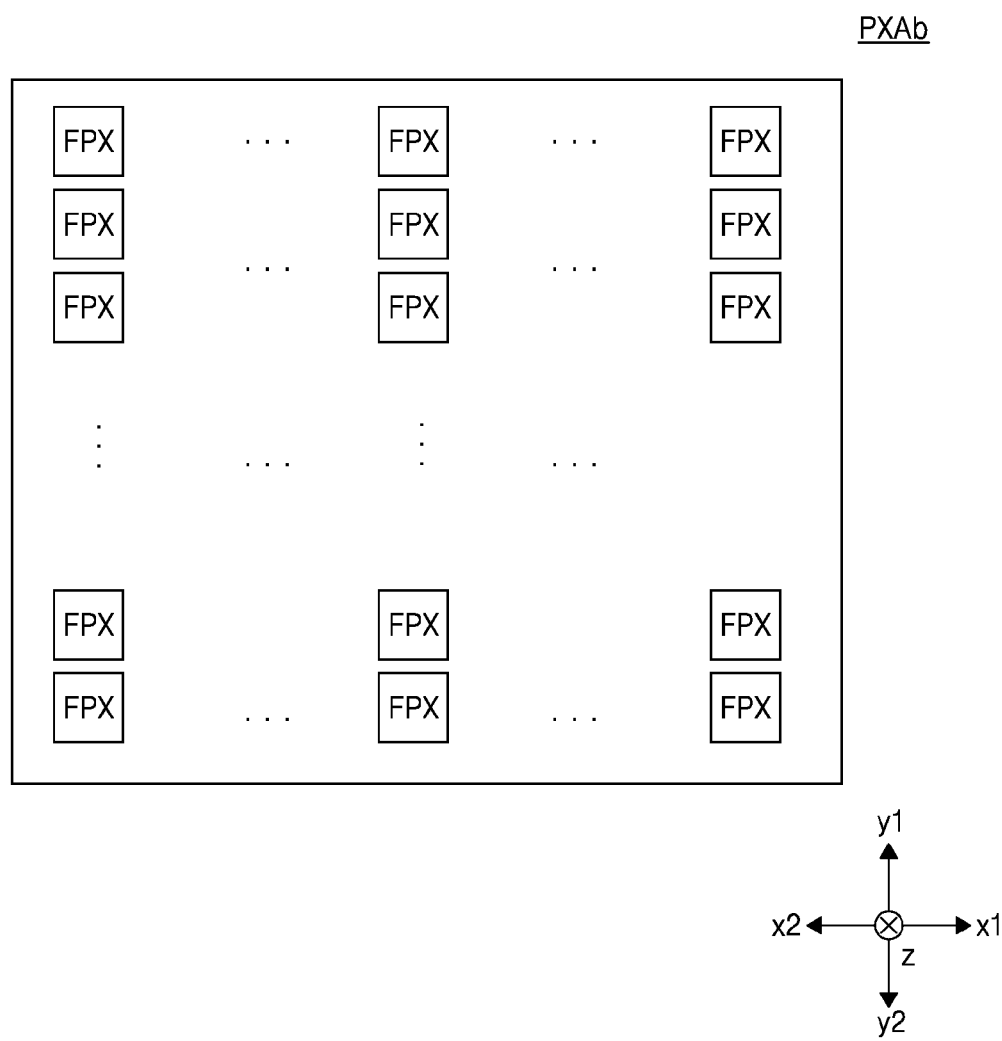

FIGS. 19A and 19B are diagrams of focusing pixels FPX in pixel arrays PXAa, PXAb, according to example embodiments.

The pixel, according to example embodiments described above with reference to FIGS. 1 to 18, outputting a phase-difference image signal, may be referred to as a focusing pixel. In one or more example embodiments, the focusing pixels FPX may be entirely arranged in a pixel array, but are not limited thereto.

Referring to FIGS. 19A and 19B, the focusing pixels FPX may be disposed on at least one point in the pixel array PXAa.

For example, at least one focusing pixel FPX may be on a center portion or a peripheral portion of the pixel array PXAa. General pixels GPX may be arranged on the remaining region, except for the point where the focusing pixel FPX is disposed. In one or more example embodiments, the general pixels GPX may have multi-layered structures, in which central axis of the photoelectric converter may coincide with the optical axis.

Referring to FIG. 19B, at least one focusing pixel FPX may be arranged in a row direction of a pixel array PXAb, for example, x1-x2 direction, or a column direction of a pixel array PXAb, for example, y1-y2 direction.

FIGS. 20A to 20E are diagrams showing examples of arranging a plurality of focusing pixels FPX.

Figure 20A:
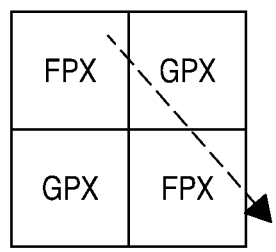
FIGS. 20A to 20E are diagrams showing examples of arranging a plurality of focusing pixels.
Figure 20B:
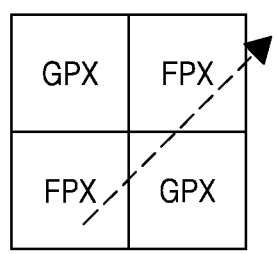
Figure 20C:
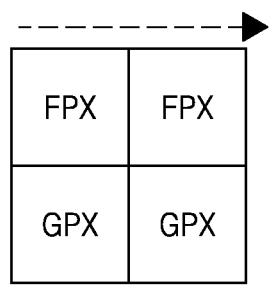
Figure 20D:
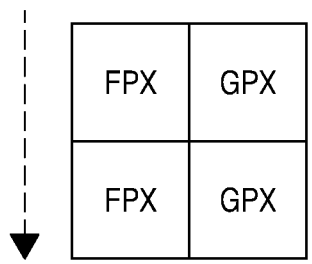
Figure 20E:
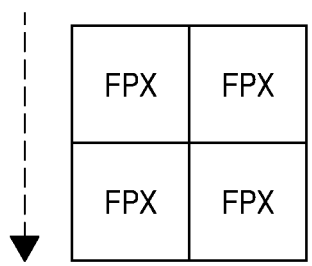

FPX denotes a focusing pixel, and GPX denotes a general pixel. As shown in FIGS. 20A and 20B, the focusing pixels FPX may be arranged in a diagonal direction. Also, as shown in FIGS. 20C and 20D, the focusing pixels FPX may be arranged in the row direction or the column direction. Also, as shown in FIG. 20E, the plurality of focusing pixels FPX may be arranged as a matrix.

The focusing pixels FPX may be arranged on at least one point of the pixel array PXAa or PXAb, as shown in FIGS. 19A and 19B.

Figure 21:
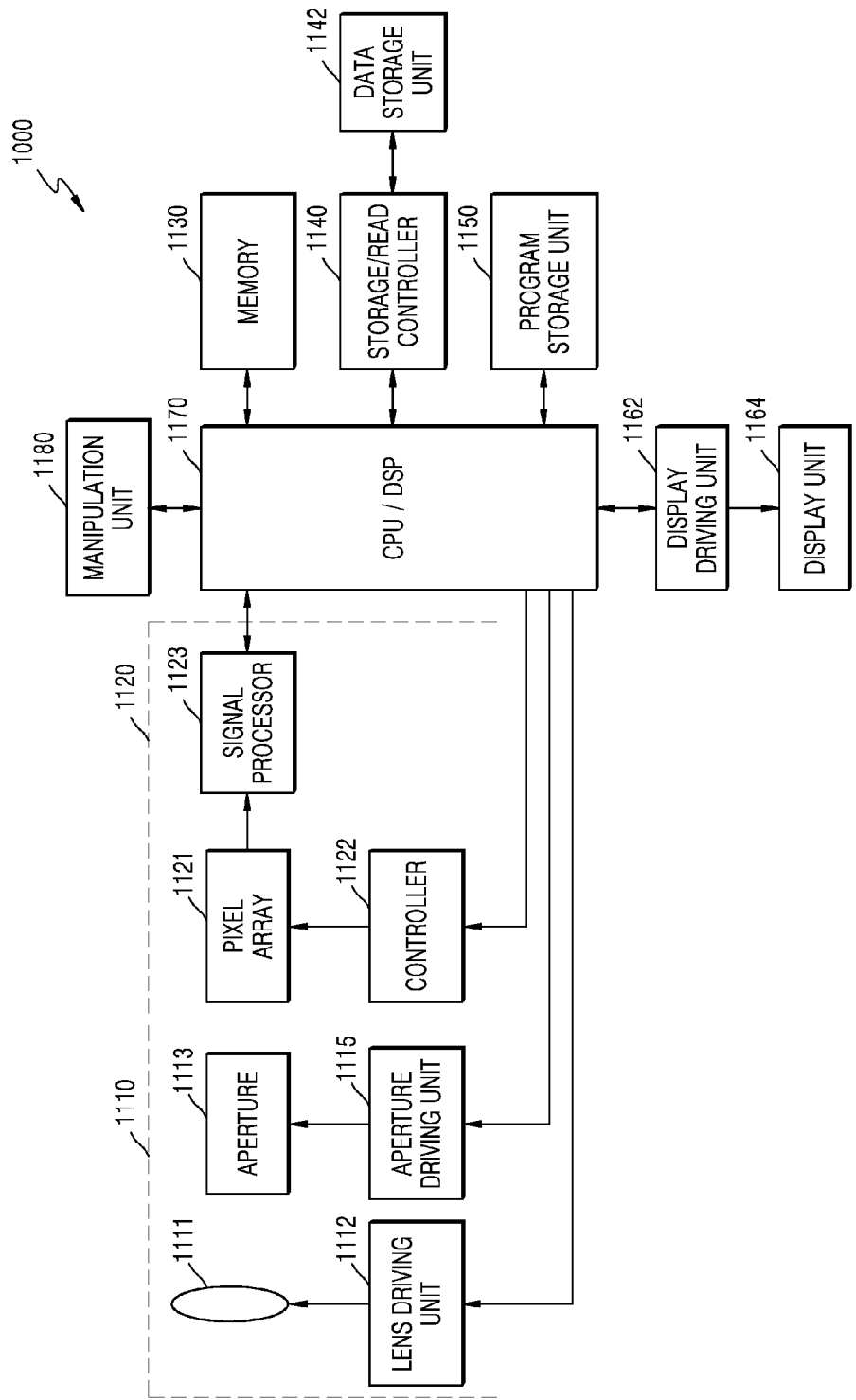
FIG. 21 is a block diagram of a digital imaging device according to example embodiments.

FIG. 21 is a block diagram of a digital imaging apparatus 1000 according to example embodiments.

The digital imaging apparatus 1000 according to the example embodiments may include an imaging unit 1110, an image sensor 1120, a memory 1130, a storage/read controller 1140, a data storage unit 1142, a program storage unit 1150, a display driving unit 1162, a display unit 1164, a CPU/DSP 1170, and a manipulation unit 1180.

Overall operations of the digital imaging apparatus 1000 are controlled by the CPU/DSP 1170. The CPU/DSP 1170 may provide a lens driving unit 1112, an aperture driving unit 1115, and a controller 1122 with control signals for operating each device.

The CPU/DSP 1170, a signal processor 1123, the controller 1122 and the storage/read controller 1140 may include a processor and a memory (not shown).

The memory may be a non-volatile memory device, for example, a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

The memory may contain computer readable code that, when executed by the processor, configures the processor as a special purpose computer. For example, the code may configure the CPU/DSP 1170 as a special purpose computer to control the lens driving unit 1112, the aperture driving unit 1115, and the controller 1122.

The memory 1130, the data storage unit 1142 and the program storage unit 1150 may be a volatile memory device, for example, a static random access memory (SRAM), a dynamic random access memory (DRAM), etc.

The imaging unit 1110 is a device for receiving light, and may include a lens 1111, a lens driving unit 1112, an aperture 113, and the aperture driving unit 1115.

The lens 1111 may include a plurality of lenses. Location of the lens 1111 is adjusted by the lens driving unit 1112. For example, the lens driving unit 1112 may adjust the location of the lens 1111 according to the control signal provided from the CPU/DSP 1170.

An opening degree of the aperture 1113 may be adjusted by the aperture driving unit 1115 to adjust an intensity of the light incident to an imaging device 1118.

The image sensor 1120 may convert incident light into an image signal. The image sensor 1120 may include a pixel array 1121, the controller 1122, and the signal processor 1123.

An optical signal that has passed through the lens 1111 and the aperture 1113 focuses an image of a subject on a light receiving surface of the pixel array 1121. The pixel array 1121 may be a complementary metal oxide semiconductor image sensor (CIS) that converts the optical signal into the electric signal. The sensitivity of the pixel array 1121 may be adjusted by the controller 1122. The controller 1122 may control the pixel array 1121 according to a control signal automatically generated by an image signal that is input in real-time or a control signal input manually by a user.

An exposure time of the pixel array 1121 may be adjusted by a shutter (not shown). The shutter (not shown) may be a mechanical shutter that adjusts the incidence of light by moving a cover or an electronic shutter controlling the exposure by supplying an electric signal to the pixel array 1121.

The signal processor 1123 may perform treatments such as noise reduction, gain adjustment, waveform shaping, and analog-digital conversion with respect to an analog signal supplied from the pixel array 1121. The signal processor 1123 may perform a signal treatment for performing the phase-difference AF.

The signal processed by the signal processor 1123 may be input to the CPU/DSP 1170 after passing or without passing through the memory 1130. Here, the memory 1130 operates as a main memory of the digital imaging apparatus 1000, and temporarily stores information required during the operation of the CPU/DSP 1170. The program storage unit 1130 may store programs such as an operating system or an application system for driving the digital imaging apparatus 1000.

Moreover, the digital imaging apparatus 1000 may include the display unit 1164 for displaying an operating status thereof or image information captured by the digital imaging apparatus 1000. The display unit 1164 may provide the user with visual information and/or audible information. The display unit 1164 may be formed of, for example, a liquid crystal display (LCD) panel or an organic light-emitting diode (OLED) in order to provide the visual information. Also, the display unit 1164 may be a touch screen that may recognize a touch input.

The display driving unit 1162 may provide the display unit 1164 with a driving signal.

The CPU/DSP 1170 may process an input imaging signal, and controls the devices according to the imaging signal or an external input signal. The CPU/DSP 1170 may reduce noise in the input imaging signal, and may perform an image signal process such as Gamma correction, color filter array interpolation, color matrix, color correction, or color enhancement for improving image quality. Also, image data generated by performing the image signal process for improving the image quality may be compressed to generate an image file, or the image data may be restored from the image file. A compression format of the image may be reversible format or irreversible format. For example, a still image may be converted into Joint Photographic Experts Group (JPEG) format or JPEG2000 format. Otherwise, in a case of a video, a plurality of frames may be compressed according to moving picture experts group (MPEG) standards to generate a video file. The video file may be generated according to, for example, an exchangeable image file format (Exif) format.

The image data output from the CPU/DSP 1170 is input into the storage/read controller 1140 directly or via the memory 1130, and the storage/read controller 1140 may store the image data in the data storage unit 1142 according to a signal input from the user or automatically. Also, the storage/read controller 1140 may read data of the image from the image file stored in the data storage unit 1142, and may input the data into the display driving unit via the memory 1130 or another passage to make the display unit 1164 display the image. The data storage unit 1142 may be detachable, or may be permanently mounted in the digital imaging apparatus 1000.

Also, the CPU/DSP 1170 may perform processes such as an indistinct process, a color process, a blurring process, an edge emphasis process, an image interpretation process, an image recognition process, or an image effect process. The image recognition process may include face recognition or scene recognition. Moreover, the CPU/DSP 1170 may process an image signal for displaying a display image on the display unit 164. For example, the CPU/DSP 1170 may perform brightness level control, color adjustment, contrast adjustment, sharpen adjustment, screen division, generation of a character image, or image combination. The CPU/DSP 1170 may be connected to an external monitor, and may perform a set (or, alternatively predetermined) image signal process so as to display images on the external monitor. The CPU/DSP 1170 may transmit the image data to the external monitor to display the image on the external monitor.

Also, the CPU/DSP 1170 may execute a program stored in the program storage unit 1150 or include an additional module to generate a control signal for controlling auto-focusing function AF, zoom adjustment, focusing adjustment, or automatic exposure adjustment, and may provide the control signal to the aperture driving unit 1115, the lens driving unit 1112, and the controller 1122. In addition, the CPU/DSP 1170 may control overall operations of the devices such as the shutter or a flash included in the digital imaging apparatus 1000.

The manipulation unit 1180 is a unit through which the user may input a control signal. The manipulation unit 1180 may include a shutter-release button for exposing the pixel array 1121 to light for a set (or, alternatively predetermined) time period to capture image, a power button for inputting a control signal controlling turning on/off of the power, a zoom button for increasing or reducing a viewing angle according to the input, a mode selection button, and other imaging set value adjustment buttons. The manipulation unit 1180 may be formed as any type provided that the user may input the control signal therethrough, for example, a button, a keyboard, a touch pad, a touchscreen, or a remote controller.

Figure 22:
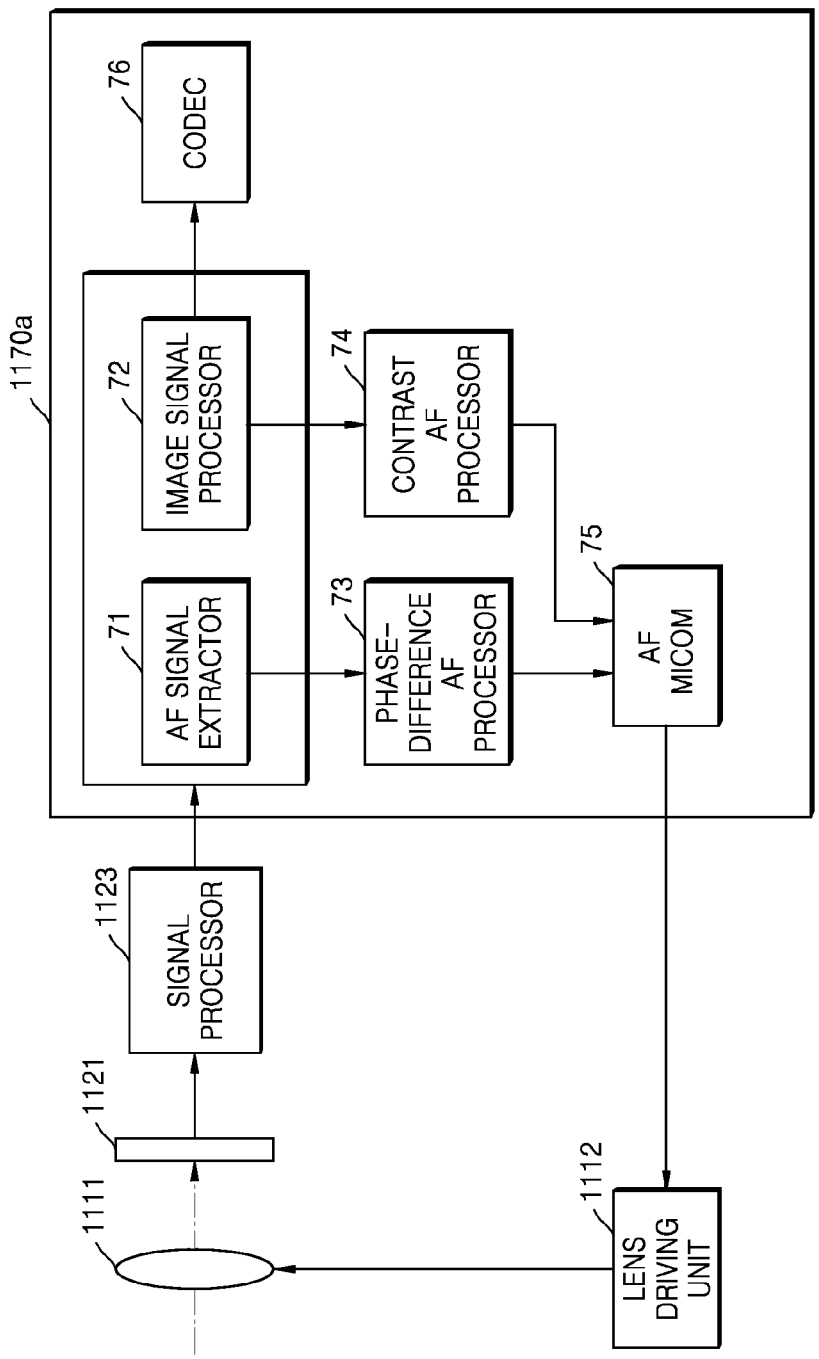
FIG. 22 is a diagram of a CPU/DSP and some elements in the digital imaging device according to example embodiments.

FIG. 22 is a block diagram of a CPU/DSP 1170a with some additional elements of the digital imaging apparatus 1000 according to example embodiments.

The CPU/DSP 1170a may include an AF signal extractor 71, an imaging signal processor 72, a phase-difference AF processor 73, an AF micom 75, and a codec 76. The CPU/DSP 1170a may further include a contrast AF processor 74. The pixel array 1121 may include the pixel structures and arrangements described above with reference to FIGS. 1 to 20E.

One or more of the imaging signal processor 72, the phase-difference AF processor 73, the codec 76 and the contrast AF processor 74 may include a processor and a memory (not shown).

The memory may contain computer readable code that, when executed by the processor, configures the processor as a special purpose computer. For example, the code may configure the imaging signal processor 72 as a special purpose computer to perform image processing on the imaging signal output from the pixel array 1121.

The AF signal extractor 71 may extract a phase-difference detecting signal from pixels arranged in the pixel array 1121, for example, the focusing pixels. The AF signal extractor 71 may extract a first phase-difference detecting signal and a second phase-difference detecting signal from at least one pixel. For example, intensities of the first phase-difference detecting signal and the second phase-difference detecting signal may be detected according to locations of the pixel in the row direction or the column direction. According to example embodiments, if a signal-to-noise ratio of the first phase-difference detecting signal or the second phase-difference detecting signal is low, first phase-difference detecting signals of the pixels in a few columns included in the same row are integrated and acquired according to the pixel location in the row direction, and second phase-difference detecting signals of the pixels of a few rows included in the same column are integrated and acquired according to the pixel location in the row direction.

The imaging signal processor 72 extracts the imaging signal from the pixel array 1121, and performs signal treatments of the imaging signal. The imaging signal processor 72 may receive the imaging signal output from the pixel array 1121 and has undergone the noise removal, signal amplitude adjustment, and analog-digital conversion processes by the signal processor 1123, and may perform processes such as interpolation, white balance process, gamma process, sharpen process, and the noise removal process. According to example embodiments, the image processing may be performed by the signal processor 1123. In addition, the imaging signal processor 72 may perform a color coordinate conversion process with respect to a signal of an RGB format output from the pixel array 1121, for example, the imaging signal processor 72 may convert an RGB signal into a YCC signal.

The phase-difference AF processor 73 may perform the phase-difference AF using the first and second phase-difference detecting signals. The phase-difference AF processor 73 may perform the phase-difference AF according to the method described above with reference to FIGS. 2A to 2C.

In one or more example embodiments, the phase-difference AF processor 73 may calculate a correlation value between the first and second phase-difference detecting signals in order to determine the in-focus state. For example, the correlation value between the first and second phase-difference detecting signals may be calculated according to the pixel location, and then, when the correlation value is equal to or greater than a critical value at a center portion of the pixel array, it is determined that the center portion is in the in-focus state. Otherwise, it may be determined that AF may not be performed.

The contrast AF processor 74 may perform the AF based on a contrast value using the imaging signal processed by the imaging signal processor 72. The contrast AF processor 74 may extract a radio frequency component corresponding to a contrast component of the imaging signal by using a band pass filter. Also, a set (or, alternatively predetermined) process such as an integration process may be performed with respect to the extracted contrast component. For example, the contrast component may be integrated according to time laps. The contrast AF processor 74 may drive the lens 1111 so that the contrast component is to be the highest.

For example, the contrast AF processor 74 may perform the contrast AF by using Y component, that is, a brightness component, from the imaging signal that is converted into the YCC signal.

The AF micom 75 may generate a lens driving control signal by using a phase-difference AF result value calculated by the phase-difference AF processor 73 and the contrast AF result value calculated by the contrast AF processor 74, and may output the lens driving control signal to the lens driving unit 1112.

Although FIG. 22 shows that the phase-difference AF and the contrast AF are performed together, but one or more example embodiments are not limited thereto. For example, the AF may be performed only using the phase-difference AF result performed in the phase-difference AF processor 73.

Figure 23:
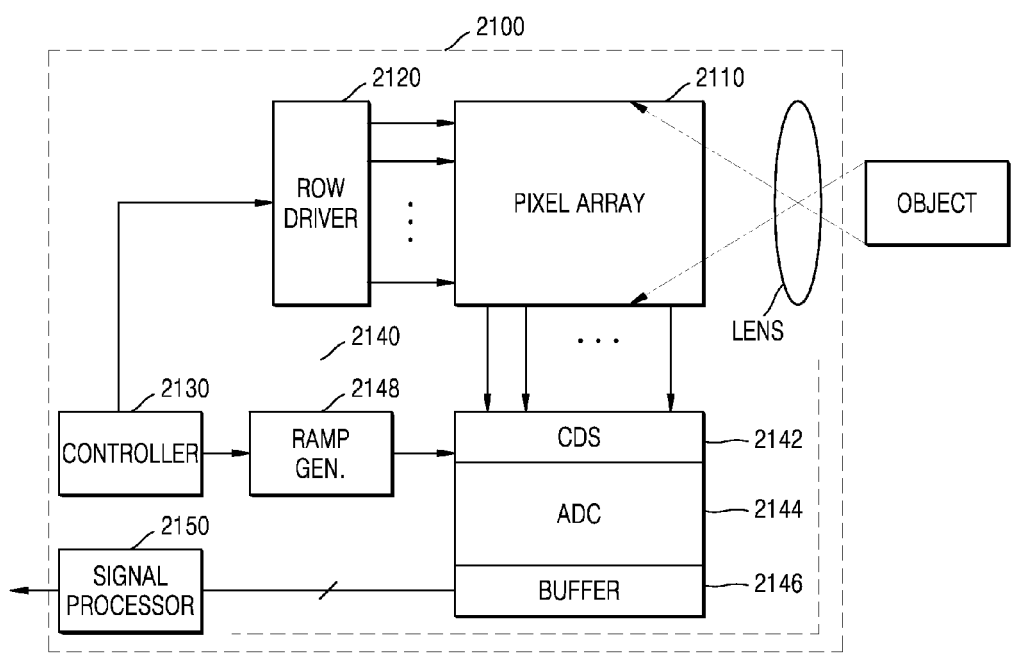
FIG. 23 is a block diagram of an image sensor according to example embodiments.

FIG. 23 is a block diagram of an image sensor 2100 according to example embodiments.

As shown in FIG. 23, the image sensor 2100 may include a pixel array 2110, a controller 2130, a row driver 2120, a pixel signal reading unit 2140, and a signal processor 2150. The pixel array 2110 may include pixels described above according to the one or more example embodiments. The pixel may have a multi-layered structure including an organic photoelectric converter or an inorganic photoelectric converter, and moreover, may have a multi-layered structure only including the organic photoelectric converter. Thus, a unit pixel for outputting an image may be reduced in size, and a clear image may be output. Also, the pixel may output a phase-difference image signal for performing the phase-difference AF.

The pixel array 2110 may include a plurality of pixels that are arranged two-dimensionally, and each of the plurality of pixels may include a photosensitive device, for example, the organic photoelectric converter or the inorganic photoelectric converter. The photosensitive device may absorb light to generate electric charges, and an electric signal (output voltage) according to the generated electric charges may be provided to the pixel signal reading unit 2140. One of the pixels included in the pixel array 2110 may provide the output voltage at a time in a row unit, and accordingly, the pixels included in one row of the pixel array 2110 may be activated at the same time by a selection signal output from the row driver 2120. The pixels included in the selected row may provide output voltages according to the absorbed light to an output line of the column corresponding to the selected row.

One or more of the controller 2130, the signal processor 2150, a ramp generator 2148, a correlated double sampler (CDS) 2142 and an analog-digital converter (ADC) 2144 may include a processor and a memory (not shown).

The memory may contain computer readable code that, when executed by the processor, configures the processor as a special purpose computer. For example, the code may configure the signal processor 2150 as a special purpose computer to perform image processing on the pixel data from a buffer 2146.

The buffer 2146 may be a volatile memory device, for example, a static random access memory (SRAM), a dynamic random access memory (DRAM), etc.

The controller 2130 may control the row driver 2120 so that the pixel array 2110 may absorb the light and accumulate electric charges, temporarily store the accumulated electric charges, or output the electric signal according to the stored electric charges to outside of the pixel array 2110. Also, the controller 2130 may control the pixel signal reading unit 2140 to measure the output voltage provided from the pixel array 2110.

The pixel signal reading unit 2140 may include the correlated double sampler (CDS) 2142, the analog-digital converter (ADC) 2144, and the buffer 2146. The CDS 2142 may sample and hold the output voltage provided from the pixel array 2110. The CDS 2142 may perform double sampling of a certain noise level and a level according to the generated output voltage, and may output a level corresponding to a difference between the above two levels. Also, the CDS 2142 may receive a ramp signal generated by the ramp signal generator 2148 to compare the ramp signal with the output voltage from the pixel array 2110 and may output a comparison result.

The ADC 2144 may convert an analog signal corresponding to the level transmitted from the CDS 2142 into a digital signal. The buffer 2146 may latch the digital signal, and the latched digital signal may be sequentially output to the signal processor 2150 or an outside of the image sensor 2100.

The signal processor 2150 may perform an interpolation process with respect to the pixel data transmitted thereto. The signal processor 2150 may perform processes such as noise reduction, gain adjustment, waveform shaping, interpolation, white balance process, gamma process, and/or sharpening. The signal processor 2150 may perform a signal process for performing the phase-difference AF. The signal processor 2150 may be included in the image sensor 2100, but is not limited thereto.

For example, in one or more example embodiments, the signal processor 2150 may be included in a processor located out of the image sensor 2100.

Figure 24:
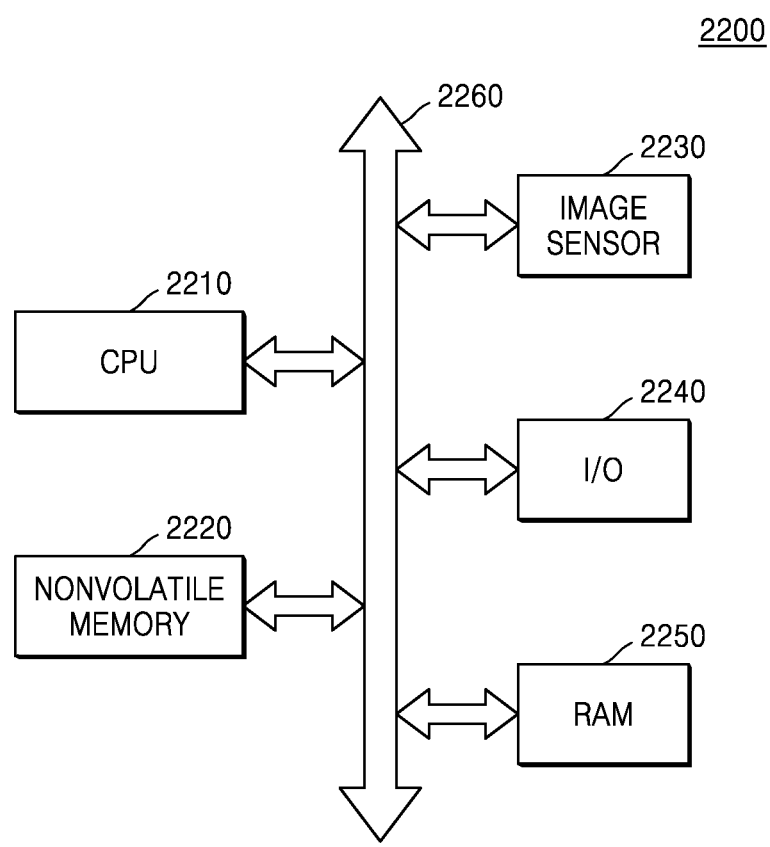
FIG. 24 is a block diagram of a system including an image sensor according to example embodiments.

FIG. 24 is a block diagram of a system 2200 according to example embodiments. The system 2200 may be one of a computing system, a camera system, a scanner, a car navigation system, a video phone, a security system, or a motion detection system requiring image data.

Referring to FIG. 24, the system 2200 may include a CPU (or processor) 2210, a non-volatile memory 2220, an image sensor 2230, an input/output device 2240, and a random access memory (RAM) 2250. The CPU 2210 may communicate with the non-volatile memory 2220, the image sensor 2230, the input/output device 2240, and the RAM 2250 via a bus 2260. The image sensor 2230 may be formed as an independent semiconductor chip, or may be integrated with the CPU 2210 as one semiconductor chip. The image sensor 2230 may include the pixels described above according to one or more example embodiments.

Figure 25:
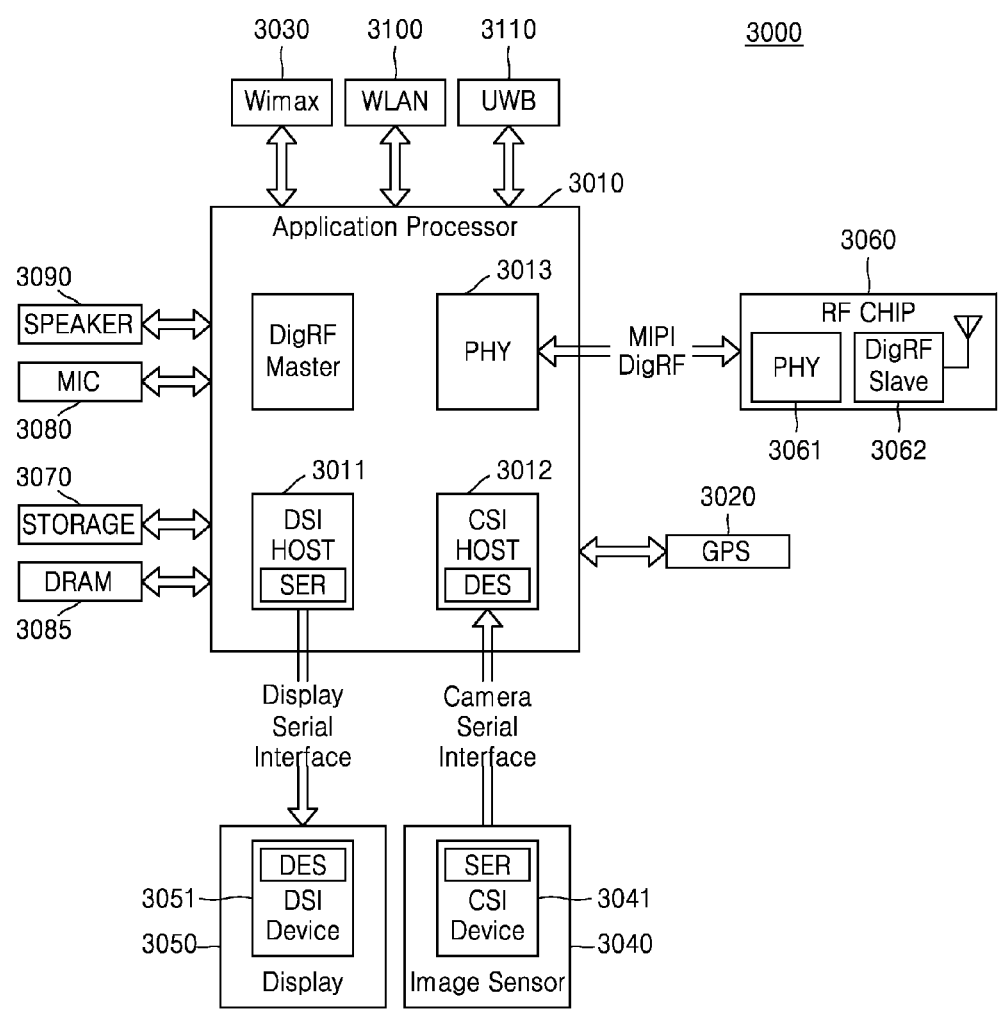
FIG. 25 is a diagram of an electronic system including an image sensor and an interface according to example embodiments.

FIG. 25 is a diagram of an electronic system 3000 including an image sensor 3040 and an interface according to example embodiments.

Referring to FIG. 25, the electronic system 3000 may be formed as a data processing apparatus capable of using or supporting mobile industry processor interface (MIPI), for example, a mobile phone, a personal digital assistant (PDA), a portable media player (PMP), and/or a smartphone. The electronic system 3000 may include an application processor 3010, the image sensor 3040, and a display 3050.

A camera serial interface (CSI) host 3012 in the application processor 3010 may serially communicate with a CSI device 3041 of the image sensor 3040 via a CSI. Here, for example, the CSI host 3012 may include an optical deserializer and the CSI device 3041 may include an optical serializer.

A display serial interface (DSI) host 3011 in the application processor 3010 may serially communicate with a DSI device 3051 of the display 3050 via a DSI. For example, the DSI host 3011 may include an optical serializer and the DSI device 3051 may include an optical deserializer.

The electronic system 3000 may include a radio frequency (RF) chip 3060 that may communicate with the application processor 3010. A physical layer (PHY) 3013 of the electronic system 3000 and a PHY 3061 of the RF chip 3060 may exchange data according to MIPI DigRF.

The electronic system 3000 may further include a global positioning system (GPS) 3020, a storage 3070, a microphone 3080, a dynamic random access memory (DRAM) 3085, and a speaker 3090. In addition, the electronic system 3000 may perform communication by using a Wimax 3030, a wireless local area network (WLAN) 3100, and an ultra wideband (UWB) 3110.

Figure 26:
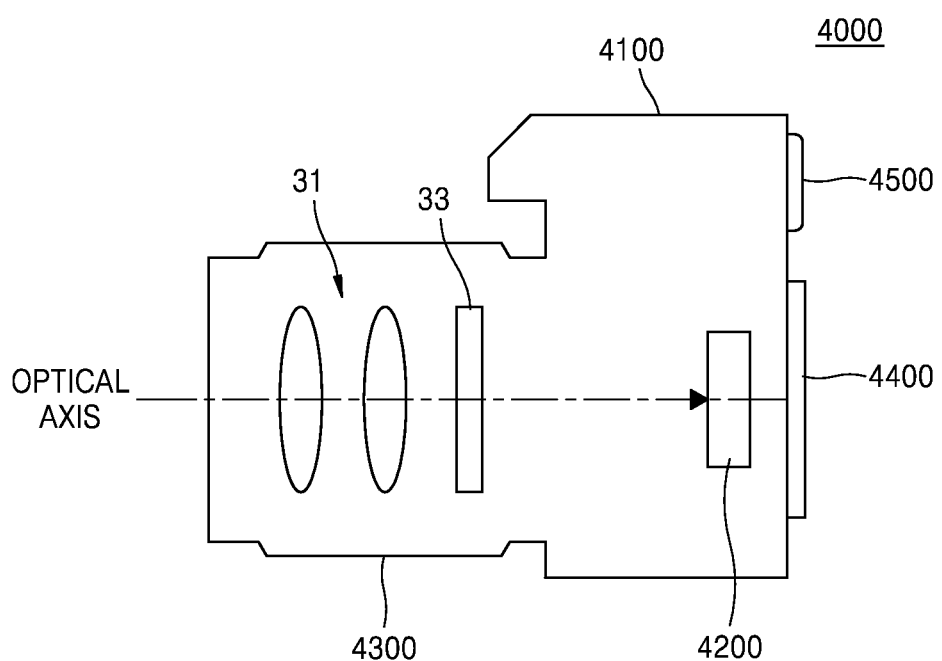
FIG. 26 is a longitudinal cross-sectional view of an imaging apparatus according to example embodiments.

FIG. 26 is a longitudinal cross-sectional view of an imaging apparatus according to example embodiments.

Referring to FIG. 26, a camera 4000 may include a body 4100, an image sensor 4200, a lens unit 4300, a display 4400, and a viewfinder 4500.

The lens unit 4300 performs as an imaging optical system that may collect light from a subject and may guide the light into the image sensor 4200 in the body 4100. The lens unit 4300 may include a lens group 31 including a plurality of lenses. The lens group 31 may include a focusing lens for adjusting focus and a zoom lens for performing a zooming operation. The focusing lens and the zoom lens may be driven in an optical axis direction to perform the zooming and focusing operations.

The image sensor 4200 may be perpendicular to the optical axis. The image sensor 4200 may be a CMOS image sensor in which a plurality of pixels is arranged two-dimensionally in a matrix. The image sensor 4200 may generate electric signals with respect to set (or, alternatively predetermined) wavelength components, for example, red, blue, and green wavelength band components, in the light of the subject received through the lens unit 4300, and may output the generated electric signals as image signals. The image sensor 4200 may include the plurality of pixels according to one or more example embodiments. The image sensor 4200 may generate a phase-difference signal for performing the phase-difference AF. The lenses in the lens unit 4300 may be driven in the optical axis direction based on the generated phase-difference signal, and accordingly, the AF may be performed.

The viewfinder 4500 and the display 4400 may display an image of photographing the subject. The viewfinder 4500 may include an eyepiece (not shown). Also, the viewfinder 4500 may include a display panel that may display images. The user may recognize the subject that is photographed through the viewfinder 4500 or the display 4400.

While the example embodiments of the inventive concepts have been particularly shown and described with reference to some example embodiments thereof, it will be understood that various changes in form and details may be made therein without departing from the spirit and scope of the following claims.

What is claimed is:

1. An image sensor of a multi-layered sensor structure, the image sensor comprising:
 a plurality of sensing pixels, each of the plurality of sensing pixels including,
  a micro lens configured to collect light, the micro lens having an optical axis associated therewith, a first photoelectric converter configured to convert the light of a first wavelength band into an electrical signal, and
a second photoelectric converter on a substrate, the second photoelectric converter configured to convert the light of one or more remaining wavelength bands outside the first wavelength band into the electrical signal, the second photoelectric converter having a central axis associated therewith such that the central axis of the second photoelectric converter associated with a first sensing pixel of the plurality of sensing pixels is spaced apart from the optical axis of the micro lens in a different direction from the central axis of the second photoelectric converter associated with a second sensing pixel of the plurality of sensing pixels.

2. The image sensor of claim 1, wherein the first photoelectric converter includes an organic photodiode.

3. The image sensor of claim 1, wherein the second photoelectric converter includes a silicon photodiode or a semiconductor compound photodiode.

4. The image sensor of claim 1, further comprising:
a color filter configured to selectively transmit the light based on a wavelength of the light.

5. The image sensor of claim 1, wherein,
the central axis of the second photoelectric converter in the first sensing pixel is spaced apart from the optical axis in a first direction, and
the central axis of the second photoelectric converter in the second sensing pixel is spaced apart from the optical axis in a second direction, the second direction being a different direction from the first direction.

6. The image sensor of claim 5, wherein the first direction and the second direction are opposite to each other.

7. The image sensor of claim 5, wherein
the first sensing pixel is configured to output a first electrical signal corresponding to the light of the first wavelength band and a second electrical signal corresponding to the light of a second wavelength band, and
the second sensing pixel is configured to output the first electrical signal corresponding to the light of the first wavelength band and a third electrical signal corresponding to the light of a third wavelength band.

8. The image sensor of claim 5, further comprising:
a focus detector configured to perform a focus detecting operation based on a phase-difference between binocular parallax image signals output from the first sensing pixel and the second sensing pixel.

9. The image sensor of claim 1, further comprising:
a storage node spaced apart from the second photoelectric converter on the substrate, the storage node configured to store the electrical signal from the first photoelectric converter.

10. The image sensor of claim 9, wherein a central axis of the storage node is spaced apart from the optical axis in a direction opposite to a direction in which the second photoelectric converter is spaced apart from the optical axis.

11. The image sensor of claim 1, wherein the plurality of sensing pixels comprises:
a third sensing pixel, and a fourth sensing pixel, each of the first to fourth sensing pixels including the second photoelectric converter therein such that the central axis of the second photoelectric converter is spaced apart from the optical axis in different directions in each of the first to fourth sensing pixels.

12. The image sensor of claim 11, wherein the different directions are perpendicular to each other.

13. The image sensor of claim 1, further comprising:
a wiring layer connected to the plurality of sensing pixels, wherein,
the first photoelectric converter, the second photoelectric converter, and the wiring layer are sequentially stacked under the micro lens.

14. The image sensor of claim 1, further comprising:
a third photoelectric converter configured to convert the light of a third wavelength band into the electrical signal.

15. The image sensor of claim 1, wherein the image sensor is a semiconductor chip.

16. An imaging apparatus comprising:
a lens configured to collect light reflected from a subject; and
an image sensor of a multi-layered sensor structure, the image sensor including a pixel array having a plurality of pixels, at least two of the plurality of pixels being focusing pixels, the focusing pixels include a first focusing pixel and a second focusing pixel each including,
a micro lens, the micro lens having an optical axis associated therewith,
a first photoelectric converter configured to convert light of a first wavelength band into an electrical signal, and
a second photoelectric converter including a first photoelectric conversion device spaced apart from an optical axis of the micro lens, the second photoelectric converter configured to convert light of a second wavelength band into the electrical signal, the second photoelectric converter having a central axis associated therewith such that the central axis of the second photoelectric converter associated with the first focusing pixel is spaced apart from the optical axis of the micro lens in a different direction from the central axis of the second photoelectric converter associated with the second focusing pixel.

17. An image sensor having a multi-layered structure, the image sensor comprising:
a plurality of sensing pixels, the plurality of sensing pixels including,
a micro lens configured to collect incident light, the micro lens having an optical axis associated therewith, and
a plurality of photoelectric converters sequentially stacked under the micro lens, the plurality of photoelectric converters configured to selectively convert different wavelength bands of the incident light into different electrical signals, and at least one of the plurality of photoelectric converters having one or more photoelectric conversion devices formed in a substrate, the one or more photoelectric conversion devices being spaced apart based on an optical axis of the micro lens such that a central axis of the one or more photoelectric conversion devices associated with a first one of the plurality of photoelectric converters is spaced apart from the optical axis of the micro lens in a different direction from a central axis of the one or more photoelectric conversion devices associated with a second one of the plurality of photoelectric converters.

18. The image sensor of claim 17, further comprising:
a color filter configured to selectively transmit the incident light based on a wavelength of light.

19. The image sensor of claim 17, further comprising:
a storage node configured to store the electrical signals from the plurality of the photoelectric converters.

20. The image sensor of claim 17, further comprising:
a focus detector configured to perform a focus detecting operation based on a phase-difference between binocular parallax image signals output from the plurality of sensing pixels.

* * * * *